(12) United States Patent
Kimoto

(10) Patent No.: US 12,310,167 B2
(45) Date of Patent: May 20, 2025

(54) LIGHT-EMITTING ELEMENT

(71) Applicant: SHARP KABUSHIKI KAISHA, Sakai (JP)

(72) Inventor: Kenji Kimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 619 days.

(21) Appl. No.: 17/634,379

(22) PCT Filed: Aug. 13, 2019

(86) PCT No.: PCT/JP2019/031806
§ 371 (c)(1),
(2) Date: Feb. 10, 2022

(87) PCT Pub. No.: WO2021/029006
PCT Pub. Date: Feb. 18, 2021

(65) Prior Publication Data
US 2022/0285645 A1    Sep. 8, 2022

(51) Int. Cl.
*H10K 50/18*  (2023.01)
*H10K 50/15*  (2023.01)
*H10K 50/16*  (2023.01)
*H10K 102/00* (2023.01)

(52) U.S. Cl.
CPC .......... *H10K 50/18* (2023.02); *H10K 50/156* (2023.02); *H10K 50/16* (2023.02); *H10K 50/181* (2023.02); *H10K 2102/00* (2023.02)

(58) Field of Classification Search
CPC .... H10K 50/156; H10K 50/16; H10K 50/181; H10K 50/18; H05B 33/14
See application file for complete search history.

(56) References Cited

U.S. PATENT DOCUMENTS

| | | | | |
|---|---|---|---|---|
| 8,026,662 B2* | 9/2011 | Ishihara | | H10K 30/865 |
| | | | | 257/E51.047 |
| 9,799,844 B2* | 10/2017 | Song | | H10K 50/11 |
| 10,263,194 B2* | 4/2019 | Seo | | H10K 50/841 |
| 2010/0108984 A1 | 5/2010 | Cho et al. | | |
| 2011/0089814 A1* | 4/2011 | Nomura | | H10K 59/84 |
| | | | | 313/498 |
| 2012/0286252 A1* | 11/2012 | Seo | | H10K 50/19 |
| | | | | 257/E51.026 |

(Continued)

FOREIGN PATENT DOCUMENTS

| | | | | |
|---|---|---|---|---|
| CN | 104218166 A | * | 12/2014 | ......... H01L 51/0035 |
| JP | 2010-114079 A | | 5/2010 | |

OTHER PUBLICATIONS

CN 104218166 A English Translation (Year: 2014).*

*Primary Examiner* — Bac H Au
(74) *Attorney, Agent, or Firm* — ScienBiziP, P.C.

(57) ABSTRACT

A light-emitting element includes: a first electrode which is an anode, a hole transport layer, a light-emitting layer, an electron transport layer, and a second electrode which is a cathode in this order; and an oxide layer which is a first oxide layer and an oxide layer which is a second oxide layer disposed in this order from the first electrode side between the hole transport layer and the light-emitting layer or between the light-emitting layer and the electron transport layer, wherein a density of oxygen atoms in the second oxide layer is different from a density of oxygen atoms in the first oxide layer.

6 Claims, 22 Drawing Sheets

(56) References Cited

U.S. PATENT DOCUMENTS

| | | | |
|---|---|---|---|
| 2022/0069220 A1* | 3/2022 | Someya | H05B 33/02 |
| 2022/0285646 A1* | 9/2022 | Kimoto | H10K 50/11 |
| 2022/0328785 A1* | 10/2022 | Kimoto | H10K 50/11 |
| 2022/0352482 A1* | 11/2022 | Kimoto | H10K 50/156 |
| 2024/0074225 A1* | 2/2024 | Kimoto | H10K 50/16 |

* cited by examiner

|  | Density (g/cm³) | Formula weight (g/mol) | Oxygen atom density (mol/cm³) |
|---|---|---|---|
| $Al_2O_3$ | 3.95 | 102.0 | 0.1162 |
| $Ga_2O_3(\alpha)$ | 6.44 | 187.4 | 0.1031 |
| $Ga_2O_3(\beta)$ | 5.88 | 187.4 | 0.0941 |
| $Ta_2O_5$ | 8.20 | 441.9 | 0.0928 |
| $ZrO_2$ | 5.68 | 123.2 | 0.0922 |
| $HfO_2$ | 9.68 | 210.5 | 0.0920 |
| MgO | 3.65 | 40.3 | 0.0906 |
| $GeO_2$ | 4.23 | 104.6 | 0.0808 |
| $SiO_2$ | 2.20 | 60.1 | 0.0732 |
| $Y_2O_3$ | 5.01 | 225.8 | 0.0666 |
| $La_2O_3$ | 6.51 | 325.8 | 0.0599 |
| SrO | 4.70 | 103.6 | 0.0454 |

FIG. 5

| Oxide layer 24b | Oxide layer 24c |
|---|---|
| $Al_2O_3$ | $Ga_2O_3$<br>$Ta_2O_5$<br>$ZrO_2$<br>$HfO_2$<br>$MgO$<br>$GeO_2$<br>$SiO_2$<br>$Y_2O_3$<br>$La_2O_3$<br>$SrO$<br>or<br>a composite oxide containing two or more types of cations of the oxide |
| $Ga_2O_3$ | $Ta_2O_5$<br>$ZrO_2$<br>$HfO_2$<br>$MgO$<br>$GeO_2$<br>$SiO_2$<br>$Y_2O_3$<br>$La_2O_3$<br>$SrO$<br>or<br>a composite oxide containing two or more types of cations of the oxide |
| $Ta_2O_3$ | $ZrO_2$<br>$HfO_2$<br>$MgO$<br>$GeO_2$<br>$SiO_2$<br>$Y_2O_3$<br>$La_2O_3$<br>$SrO$<br>or<br>a composite oxide containing two or more types of cations of the oxide |
| $MgO$ | $GeO_2$<br>$SiO_2$<br>$Y_2O_3$<br>$La_2O_3$<br>$SrO$<br>or<br>a composite oxide containing two or more types of cations of the oxide |

FIG. 6

|  | Density (g/cm³) | Formula weight (g/mol) | Oxygen atom density (mol/cm³) |
|---|---|---|---|
| NiO | 6.67 | 74.69 | 0.0893 |
| $CuAlO_2$ | 5.08 | 122.525 | 0.0830 |
| $Cu_2O$ | 6.04 | 143.09 | 0.0422 |

FIG. 9

| Hole transport layer 24a | Oxide layer 24b |
|---|---|
| NiO<br>or<br>$CuAlO_2$ | SrO<br>$La_2O_3$<br>$Y_2O_3$<br>$SiO_2$<br>$GeO_2$<br>or<br>a composite oxide containing two or more types of cations of the oxide |

FIG. 10

| Oxide layer 224c | Oxide layer 224b |
|---|---|
| $La_2O_3$ | $Al_2O_3$<br>$Ga_2O_3$<br>$Ta_2O_5$<br>$ZrO_2$<br>$HfO_2$<br>$MgO$<br>$GeO_2$<br>$SiO_2$<br>$Y_2O_3$<br>or<br>a composite oxide containing two or more types of cations of the oxide |
| $Y_2O_3$ | $Al_2O_3$<br>$Ga_2O_3$<br>$Ta_2O_5$<br>$ZrO_2$<br>$HfO_2$<br>$MgO$<br>$GeO_2$<br>$SiO_2$<br>or<br>a composite oxide containing two or more types of cations of the oxide |
| $SiO_2$ | $Al_2O_3$<br>$Ga_2O_3$<br>$Ta_2O_5$<br>$ZrO_2$<br>$HfO_2$<br>$MgO$<br>$GeO_2$<br>or<br>a composite oxide containing two or more types of cations of the oxide |
| $MgO$ | $Al_2O_3$<br>$Ga_2O_3$<br>$Ta_2O_5$<br>$ZrO_2$<br>$HfO_2$<br>or<br>a composite oxide containing two or more types of cations of the oxide |

FIG. 16

|  | Density (g/cm$^3$) | Formula weight (g/mol) | Oxygen atom density (mol/cm$^3$) |
|---|---|---|---|
| TiO$_2$ (rutile) | 4.26 | 79.9 | 0.1067 |
| TiO$_2$ (anatase) | 3.90 | 79.9 | 0.0977 |
| SnO$_2$ | 6.95 | 150.7 | 0.0922 |
| SrTiO$_3$ | 5.13 | 183.5 | 0.0839 |
| In$_2$O$_3$ | 7.18 | 277.6 | 0.0776 |
| ZnO | 5.61 | 81.4 | 0.0689 |

FIG. 18

| Electron transport layer 24e | Oxide layer 224c |
|---|---|
| $TiO_2$ (rutile) | $Al_2O_3$ |
| $TiO_2$ (anatase) | $Al_2O_3$<br>$Ge_2O_3(\alpha)$<br>or<br>a composite oxide containing two or more types of cations of the oxide |
| $SnO_2$ | $Al_2O_3$<br>$Ge_2O_3(\alpha)$<br>$Ge_2O_3(\beta)$<br>$Ta_2O_3$<br>or<br>a composite oxide containing two or more types of cations of the oxide |
| $SrTiO_3$ | $Al_2O_3$<br>$Ge_2O_3(\alpha)$<br>$Ge_2O_3(\beta)$<br>$Ta_2O_3$<br>$ZrO_2$<br>$HfO_2$<br>$MgO$<br>or<br>a composite oxide containing two or more types of cations of the oxide |
| $In_2O_3$ | $Al_2O_3$<br>$Ge_2O_3(\alpha)$<br>$Ge_2O_3(\beta)$<br>$Ta_2O_3$<br>$ZrO_2$<br>$HfO_2$<br>$MgO$<br>$GeO_2$<br>or<br>a composite oxide containing two or more types of cations of the oxide |
| $ZnO$ | $Al_2O_3$<br>$Ge_2O_3(\alpha)$<br>$Ge_2O_3(\beta)$<br>$Ta_2O_3$<br>$ZrO_2$<br>$HfO_2$<br>$MgO$<br>$GeO_2$<br>$SiO_2$<br>or<br>a composite oxide containing two or more types of cations of the oxide |

FIG. 19

LIGHT-EMITTING ELEMENT

TECHNICAL FIELD

The present disclosure relates to a light-emitting element and a light-emitting device, such as a display device, an illumination device, or the like, that includes a plurality of light-emitting elements.

BACKGROUND ART

In recent years, various display devices have been developed. Particularly, a display device including an Organic Light Emitting Diode (OLED) and a display device including an inorganic light-emitting diode or a Quantum dot Light Emitting Diode (QLED) have drawn a great deal of attention because the devices are capable of achieving lower power consumption, smaller thickness, higher picture quality, and the like.

However, in a light-emitting element, such as an OLED, QLED, and the like, for reasons described below, there is a problem in that the luminous efficiency is poor because the injection of carriers (holes and/or electrons) to the light-emitting layer does not easily occur.

FIG. 22 is an energy band diagram for describing the reason as to why, in a known light-emitting element 101, such as an OLED, QLED, and like, the injection of carriers (holes and/or electrons) to a light-emitting layer 103 does not easily occur.

As illustrated in FIG. 22, the light-emitting element 101 includes a first electrode (hole injection layer: anode (anode electrode)) and a second electrode (electron injection layer: cathode (cathode electrode)). A hole transport layer 102, a light-emitting layer 103, and an electron transport layer 104 are layered in this order from the first electrode side between the first electrode and the second electrode.

In the light-emitting element 101, the height of a hole injection barrier Eh from the hole transport layer 102 to the light-emitting layer 103 is the energy difference between the upper end of the valence band (HTL valence band) of the hole transport layer 102 and the upper end of the valence band of the light-emitting layer 103.

Furthermore, in the light-emitting element 101, the height of an electron injection barrier Ee from the electron transport layer 104 to the light-emitting layer 103 is the energy difference between the lower end of the conduction band of the light-emitting layer 103 and the lower end of the conduction band (ETL conduction band) of the electron transport layer 104.

However, there are only a small number of materials with long-term reliability that can be used as the light-emitting material for an OLED or the light-emitting material for a QLED forming the light-emitting layer 103, the material for the hole transport layer 102, and the electron transport layer 104. Currently, selection is limited to these materials.

When the material of the hole transport layer 102, the material of the electron transport layer 104, and the material of the light-emitting layer 103 are selected from among the small number of materials, because at least one of the height of the hole injection barrier Eh or the height of the electron injection barrier Ee increases, efficient hole injection or electron injection to the light-emitting layer 103 becomes difficult.

As described in PTL 1, the band level of a light-emitting layer can be adjusted by forming a light-emitting layer having an organic ligand distribution in which the surface contacting the hole transport layer and the surface contacting the electron transport layer are different from each other. Specifically, it is described that by adjusting the band level of the light-emitting layer so that the energy difference between the valence band level of the hole transport layer and the valence band level of the light-emitting layer can be reduced, a light-emitting element having a low turn-on voltage and a low drive voltage and superior brightness and luminous efficiency can be achieved.

CITATION LIST

Patent Literature

PTL 1: JP 2010-114079 A (published on May 20, 2010)

SUMMARY

Technical Problem

However, the light-emitting element of PTL 1 has a small difference in ionization potential between the light-emitting layer with no band level adjustment and the light-emitting layer with an adjusted band level. Thus, the light-emitting element of PTL 1 cannot satisfactorily reduce the height of a hole injection barrier Eh. Furthermore, in a similar manner, even in a case where the band level is adjusted as in PTL 1, the height of the electron injection barrier Ee cannot be sufficiently reduced. Thus, there is still a problem in that the luminous efficiency is poor due to the hole injection amount and the electron injection amount to the light-emitting layer 103 being difficult to efficiently control.

An aspect of the present disclosure has been made in view of the above-mentioned issue, and an object of the present disclosure is to provide a light-emitting element and a light-emitting device capable of achieving high luminous efficiency.

Solution to Problem

In order to solve the issue described above, a light-emitting element according to an aspect of the present disclosure includes: an anode, a hole transport layer, a light-emitting layer, an electron transport layer, and a cathode in this order; and a first oxide layer and a second oxide layer that is in contact with the first oxide layer disposed in this order from a side closer to the anode between the hole transport layer and the light-emitting layer or between the light-emitting layer and the electron transport layer, wherein a density of oxygen atoms in the second oxide layer is different from a density of oxygen atoms in the first oxide layer.

In order to solve the problem described above, a light-emitting device according to an aspect of the present disclosure includes the light-emitting element according to an aspect of the present disclosure.

Advantageous Effects of Disclosure

According to an aspect of the present disclosure, a light-emitting element and a light-emitting device capable of achieving high luminous efficiency can be provided.

Figure 3:
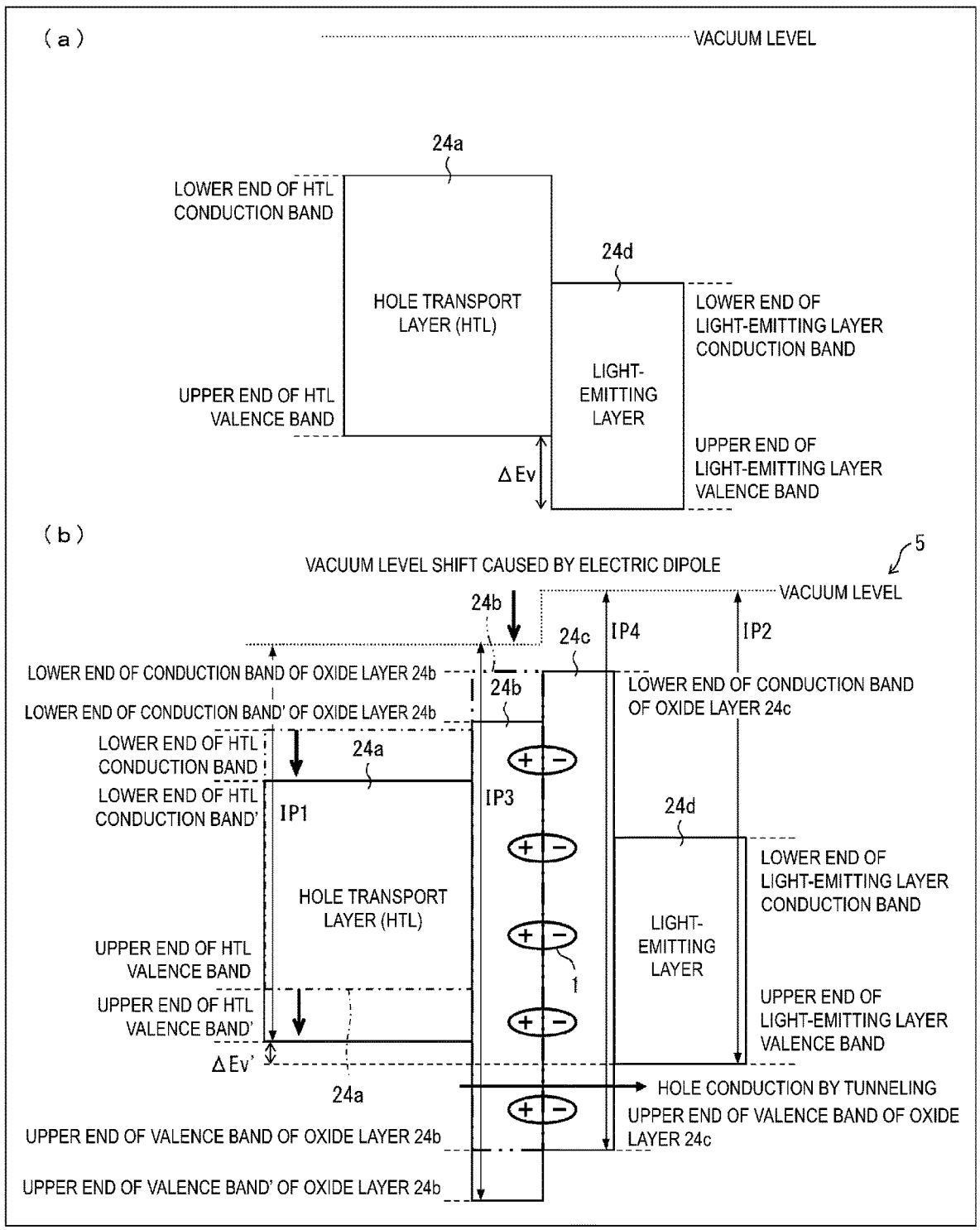

(a) of FIG. 3 is an energy band diagram for describing a hole injection barrier in a light-emitting element according to a comparative example. (b) of FIG. 3 is an energy band diagram for describing a hole injection barrier in the light-emitting element of the first embodiment.

Figure 4:
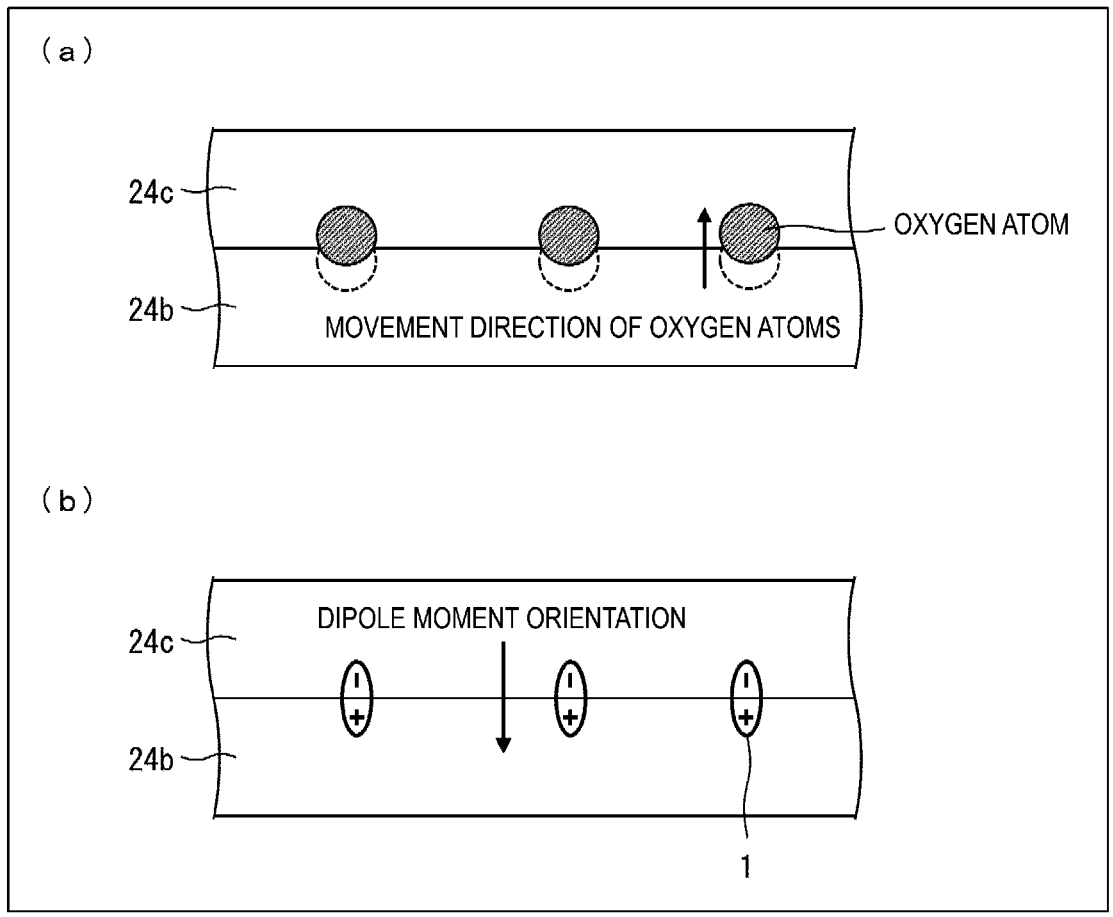

(a) of FIG. 4 is a diagram illustrating the mechanism by which oxygen atoms move at the interface between a first oxide layer and a second oxide layer in the light-emitting element according to the first embodiment. (b) of FIG. 4 is a diagram illustrating a state in which an electric dipole is formed by movement of oxygen atoms at the interface between the first oxide layer and the second oxide layer in the light-emitting element according to the first embodiment.

FIG. 5 is a diagram listing the oxygen atom density of inorganic oxides which are examples of an oxide for forming the first oxide layer and the second oxide layer in the light-emitting element according to the first embodiment.

FIG. 6 is a diagram listing examples of combinations of oxides forming the first oxide layer and oxides forming the second oxide layer in the light-emitting element according to the first embodiment.

Figure 7:
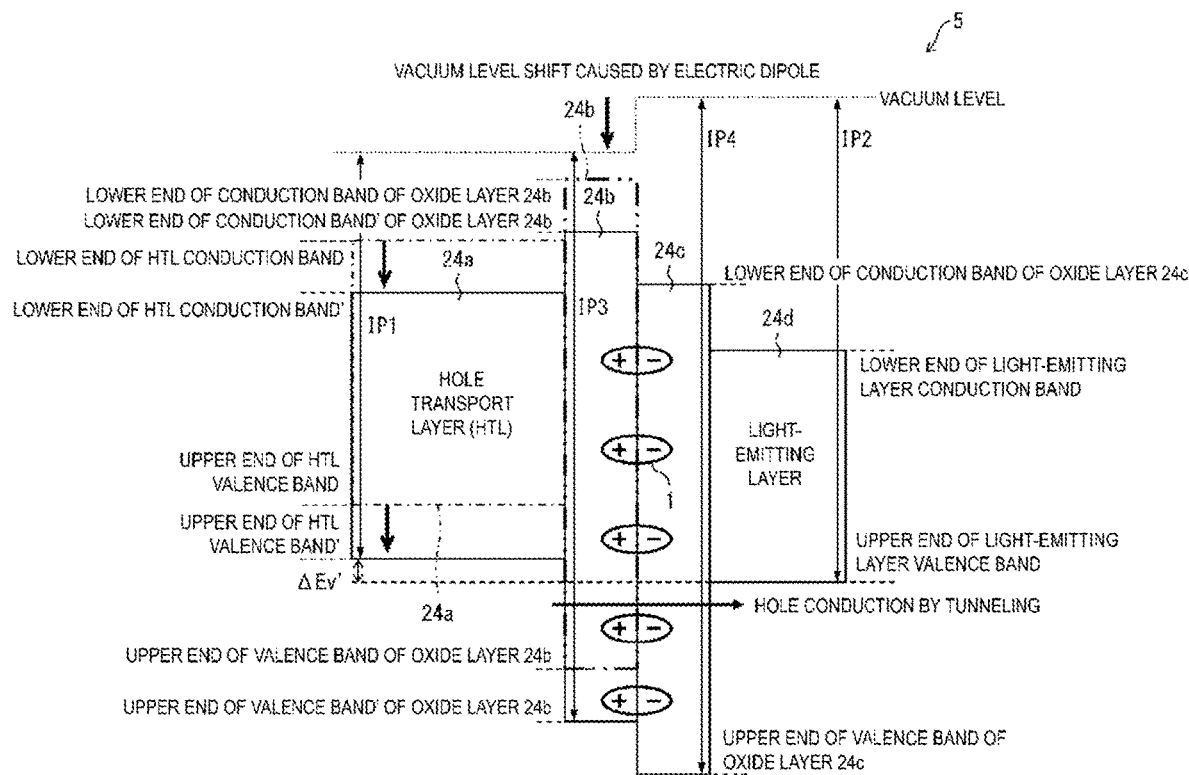

FIG. 7 is an energy band diagram for describing a hole injection barrier in the light-emitting element according a modified example of the first embodiment.

Figure 8:
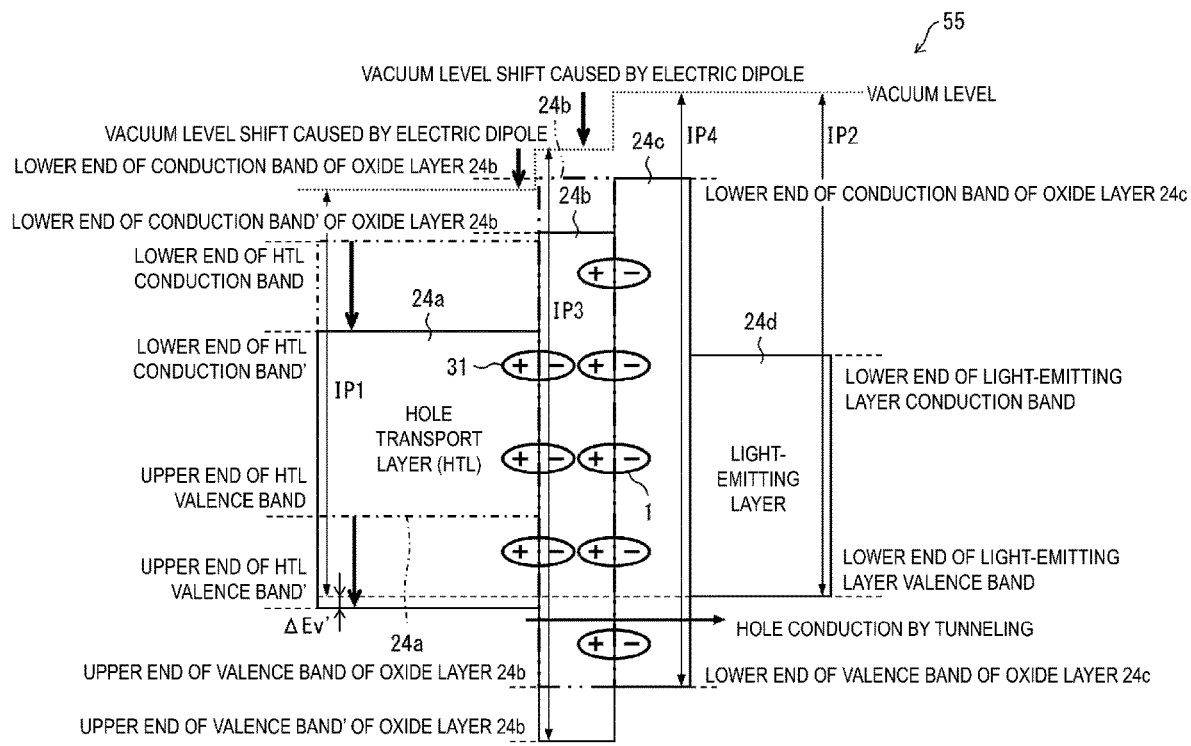

FIG. 8 is an energy band diagram for describing a hole injection barrier in a light-emitting element according the second embodiment.

FIG. 9 is a diagram listing the oxygen atom density of inorganic oxides which are examples of an oxide for forming the hole transport layer in the light-emitting element according to the second embodiment.

FIG. 10 is a diagram listing examples of combinations of oxides forming the hole transport layer and oxides forming the first oxide layer in the light-emitting element according to the second embodiment.

Figure 11:
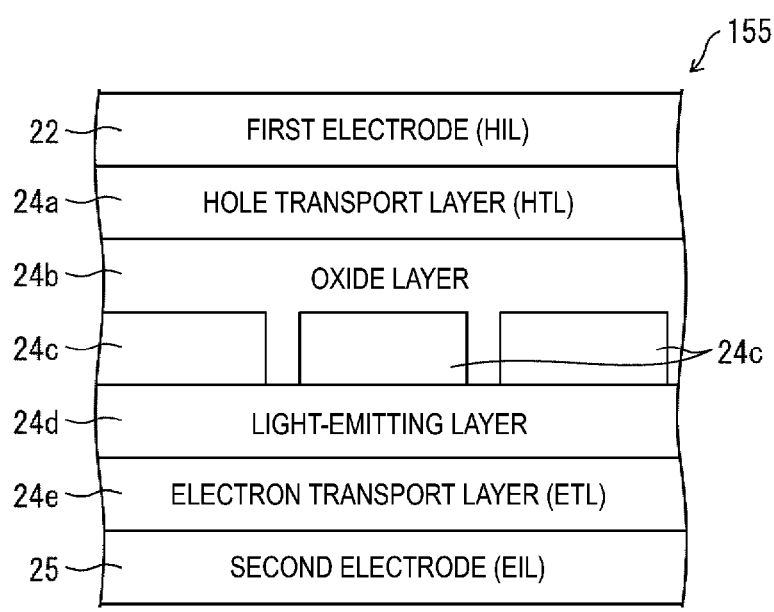

FIG. 11 is a cross-sectional view schematically illustrating a schematic configuration of a light-emitting element according to a third embodiment.

Figure 12:
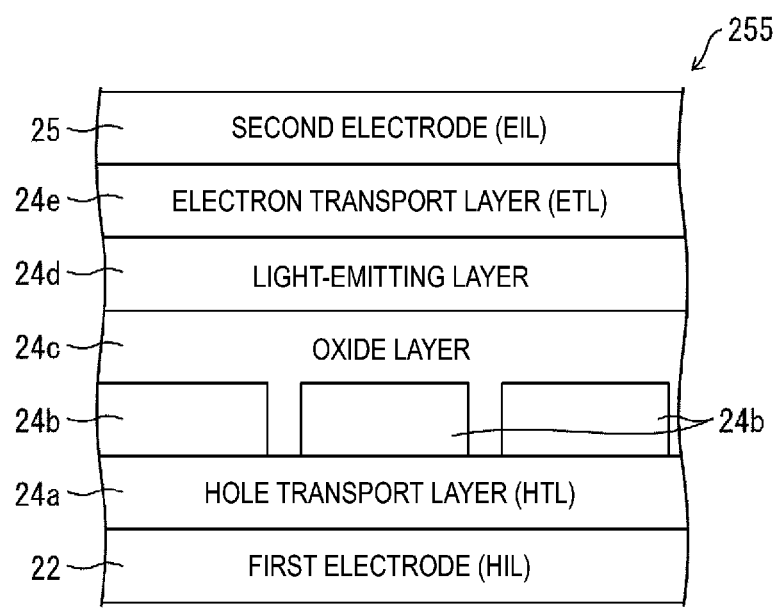

FIG. 12 is a cross-sectional view schematically illustrating a schematic configuration of another light-emitting element according to the third embodiment.

Figure 13:
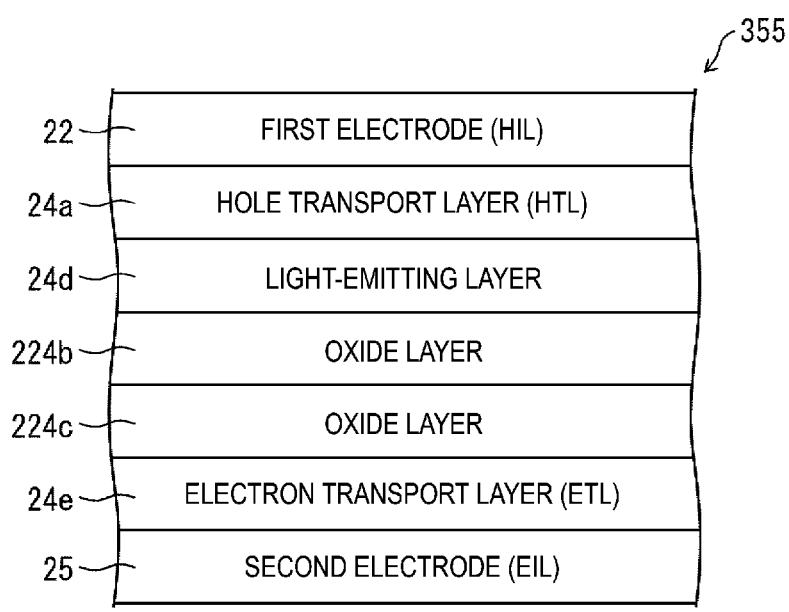

FIG. 13 is a cross-sectional view schematically illustrating a schematic configuration of a light-emitting element according to a fourth embodiment.

Figure 14:
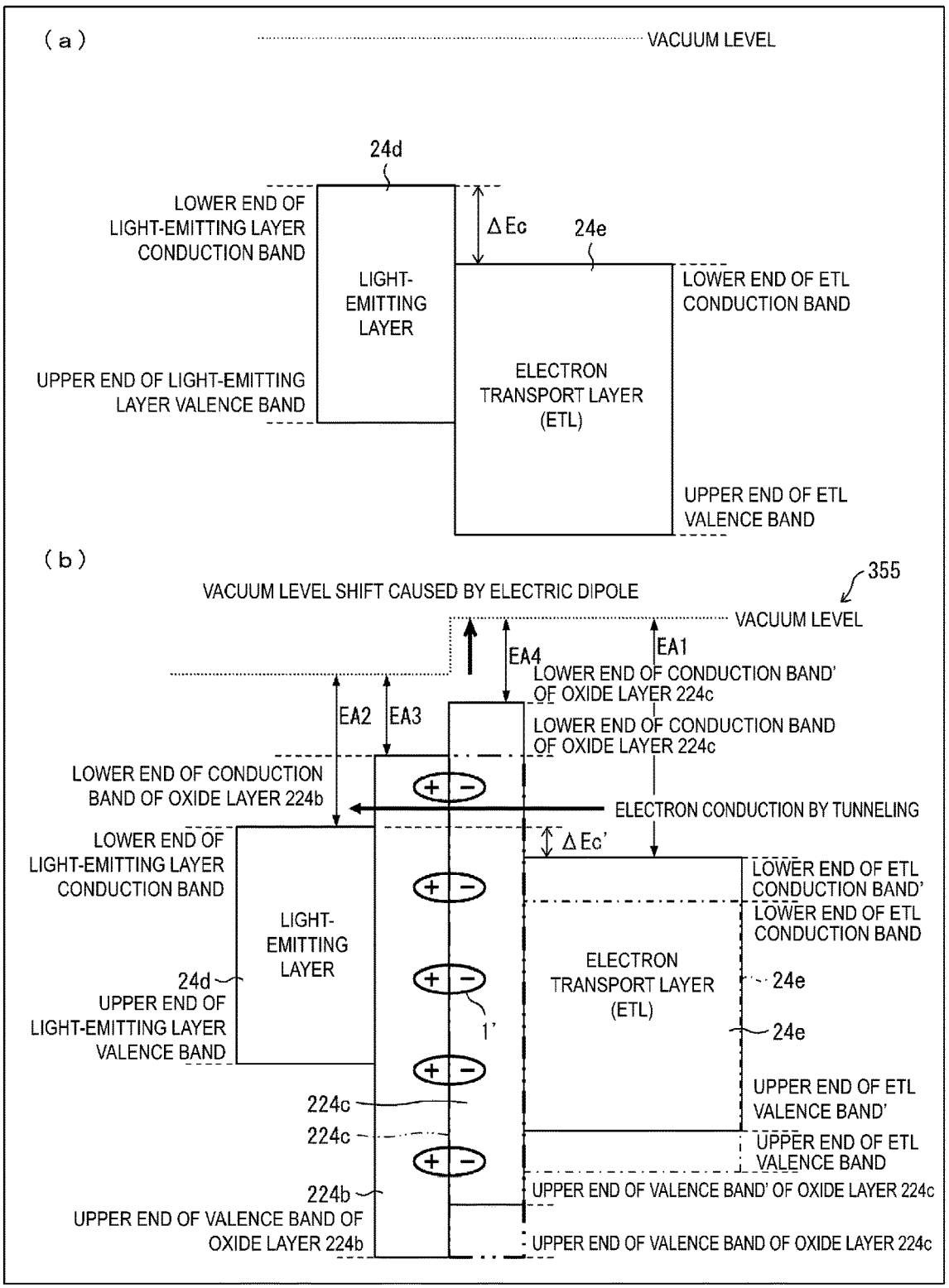

(a) of FIG. 14 is an energy band diagram for describing an electron injection barrier in a light-emitting element according to a comparative example. (b) of FIG. 14 is an energy band diagram for describing an electron injection barrier in the light-emitting element of the fourth embodiment.

Figure 15:
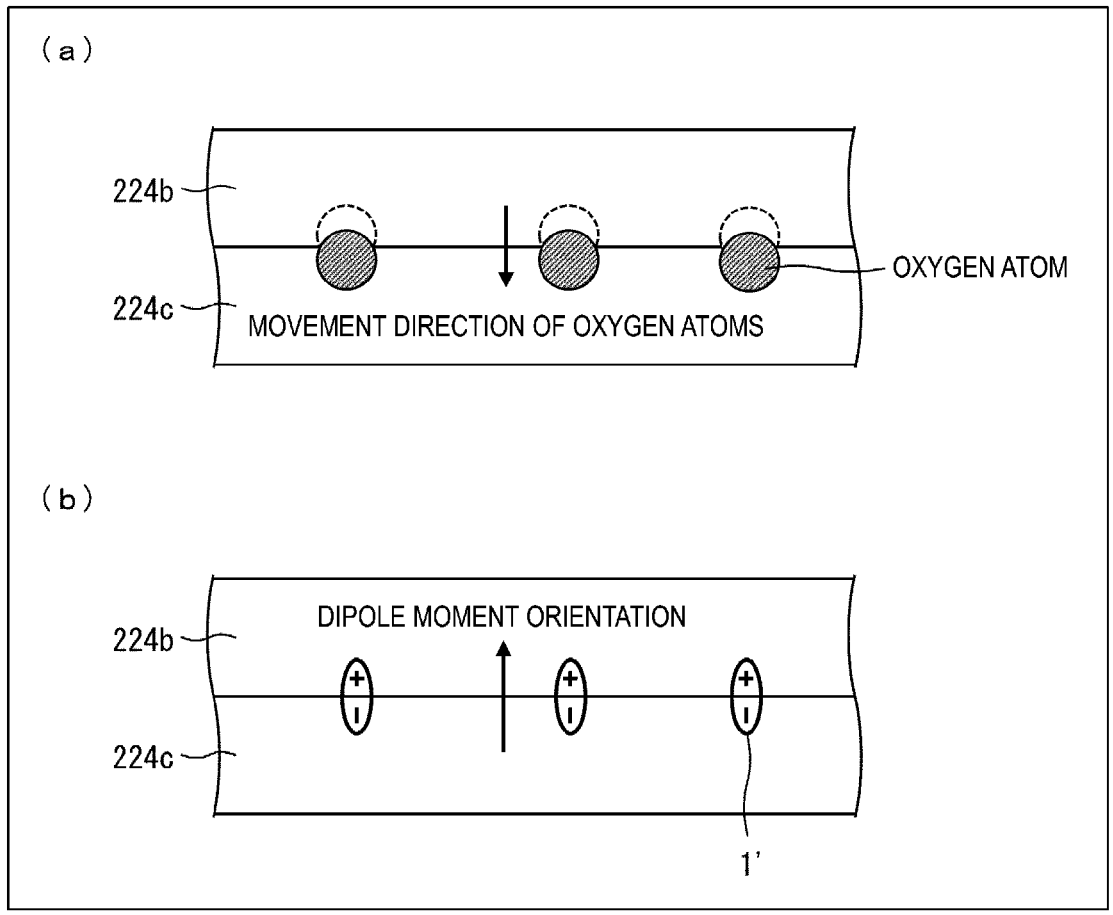

(a) of FIG. 15 is a diagram illustrating the mechanism by which oxygen atoms move at the interface between a first oxide layer and a second oxide layer in the light-emitting element according to the fourth embodiment. (b) of FIG. 15 is a diagram illustrating a state in which an electric dipole is formed by movement of oxygen atoms at the interface between the first oxide layer and the second oxide layer in the light-emitting element according to the fourth embodiment.

FIG. 16 is a diagram listing examples of combinations of oxides forming the first oxide layer and oxides forming the second oxide layer in the light-emitting element according to the fourth embodiment.

Figure 17:
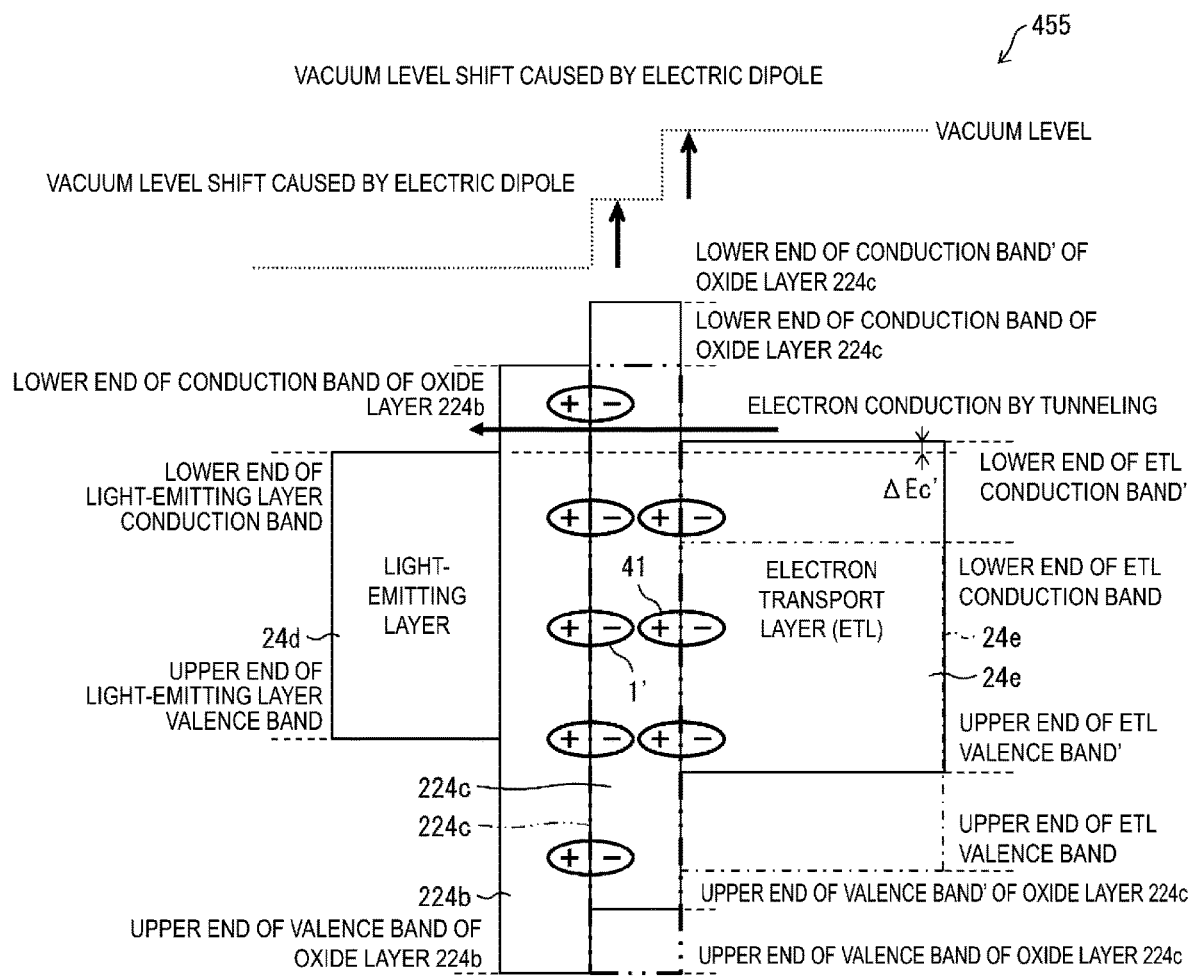

FIG. 17 is an energy band diagram for describing an electron injection barrier in a light-emitting element according a fifth embodiment.

FIG. 18 is a diagram listing the oxygen atom density of inorganic oxides which are examples of an oxide for forming the electron transport layer in the light-emitting element according to the fifth embodiment.

FIG. 19 is a diagram listing examples of combinations of oxides forming the electron transport layer and oxides forming the second oxide layer in the light-emitting element according to the fifth embodiment.

Figure 20:
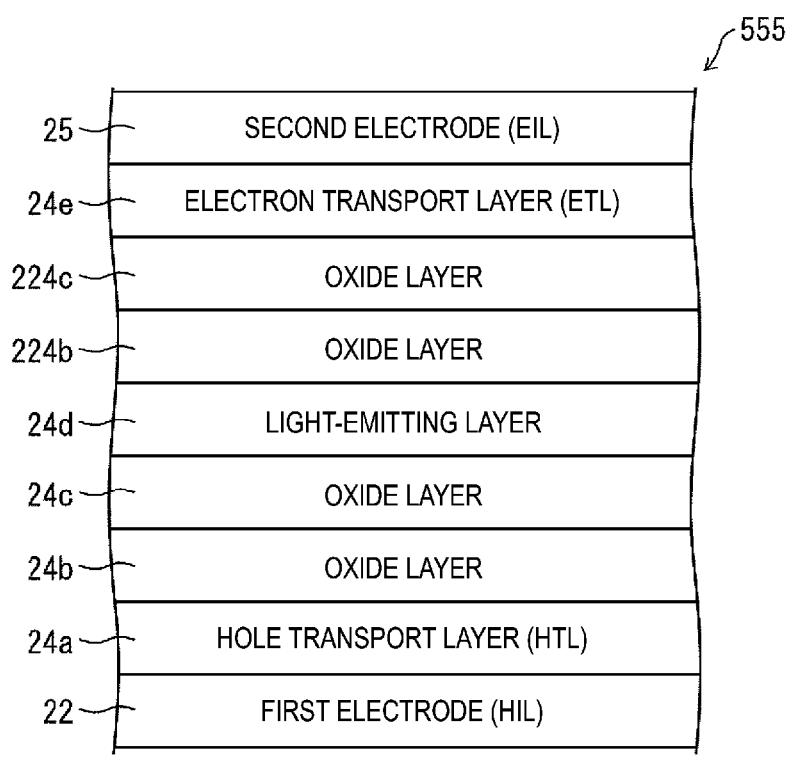

FIG. 20 is a cross-sectional view schematically illustrating an example of a schematic configuration of a light-emitting element according to a sixth embodiment.

Figure 21:
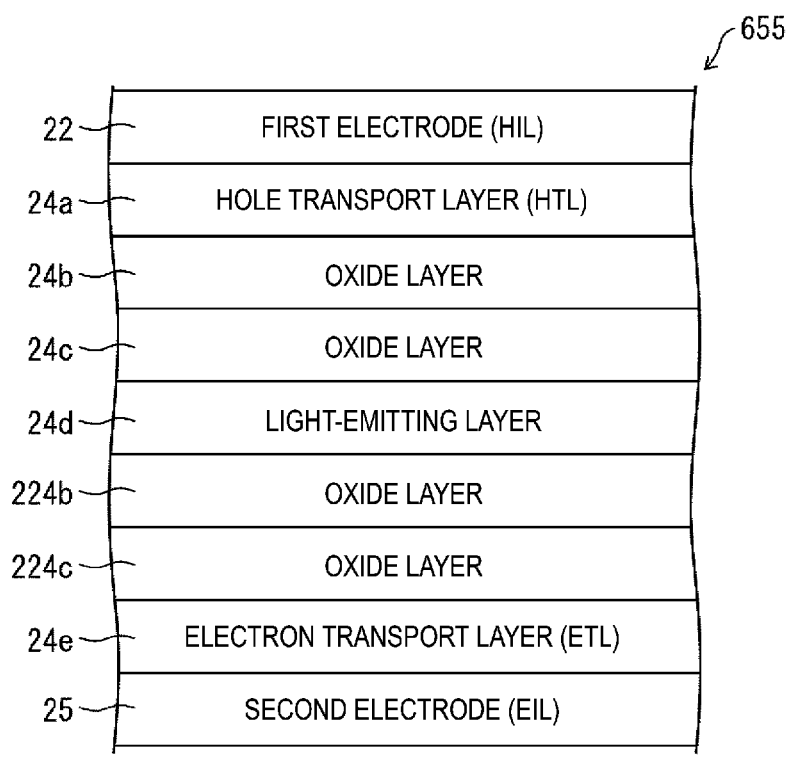

FIG. 21 is a cross-sectional view schematically illustrating another example of a schematic configuration of the light-emitting element according to the sixth embodiment.

Figure 22:
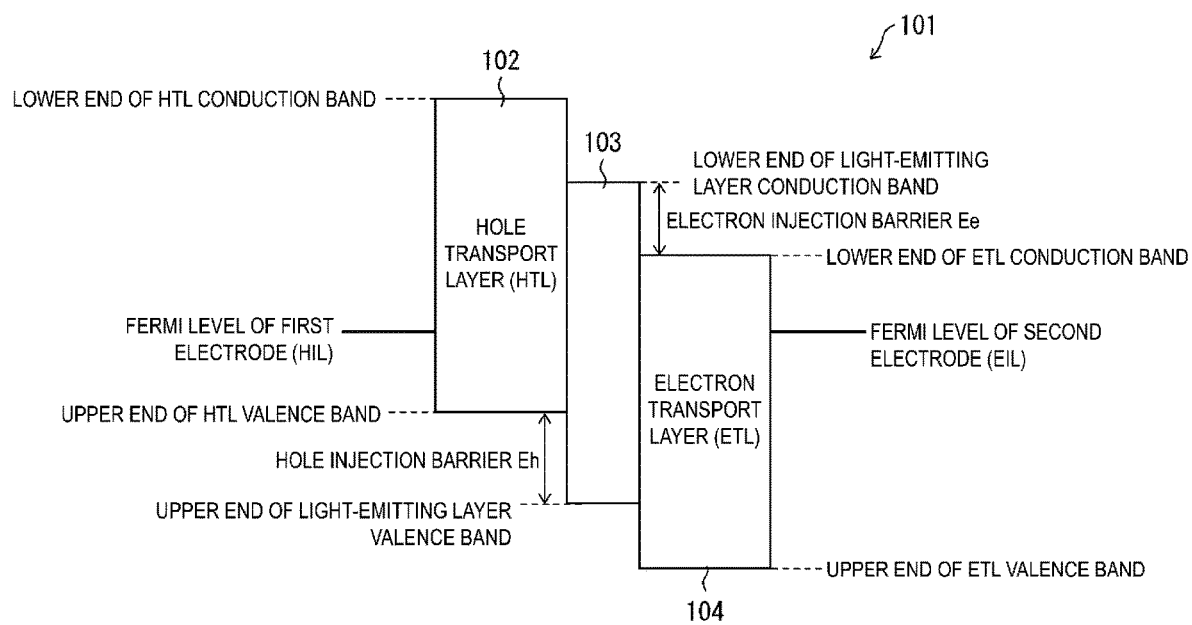

FIG. 22 is an energy band diagram for describing the reason as to why, in a known light-emitting element, the injection of carriers (holes and/or electrons) to a light-emitting layer does not easily occur.

DESCRIPTION OF EMBODIMENTS

Hereinafter, an embodiment of the present disclosure will be described in detail. Note that members having the same functions as those of members described earlier in each embodiment below will be denoted by the same reference numerals and signs, and the description thereof will not be repeated. In the second embodiment and those following, differences from the embodiment described first will be described. Note that it should be obvious that even in a case where not specified, in the second embodiment and those following, the same modifications as those of the embodiment described first may also be applied.

First Embodiment

Figure 2:
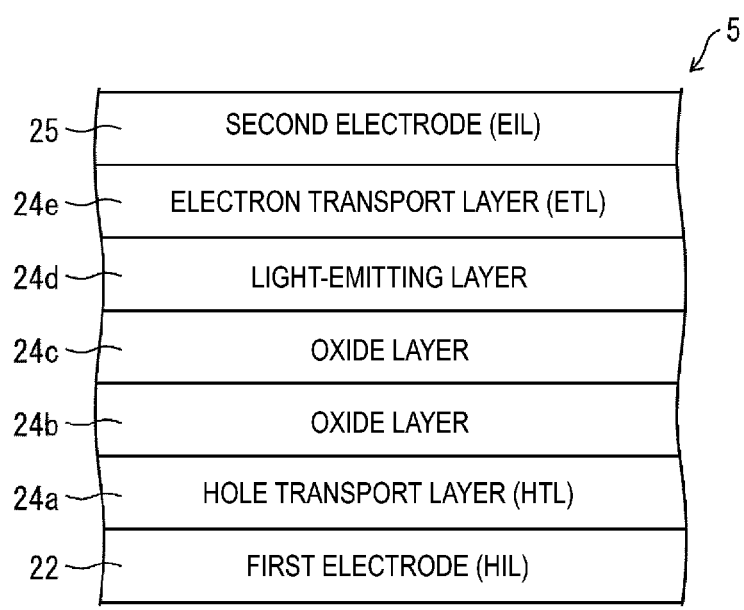
FIG. 2 is a cross-sectional view schematically illustrating a schematic configuration of the light-emitting element according to the first embodiment.

FIG. 2 is a cross-sectional view schematically illustrating a schematic configuration of a light-emitting element 5 according to the present embodiment.

As illustrated in FIG. 2, the light-emitting element 5 includes a first electrode (hole injection layer: HIL) 22, a second electrode (electron injection layer: EIL) 25, and a light-emitting layer 24d provided between the first electrode 22 and the second electrode 25. In other words, the first electrode 22 is an anode, and the second electrode 25 is a cathode. A hole transport layer (HTL) 24a, an oxide layer 24b (first oxide layer), and an oxide layer 24c (second oxide layer) are layered in contact with one another in this order, for example, between the first electrode 22 and the light-emitting layer 24d from the first electrode 22 side (in other words, the side closer to the first electrode 22). Note that the oxygen atom density in the oxide layer 24b and the oxygen atom density in the oxide layer 24c are different. An electron transport layer (ETL) 24e is provided between the light-emitting layer 24d and the second electrode 25.

Accordingly, the light-emitting element 5 includes, for example, the first electrode 22 (anode), the hole transport layer 24a, the light-emitting layer 24d, the electron transport layer 24e, and the second electrode 25 (cathode) from the lower layer side in this order and includes the oxide layer 24b and the oxide layer 24c in contact with the oxide layer 24b between the hole transport layer 24a and the light-emitting layer 24d in this order from the first electrode 22 side.

Note that as described below, the order of the layers in the light-emitting element 5 may be reversed, and the light-emitting element 5 may include, for example, the first electrode 22 (anode), the hole transport layer 24a, the light-emitting layer 24d, the electron transport layer 24e, and the second electrode 25 (cathode) from the upper layer side in this order and include the oxide layer 24b and the oxide layer 24c in contact with the oxide layer 24b between the hole transport layer 24a and the light-emitting layer 24d in this order from the first electrode 22 side.

Note that in the present embodiment, a "lower layer" refers to a layer formed in a process before the layer being compared, and an "upper layer" refers to a layer formed in a process after the layer being compared. More specifically, the lower layer side refers to the substrate side, for example. Accordingly, "the light-emitting element 5 includes, for example, the first electrode 22, the hole transport layer 24a, the light-emitting layer 24d, the electron transport layer 24e, and the second electrode 25 in this order from the lower layer side" means that "the light-emitting element 5 includes each of the layers above a substrate (for example, in the example illustrated in FIG. 1 described later, an array substrate on which the first electrode 22 is formed and a layered body including a substrate 10, a resin layer 12, a barrier layer 3, and a TFT layer 4) functioning as a support body from the substrate side in this order". Note that the light-emitting element 5 may include the substrate described above.

(a) of FIG. 4 is a diagram for describing the mechanism by which oxygen atoms move at the interface between the oxide layer 24b on the first electrode 22 side (in other words, the hole transport layer 24a side) and the oxide layer 24c on the second electrode 25 side (in other words, the light-emitting layer 24d side), the oxide layer 24b and the oxide layer 24c being adjacent to one another in the light-emitting element 5 of the present embodiment. (b) of FIG. 4 is a diagram illustrating the interface between the oxide layer 24b and the oxide layer 24c with an electric dipole 1 formed by the movement of oxygen atoms.

In the present embodiment, the density of the oxygen atoms in the oxide layer 24c, which is the oxide layer (second oxide layer) farther from the first electrode 22 of the oxide layer 24b and the oxide layer 24c adjacent to one another provided between the carrier transport layer (the hole transport layer 24a in the present embodiment) and the light-emitting layer 24d, is preferably less than the density of the oxygen atoms in the oxide layer 24b, which is the oxide layer (first oxide layer) closer to the first electrode 22. Note that the density of the oxygen atoms in the oxide layer 24c may be referred to as the "oxygen atom density of the oxide layer 24c". Also, the density of the oxygen atoms in the oxide layer 24b may be referred to as the "oxygen atom density of the oxide layer 24b".

Thus, as illustrated in (a) of FIG. 4, when the oxide layer 24c is formed above the oxide layer 24b in contact with the oxide layer 24b, oxygen atoms easily move at the interface between the oxide layer 24b and the oxide layer 24c from the oxide layer 24b toward the oxide layer 24c. As oxygen atoms move, the oxygen holes become positively charged and the moving oxygen atoms become negatively charged.

Accordingly, as illustrated in (b) of FIG. 4, at the interface between the oxide layer 24b and the oxide layer 24c, the electric dipole 1 having a dipole moment including a component orientated in the direction from the oxide layer 24c to the oxide layer 24b is formed.

Figure 1:
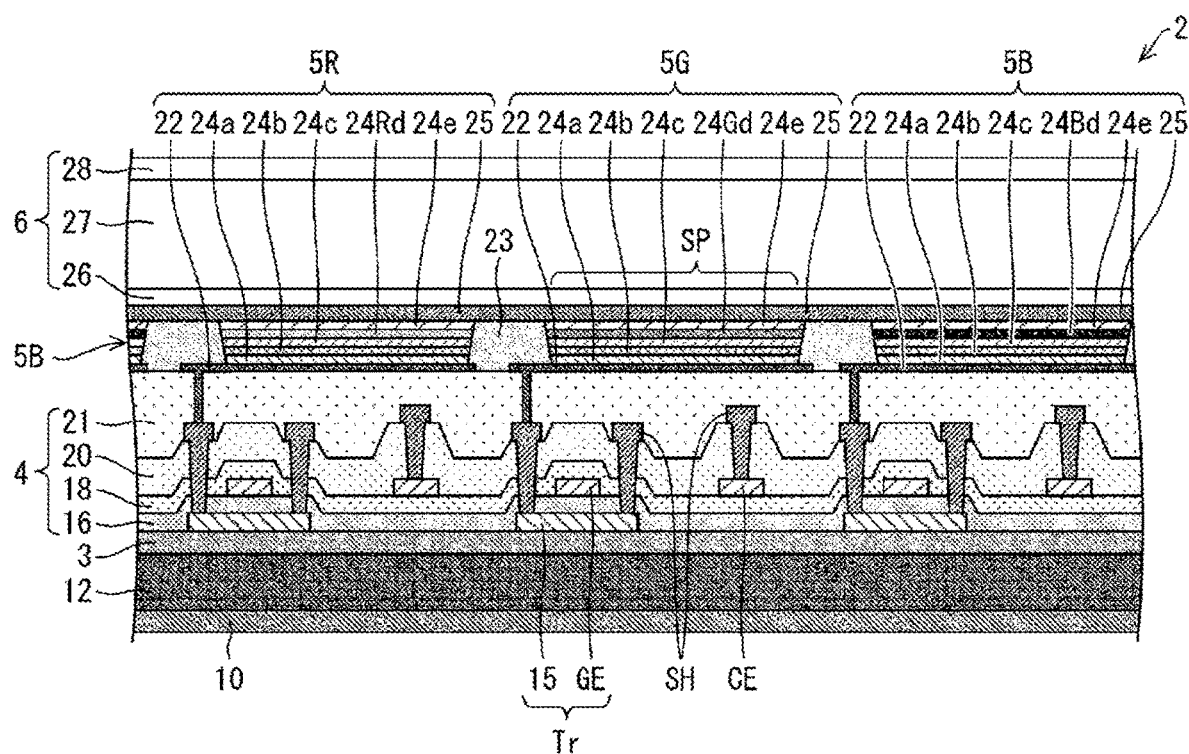
FIG. 1 is a cross-sectional view illustrating a schematic configuration of a display device including a light-emitting element according to a first embodiment.

FIG. 1 is a cross-sectional view illustrating a schematic configuration of a display device 2 including light-emitting elements 5R, 5G, and 5B as the light-emitting element 5.

Note that the following description is based on a case where the light-emitting device according to the present embodiment is the display device 2 including a plurality of the light-emitting elements 5. However, the present disclosure is not limited thereto, and the light-emitting device may be a display device, an illumination device, or the like including one or more of the light-emitting elements 5.

As illustrated in FIG. 1, above the substrate 10 of the display device 2, the resin layer 12, the barrier layer 3, the TFT layer 4, the light-emitting elements 5R, 5G, 5B, and a sealing layer 6 are layered.

Examples of the material of the substrate 10 include polyethylene terephthalate (PET), a glass substrate, and the like, but the material is not limited thereto. In the present embodiment, in order for the display device 2 to be a flexible display device, PET is used as the material of the substrate 10, but if the display device 2 is a non-flexible display device, a glass substrate or the like may be used.

Examples of the material of the resin layer 12 include a polyimide resin, an epoxy resin, and a polyamide resin, but are not limited thereto. In the present embodiment, the display device 2 is made as a flexible display device by radiating the resin layer 12 through a support substrate (not illustrated) with laser light and lowering the bonding strength between the support substrate (not illustrated) and the resin layer 12, peeling (laser lift off (LLO) process) the support substrate (not illustrated) from the resin layer 12, and adhering the substrate 10 made of PET to the surface of the resin layer 12 where the support substrate (not illustrated) was peeled off from. However, in a case where the display device 2 is a non-flexible display device or when the display device 2 is a flexible display device made by a method other than the LLO process, the resin layer 12 is not necessary.

The barrier layer 3 is a layer that inhibits moisture and impurities from reaching the TFT layer 4 and the light-emitting elements 5R, 5G, 5B when the display device 2 is used and can be formed, for example, by a silicon oxide film, a silicon nitride film, or a silicon oxynitride film, or by a layered film of these, formed by chemical vapor deposition (CVD).

The TFT layer 4 includes a semiconductor film 15, an inorganic insulating film 16 (a gate insulating film) above the semiconductor film 15, a gate electrode GE above the inorganic insulating film 16, an inorganic insulating film 18 above the gate electrode GE, a capacitance wiring line CE above the inorganic insulating film 18, an inorganic insulating film 20 above the capacitance wiring line CE, a source-drain wiring line SH including a source-drain electrode above the inorganic insulating film 20, and a flattening film 21 above the source-drain wiring line SH.

A thin film transistor element Tr (TFT element) as an active element is configured so as to include the semiconductor film 15, the inorganic insulating film 16 (gate insulating film), the gate electrode GE, the inorganic insulating film 18, the inorganic insulating film 20, and the source-drain wiring line SH.

The semiconductor film 15 is formed of low-temperature polysilicon (LTPS) or an oxide semiconductor, for example. Note that FIG. 1 illustrates the TFT that has a top gate structure including the semiconductor film 15 as a channel, but the TFT may have a bottom gate structure.

Each of the gate electrodes GE, the capacitance electrodes CE, the source-drain wiring line SH, the wiring lines TW, and the terminals TM is formed of, for example, a monolayer film or a layered film of metal containing at least one of aluminum (Al), tungsten (W), molybdenum (Mo), tantalum (Ta), chromium (Cr), titanium (Ti), and copper (Cu).

The inorganic insulating films 16, 18, and 20 may be formed of, for example, a silicon oxide (SiOx) film, a silicon nitride (SiNx) film, or a silicon oxynitride film, or of a layered film of these, formed by CVD.

The flattening film (interlayer insulating film) 21 may be formed, for example, of a coatable photosensitive organic material, such as a polyimide resin and an acrylic resin.

The light-emitting element 5R includes a light-emitting layer 24Rd in a first wavelength region as the light-emitting layer 24d. The light-emitting element 5G includes a light-emitting layer 24Gd in a second wavelength region as the light-emitting layer 24d. The light-emitting element 5B includes a light-emitting layer 24Bd in a third wavelength region as the light-emitting layer 24d.

The light-emitting layer 24Rd of the first wavelength region, the light-emitting layer 24Gd of the second wavelength region, and the light-emitting layer 24Bd of the third wavelength region have different center wavelengths of the light emitted. In the present embodiment, a case is described where the light-emitting layer 24Rd of the first wavelength region emits a red color, the light-emitting layer 24Gd of the second wavelength region emits a green color, and the light-emitting layer 24Bd of the third wavelength region emits a blue color, but no such limitation is intended.

Also, in the present embodiment, a case is described where the display device 2 includes the three types of light-emitting elements 5R, 5G, 5B that emit red, green, and blue light. However, no such limitation is intended, and four types of light-emitting elements may be provided that emit light of different color. Alternatively, the display device may be provided with one type or two types of light-emitting elements.

The light-emitting layer 24d (specifically, the light-emitting layers 24Rd, 24Gd, and 24Bd) is a light-emitting layer including nanosized quantum dots (nanoparticles). The light-emitting layer 24d may include, for example, quantum dot phosphors. As the material of the quantum dots, for example, any of CdSe/CdS, CdSe/ZnS, InP/ZnS, and CIGS/ZnS may be used. Also, the particle size of the quantum dots is approximately from 3 to 10 nm. In order to configure the light-emitting layers 24Rd, 24Gd, and 24Bd with different center wavelengths of emitted light, the light-emitting layers 24Rd, 24Gd, and 24Bd may use quantum dots with different particle sizes or may use quantum dots of different types.

In the present embodiment, a case is described where a light-emitting layer including quantum dots (nanoparticles) is used as the light-emitting layer 24d. However, the present embodiment is not limited to this configuration, and a light-emitting layer for an OLED may be used as the light-emitting layer 24d.

In a case where the light-emitting element 5 (specifically, the light-emitting elements 5R, 5G, 5B) is a QLED, positive holes and electrons recombine inside the light-emitting layer 24d in response to a drive current between the first electrode 22 and the second electrode 25, and light (fluoresce) is emitted when the excitons generated in this manner transition from a conduction band to a valence band of the quantum dot.

In a case where light-emitting element 5 (specifically, the light-emitting elements 5R, 5G, 5B) is an OLED, positive holes and electrons recombine inside the light-emitting layer 24d in response to a drive current between the first electrode 22 and the second electrode 25, and light is emitted when the excitons generated in this manner transition to a ground state.

A light-emitting element other than the OLED or the QLED (such as an inorganic light-emitting diode) may be formed as the light-emitting element 5.

Each of the light-emitting elements 5R, 5G, and 5B has a configuration in which the first electrode 22, the hole transport layer 24a, the oxide layer 24b, the oxide layer 24c, the light-emitting layers 24d (any one of the light-emitting layer 24Rd, the light-emitting layer 24Gd, or the light-emitting layer 24Bd) with different wavelength regions, the electron transport layer 24e, and the second electrode 25 are layered in this order. Note that the layering order from the first electrode 22 to the second electrode 25 may be reversed. Also, although the materials of the hole transport layer 24a and the electron transport layer 24e of the light-emitting elements 5R, 5G, and 5B are as described later, the hole transport layer 24a and the electron transport layer 24e of the light-emitting elements 5R, 5G, and 5B are not necessarily formed of common materials and may be formed of different materials.

Note that each of the light-emitting elements 5R, 5G, and 5B is a subpixel SP of the display device 2.

The bank 23 that covers the edge of the first electrode 22 may be formed of, for example, a coatable photosensitive organic material such as a polyimide resin or an acrylic resin.

In the present embodiment, a case is described where the first electrode 22, the hole transport layer 24a, the oxide layer 24b, the oxide layer 24c, the light-emitting layer 24d, and the electron transport layer 24e are formed into island shapes for each subpixel SP, with the second electrode 25 formed as a solid-like common layer, but no such limitation is intended. For example, the hole transport layer 24a, the oxide layer 24b, the oxide layer 24c, the electron transport layer 24e, and the second electrode 25, excluding the first electrode 22 and the light-emitting layer 24d, may be formed as a solid-like common layer. Note that in this case, the bank 23 need not be provided.

The first electrode 22 is formed of a conductive material, and functions as a hole injection layer (HIL) for injecting a positive hole in the hole transport layer 24a. The second electrode 25 is formed of a conductive material and has a function as an electron injection layer (EIL) for injecting an electron in the electron transport layer 24e.

At least one of the first electrode 22 or the second electrode 25 is made of a light-transmissive material. Note that one of the first electrode 22 or the second electrode 25 may be formed from a light-reflective material. In a case where the display device 2 is a top-emitting display device, the second electrode 25 being an upper layer is formed of a light-transmissive material, and the first electrode 22 being a lower layer is formed of a light-reflective material. In a case where the display device 2 is a bottom-emitting display device, the second electrode 25 being an upper layer is formed of a light-reflective material, and the first electrode 22 being a lower layer is formed of a light-transmissive material. In a case where the layering order from the first electrode 22 to the second electrode 25 is reversed, the display device 2 can be formed as a top-emitting display device by the first electrode 22, being an upper layer, being formed of a light-transmissive material and the second electrode 25, being a lower layer, being formed of a light-reflective material. Also, the display device 2 can be formed as a bottom-emitting display device by the first electrode 22, being an upper layer, being formed of a light-reflective material and the second electrode 25, being a lower layer, being formed of a light-transmissive material.

As the light-transmissive material, a transparent conductive film material can be used, for example. Specifically, Indium Tin Oxide (ITO), Indium Zinc Oxide (IZO), ZnO, aluminum-doped zinc oxide (AZO), boron-doped zinc oxide (BZO), or the like may be used. These materials have a high transmittance of visible light, and thus luminous efficiency is improved.

As the light-reflective material, a material with high visible light reflectivity such as a metal material is preferably used. Specifically, for example, Al, Cu, Au, Ag, or the like may be used. These materials have a high reflectivity of visible light, and thus luminous efficiency is improved.

In addition, an electrode with light reflectivity obtained by making either one of the first electrode 22 or the second electrode 25 a layered body including a light-transmissive material and a light-reflective material may be used.

Note that in the present embodiment, because the display device 2 is a top-emitting type, the second electrode 25 being an upper layer is formed of a light-transmissive material, and the first electrode 22 being a lower layer is formed of a light-reflective material.

The hole transport layer 24a is a layer that transports holes and inhibits the movement of electrons. The material of the hole transport layer 24a is not particularly limited as long as it is a hole transport material, and a known hole transport material can be used. Among these, a semiconductor is preferably used as the hole transport material and a p-type semiconductor is more preferably used as the hole transport material, for example. Examples of the hole transport material include NiO (nickel oxide), $CuAlO_2$ (copper aluminate), PEDOT:PSS (poly(3,4-ethylenedioxythiophene)-poly (4-styrenesulfonate)), PVK (polyvinyl carbazole), and the like. Nanoparticles may be used for the hole transport material.

Also, the hole transport layer 24a may be formed from an oxide containing at least one of Ni or Cu. In addition, the hole transport layer 24a may include an oxide in which the most abundant elements other than oxygen are one of Ni or Cu. In this case, the hole transport layer 24a has good hole conductivity.

The hole transport material may be an oxide or a material other than an oxide. Accordingly, the hole transport layer 24a may or may not contain an oxygen atom within the hole transport layer 24a. In a case where the hole transport material is an oxide (in other words, when the hole transport layer 24a is formed from an oxide), the oxygen atom density of the oxide layer 24b is preferably less than the oxygen atom density of the hole transport layer 24a (in other words, the density of the oxygen atoms in the hole transport layer 24a) as described below in the second embodiment described below. However, the oxygen atom density of the oxide layer 24b may be the same as the oxygen atom density of the hole transport layer 24a or may be greater than the oxygen atom density of the hole transport layer 24a.

Because the oxide layer 24b and the oxide layer 24c are provided separately from the hole transport layer 24a, the electric dipole can be freely formed without reducing the flexibility in the selection of the material of the hole transport layer 24a. Accordingly, the amount of hole injection to the light-emitting layer 24d can be freely controlled.

The oxide layer 24b is preferably formed from an inorganic oxide. The oxide layer 24b is preferably formed from an insulator (insulating material). Furthermore, the oxide layer 24b is preferably formed from an inorganic oxide insulator. In these cases, the long-term reliability is enhanced. That is, the luminous efficiency after aging is enhanced.

The oxide layer 24c is preferably formed from an inorganic oxide, for example. The oxide layer 24c is preferably formed from an insulator (insulating material). Furthermore, the oxide layer 24c is preferably formed from an inorganic oxide insulator. In these cases, the long-term reliability is enhanced. That is, the luminous efficiency after aging is enhanced.

Furthermore, the oxide layer 24b and the oxide layer 24c are further preferably both formed from an inorganic oxide. Furthermore, the oxide layer 24b and the oxide layer 24c are further preferably both formed from an insulator (inorganic insulator). In these cases, the long-term reliability is further enhanced. That is, the luminous efficiency after aging is further enhanced.

The oxide layer 24b and the oxide layer 24c may be, independent of one another, formed from an oxide with a main component of at least one element from Al (aluminum), Ga (gallium), Ta (tantalum), Zr (zirconium), Hf (hafnium), Mg (magnesium), Ge (germanium), Si (silicon), Y (yttrium), La (lanthanum), and Sr (strontium). In other words, the oxide layer 24b and the oxide layer 24c may be oxides containing the same element as the at least one main component or may be an oxides containing different elements as the main component. In addition, the oxide layer 24b and the oxide layer 24c may be formed, independent of one another, from oxides in which the most abundant element other than oxygen is any one of Al, Ga, Ta, Zr, Hf, Mg, Ge, Si, Y, La, or Sr.

More specifically, the oxide layer 24b and the oxide layer 24c may contain, independent of one another, at least one of, for example, aluminum oxide (for example, $Al_2O_3$), gallium oxide (for example, $Ga_2O_3$ having a crystal structure such as an α-structure or β-structure), tantalum oxide (for example, $Ta_2O_5$), zirconium oxide (for example, $ZrO_2$), hafnium oxide (for example, $HfO_2$), magnesium oxide (for example, MgO), germanium oxide (for example, $ZeO_2$), silicon oxide (for example, $SiO_2$), yttrium oxide (for example, $Y_2O_3$), lanthanum oxide (for example, $La_2O_3$), strontium oxide (for example, SrO), or a composite oxide containing two or more types of cations of these oxides, or may be formed from any one of the oxides and composite oxides described above. The composite oxide is not particularly limited, and examples thereof include oxides containing Si and Al. Note that the oxide layer 24b and the oxide layer 24c are described in more detail below.

The electron transport layer 24e is a layer that transports electrons and inhibits the movement of holes. The material of the electron transport layer 24e is not particularly limited as long as it is an electron transport material, and a known electron transport material can be used. The electron transport material may be an oxide or a material other than an oxide. A semiconductor is preferably used as the electron transport material and an n-type semiconductor is more preferably used as the electron transport material, for example. As the electron transport material, ZnO, $TiO_2$, $SrTiO_3$, and the like can be used. Also, nanoparticles may be used for the electron transport material. Also, as the electron transport material, an organic material, such as TPBi(1,3,5-tris(1-phenyl-1-H-benzimidazol-2-yl)benzene), Alq3(tris(8-hydroxy-quinolinate)aluminum), BCP(2,9-dimethyl-4,7-diphenyl-1,10-phenanthroline), and the like, may be used.

The sealing layer 6 is a light transmissive layer, and includes a first inorganic sealing film 26 that covers the second electrode 25, an organic sealing film 27 that is formed on a side above the first inorganic sealing film 26, and a second inorganic sealing film 28 that covers the organic sealing film 27. The sealing layer 6 covering the light-emitting elements 5R, 5G, 5B inhibits foreign matters such as water and oxygen from penetrating into the light-emitting elements 5R, 5G, 5B.

Each of the first inorganic sealing film 26 and the second inorganic sealing film 28 may be formed of, for example, a silicon oxide film, a silicon nitride film, or a silicon oxynitride film, or of a layered film of these, formed through the CVD method. The organic sealing film 27 is a light transmissive organic film which is thicker than the first inorganic sealing film 26 and the second inorganic sealing film 28, and can be formed of a coatable photosensitive organic material such as a polyimide resin or an acrylic resin.

(a) of FIG. 3 is an energy band diagram for describing a hole injection barrier in a light-emitting element according to a comparative example. (b) of FIG. 3 is an energy band diagram for describing a hole injection barrier in the light-emitting element 5.

As illustrated in (a) of FIG. 3, in the light-emitting element of the comparative example in which the hole transport layer 24a and the light-emitting layer 24d are in direct contact, the energy difference ΔEv between the upper end of the valence band (HTL valence band) of the hole transport layer 24a and the upper end of the valence band (light-emitting layer valence band) of the light-emitting layer 24d is large. Because the energy difference ΔEv is the height of the hole injection barrier, in the light-emitting element illustrated in (a) of FIG. 3, efficient hole injection to the light-emitting layer 24d is not possible.

Also, as illustrated in (b) of FIG. 3, the light-emitting element 5 according to the present embodiment includes, between the hole transport layer 24a and the light-emitting layer 24d, the oxide layer 24b and the oxide layer 24c layered adjacent to one another in this order from the hole transport layer 24a side, and as described above, the oxygen atom density of the oxide layer 24c is less than the oxygen atom density of the oxide layer 24b. Thus, the oxygen atoms can easily move from the oxide layer 24b toward the oxide layer 24c at the interface between the oxide layer 24b and the oxide layer 24c, and, at the interface, the electric dipole 1 having a dipole moment including a component orientated in the direction from the oxide layer 24c to the oxide layer 24b is formed.

When the electric dipole 1 is formed in this manner, as illustrated in (b) of FIG. 3, a vacuum level shift caused by the electric dipole 1 occurs at the interface between the oxide layer 24b and the oxide layer 24c, which is the interface where the electric dipole 1 is formed. As a result, as illustrated in (b) of FIG. 3, at the interface between the oxide layer 24b and the oxide layer 24c, the position of the band on the first electrode 22 side (the position of the lower end of the conduction band and the upper end of the valence band) moves downward with respect to the position of the band on the second electrode 25 side. In other words, in the example illustrated in (b) of FIG. 3, the position of the band of the hole transport layer 24a and the position of the band of the oxide layer 24b move downward (band shift) with respect to the position of the band of the light-emitting layer 24d and the position of the band of the oxide layer 24c. Although not illustrated, at this time, obviously the position of the band on the second electrode 25 side includes the position of the band of the layer on the second electrode 25 side of the light-emitting layer 24d. Note that in (b) of FIG. 3, the position of the band of the hole transport layer 24a before the vacuum level shift due to the electric dipole 1 is indicated by a dot-dash line, and the position of the band of the oxide layer 24b before the vacuum level shift due to the electric dipole 1 is indicated by a two-dot chain line. Also, the vacuum level after the vacuum level shift due to the electric dipole 1 is indicated by a dotted line.

Specifically, when the electric dipole 1 is formed, the conduction band (HTL conduction band) of the hole transport layer 24a moves to the HTL conduction band', and the HTL valence band of the hole transport layer 24a moves to the HTL valence band'. By this movement, the energy difference ΔEv between the upper end of the HTL valence band and the upper end of the light-emitting layer valence band is an energy difference ΔEv' between the upper end of the HTL valence band' and the upper end of the light-emitting layer valence band. As a result, the energy difference ΔEv' after formation of the electric dipole 1 (in other words, the hole injection barrier height after formation of the electric dipole 1) is less than the energy difference ΔEv (in other words, the hole injection barrier height in a case where the oxide layer 24b and the oxide layer 24c are not formed).

In a case where the film thickness of the oxide layer 24b and the oxide layer 24c is sufficiently thin in the light-emitting element 5, because the holes have conductivity via tunneling of the oxide layer 24b and oxide layer 24c, the hole injection barrier height between the hole transport layer 24a and the light-emitting layer 24d is effectively the energy difference ΔEv' between the upper end of the HTL valence band' and the upper end of the light-emitting layer valence band. According to the present embodiment, by forming the oxide layer 24b and the oxide layer 24c in this manner, efficient hole injection can be achieved.

Note that in the present disclosure, the energy difference ΔEv' indicates the "energy difference between the upper end of the valence band of the hole transport layer 24a and the upper end of the valence band of the light-emitting layer 24d after electric dipole formation". Thus, in the present embodiment, "after formation of the electric dipole" refers to the "after formation of the electric dipole 1", the "energy difference between the upper end of the valence band of the hole transport layer 24a and the upper end of the valence band of the light-emitting layer 24d after electric dipole formation" refers to the energy difference between the upper end of the HTL valence band' and the upper end of the light-emitting layer valence band after formation of the electric dipoles 1". Also in the present disclosure, the reference sign of the energy difference ΔEv' is positive (ΔEv'>0) in a case where, after electric dipole formation, the upper end of the valence band of the hole transport layer 24a (in the present embodiment, the upper end of the HTL valence band') is on a higher energy side (on the upper side in the band diagram) than the upper end of the valence band of the light-emitting layer 24d (in the present embodiment, the upper end of the light-emitting layer valence band), and is negative (ΔEv'<0) in a case where, after electric dipole formation, the upper end of the valence band of the hole transport layer 24a (in the present embodiment, the upper end of the HTL valence band') is on a lower energy side (on the lower side in the band diagram) than the upper end of the valence band of the light-emitting layer 24d (in the present embodiment, the upper end of the light-emitting layer valence band).

Similarly, in the present disclosure, the energy difference ΔEv is the "energy difference between the upper end of the valence band of the hole transport layer 24a (in other words the upper end of the HTL valence band) and the upper end of the valence band of the light-emitting layer 24d (in other words, the upper end of the light-emitting layer valence band), before formation of the electric dipole (in other words, in a state where there is no vacuum level shift)". Also in the present disclosure, the reference sign of the energy difference ΔEv is positive (ΔEv>0) in a case where, before electric dipole formation, the upper end of the valence band of the hole transport layer 24a (in other words, the upper end of the HTL valence band) is on a higher energy side (on the upper side in the band diagram) than the upper end of the valence band of the light-emitting layer 24d (in other words, the upper end of the light-emitting layer valence band), and is negative (ΔEv<0) in a case where, before electric dipole formation, the upper end of the valence band of the hole transport layer 24a (in other words, the upper end of the HTL valence band) is on a lower energy side (on the lower side in the band diagram) than the upper end of the valence band of the light-emitting layer 24d (in other words, the upper end of the light-emitting layer valence band).

In a case where the hole injection barrier height is negative, it means that there is no hole injection barrier present.

Note that in (b) of FIG. 3, an example is given of a case in which the position (position of the lower end of the conduction band and the upper end of the valence band) of the band of the oxide layer 24b and the position (position of the lower end of the conduction band and the upper end of the valence band) of the band of the oxide layer 24c before the vacuum level shift is caused by the electric dipole 1, indicated by the two-dot chain line, are the same. However, the position of the bands of oxide layer 24b and oxide layer 24c are determined by the material selected for the oxide layer 24b and oxide layer 24c, and thus the positions are not limited to those in example illustrated in (b) of FIG. 3. In the present embodiment, as illustrated in (a) of FIG. 3, the upper end of the HTL valence band is positioned above the upper end of the light-emitting layer valence band. In the example illustrated in (b) of FIG. 3, an example is given of a case in which the upper end of the HTL valence band' after a band shift has been caused by formation of the electric dipole 1 is positioned above the upper end of the light-emitting layer valence band. However, the upper end of the HTL valence band' after the band shift may be positioned below the upper end of the light-emitting layer valence band and is more preferably positioned below.

The film thickness of the oxide layer 24b is preferably is from 0.2 nm to 5 nm. By setting the film thickness of the oxide layer 24b to be 5 nm or less, hole tunneling can be efficient. Additionally, by setting the film thickness of the oxide layer 24b to be 0.2 nm or greater, a sufficiently large dipole moment can be obtained. The film thickness of the oxide layer 24b is more preferably is from 0.8 nm to 3 nm or less. In this case, more efficient hole injection is possible.

In a similar manner, the film thickness of the oxide layer 24c is preferably is from 0.2 nm to 5 nm. By setting the film thickness of the oxide layer 24c to be 5 nm or less, hole tunneling can be efficient. Additionally, by setting the film thickness of the oxide layer 24c to be 0.2 nm or greater, a sufficiently large dipole moment can be obtained. The film thickness of the oxide layer 24c is also more preferably is from 0.8 nm to 3 nm or less, and in this case, more efficient hole injection is possible.

The total film thickness of the oxide layer 24b and the oxide layer 24c is preferably is from 0.4 nm to 5 nm. By setting the total film thickness to be 5 nm or less, hole tunneling can be efficient. Additionally, by setting the total film thickness to be 0.4 nm or greater, a sufficiently large dipole moment can be obtained. The total film thickness is more preferably is from 1.6 nm to 4 nm or less. In this case, more efficient hole injection is possible.

The oxide layer 24b may be formed of an amorphous oxide or may be formed with at least a portion of the contact surface with oxide layer 24c formed of a polycrystalline oxide. Also, the oxide layer 24c may also be formed of an amorphous oxide or may be formed with at least a portion of the contact surface with oxide layer 24b formed of a polycrystalline oxide.

Note that only the contact surface of the oxide layer 24b with the oxide layer 24c may be polycrystalline, or the entire oxide layer 24b may be formed of a polycrystalline oxide. Also, only the contact surface of the oxide layer 24c with the oxide layer 24b may be polycrystalline, or the entire oxide layer 24c may be formed of a polycrystalline oxide. In other words, at least at the contact surface between the oxide layer 24b and the oxide layer 24c, at least one of the oxide layer 24b or the oxide layer 24c may include a polycrystalline oxide.

In the present embodiment, in a case where the oxygen atom density of the oxide layer 24c is less than the oxygen atom density of the oxide layer 24b, the method of making the oxide layer 24b and the oxide layer 24c polycrystalline is not particularly limited. Also, in a case where the oxygen atom density of the oxide layer 24c is less than the oxygen atom density of the oxide layer 24b, the type of polycrystalline oxide forming the oxide layer 24b and the oxide layer 24c is not particularly limited. Note that, an example of the above-described method for polycrystallization includes a heat treatment using laser light.

As described above, at least of a portion of the contact surface of the oxide layer 24b with the oxide layer 24c and at least a portion of the contact surface of the oxide layer 24c with the oxide layer 24b may be polycrystalline, but particularly preferably, the oxide layer 24b and the oxide layer 24c are each formed of an amorphous oxide. By forming the oxide layer 24b and the oxide layer 24c of an amorphous oxide, the film thickness uniformity of the oxide layer 24b and the oxide layer 24c can be improved, and the flatness of each surface can be improved (in other words, the surface roughness of the interface surface (interface) of the oxide layer 24b and the oxide layer 24c can be reduced). In this case, the electric dipole 1 can be easily uniformly formed within the interface, and the in-plane distribution of the energy difference ΔEv' between the upper end of the valence band (HTL valence band') of the hole transport layer 24a and the upper end of the valence band (light-emitting layer valence band) of the light-emitting layer 24d can be made uniform across the entire contact surface between the oxide layer 24b and the oxide layer 24c. Thus, the uniformity of hole conductivity due to tunneling is improved, and the luminous efficiency is improved.

Also, in a case where at least a portion of the contact surface of the oxide layer 24b with oxide layer 24c is polycrystalline, at least a portion of the contact surface of the oxide layer 24b with oxide layer 24c may include grains. Also, in a case where at least a portion of the contact surface of the oxide layer 24c with oxide layer 24b is polycrystalline, at least a portion of the contact surface of the oxide layer 24c with oxide layer 24b may include grains.

At least at the contact surface between the oxide layer 24b and the oxide layer 24c, by at least one of the oxide layer 24b or the oxide layer 24c including grains in this manner, the area of the interface between the oxide layer 24b and the oxide layer 24c is increased, allowing the electric dipole 1 to be more efficiently formed. Thus, efficient hole injection in the light-emitting element 5 is possible.

As described above, in the light-emitting element 5, at least at the contact surface between the oxide layer 24b and the oxide layer 24c, at least one of the oxide layer 24b or the oxide layer 24c may include a polycrystalline oxide.

Also, in the light-emitting element 5, at least at the contact surface between the oxide layer 24b and the oxide layer 24c, one of the oxide layer 24b or the oxide layer 24c may include a polycrystalline oxide, and the other may be formed of an amorphous oxide. For example, of the oxide layer 24b and the oxide layer 24c, the layer on the upper layer side may be formed of an amorphous oxide, and at least a portion of the top surface of the layer on the lower layer side may be polycrystalline. In this case, the upper surface of the layer on the lower layer side may include grains. The surface roughness of the upper surface of the layer on the lower layer side is also reflected in the contact surface (interface) of the layer on the upper layer side with the layer on the lower layer side.

Thus, for example, as illustrated in FIG. 2, in a case where the first electrode 22 is a layer on the lower layer side of the light-emitting layer 24d and the second electrode 25 is a layer on the upper layer side of the light-emitting layer 24d, the oxide layer 24c, which is the layer from among the oxide layer 24b and the oxide layer 24c on the upper layer side, may be formed of an amorphous oxide. The upper surface of the oxide layer 24b, which is the layer from among the oxide layer 24b and the oxide layer 24c on the lower layer side, may include grains. In this case, by the oxide layer 24c being an amorphous oxide, good coverage with respect to the oxide layer 24b including grains can be obtained. Thus, the electric dipole 1 can be easily formed, and the film thickness uniformity of the oxide layer 24c can be improved. This allows the uniformity of hole conductivity due to tunneling of the oxide layer 24c to be improved. By the upper surface of the oxide layer 24b including grains, the area of the interface between the upper surface of the oxide layer 24b and the oxide layer 24c is increased, allowing the electric dipole 1 to be more efficiently formed. As a result, efficient hole injection to the light-emitting layer 24d in the light-emitting element 5 is possible.

Note that in the present embodiment, a case is described where grains are formed by polycrystallizing at least one of the contact surfaces described above. However, the present embodiment is not limited thereto, and, for example, grains may be formed in at least a portion of at least one of the contact surfaces by spontaneous nucleation using a sputtering method, a CVD method, or the like. Note that obviously the entire oxide layer 24b may include grains, and the entire oxide layer 24c may include grains.

In addition, at at least the contact surface of the oxide layer 24b with oxide layer 24c or at at least the contact surface of the oxide layer 24c with the oxide layer 24b, grains may be distributed discretely. Grains may also be crystal grains containing crystals or may include an amorphous phase.

When the hole injection barrier is large, hole injection is hindered, and when the hole injection barrier is small, hole injection is facilitated. By forming the oxide layer 24b and the oxide layer 24c of an amorphous oxide, the in-plane density variations of the electric dipole 1 formed between the two layers, i.e., the oxide layer 24b and the oxide layer 24c, can be reduced, in-plane variations in the hole injection barrier height can be suppressed, and in-plane variation in hole injection efficiency can be suppressed. As a result, the holes can easily uniformly tunnel the oxide layer 24b and the oxide layer 24c, and the luminous efficiency of the light-emitting element 5 is improved.

In addition, at least one layer of the oxide layer 24b or the oxide layer 24c is preferably a continuous film, and at least the layer, from among the oxide layer 24b and the oxide layer 24c, on the upper layer side is more preferably a continuous film. That is, of the oxide layer 24b and the oxide layer 24c, the film that is to be formed second may be a film formed over the entire surface of the entire substrate functioning as a support body (for example, in the example illustrated in FIG. 1, a layered body including the substrate 10, the resin layer 12, the barrier layer 3, and the TFT layer 4 that is an array substrate on which the first electrode 22 is formed). Note that in this example, the continuous film is a dense film having a porosity of less than 1%. In other words, the continuous film is a film with substantially no voids.

In other words, as illustrated in FIG. 2, in a case where the first electrode 22 is a layer on the lower layer side of the light-emitting layer 24d and the second electrode 25 is a layer on the upper layer side of the light-emitting layer 24d, of the oxide layer 24b and the oxide layer 24c, at least the oxide layer 24c positioned on the second electrode 25 side (in other words, the upper layer side) is preferably a continuous film. Also, in a case where the first electrode 22 is a layer on the upper layer side of the light-emitting layer 24d and the second electrode 25 is a layer on the lower layer side of the light-emitting layer 24d, of the oxide layer 24b and the oxide layer 24c, at least the oxide layer 24b positioned on the first electrode 22 side (in other words, the upper layer side) is preferably a continuous film.

In this case, of the oxide layer 24b and the oxide layer 24c, at least the layer on the upper layer side is preferably formed as a film by, for example, a sputtering method, a vapor deposition method, a CVD method (chemical vapor deposition method), a PVD method (physical vapor deposition method), or the like. In this case, a continuous film is formed. The oxide layer 24b and the oxide layer 24c formed in this manner have a large contact area, and the electric dipole 1 tends to be densely formed. Note that a layer made by applying microparticles such as nanoparticles cannot be a continuous film because of the porous nature due to a large number of voids being formed between the microparticles.

As illustrated in (b) of FIG. 3, an ionization potential IP1 of the hole transport layer 24a is less than an ionization potential IP2 of the light-emitting layer 24d, and the ionization potential IP2 of the light-emitting layer 24d is less than an ionization potential IP3 of the oxide layer 24b and an ionization potential IP4 of the oxide layer 24c. In other words, the ionization potential is smaller in the order of (i) the hole transport layer 24a, (ii) the light-emitting layer 24d, and (iii) the oxide layer 24b and the oxide layer 24c. Note that in the example illustrated in (b) of FIG. 3, the ionization potential IP3 of the oxide layer 24b and the ionization potential IP4 of the oxide layer 24c are equal, but the present disclosure is not limited thereto. The ionization potential of the oxide layer 24b and the oxide layer 24c may be different because the location of the bands of the oxide layer 24b and the oxide layer 24c is determined by the selection of the material of the oxide layer 24b and the oxide layer 24c. The ionization potential may be smaller in the order of the hole transport layer 24a, the light-emitting layer 24d, the oxide layer 24b, and the oxide layer 24c, or may be smaller in the order of the hole transport layer 24a, the light-emitting layer 24d, the oxide layer 24c, and the oxide layer 24b. In either case, the electric dipole 1 can reduce the hole injection barrier height from the energy difference $\Delta Ev$ to the energy difference $\Delta Ev'$.

Also, as illustrated in (b) of FIG. 3, the energy difference between the lower end of the conduction band and the upper end of the valence band in the oxide layer 24b and the oxide layer 24c is greater than the energy difference between the lower end of the HTL conduction band' and the upper end of the HTL valence band' in the hole transport layer 24a. Thus, the carrier density (hole density) of the oxide layer 24b and the oxide layer 24c is less than the carrier density (hole density) of the hole transport layer 24a, and the oxide layer 24b and the oxide layer 24c are better at insulating than the hole transport layer 24a. Note that herein, the energy difference between the lower end of the conduction band and the upper end of the valence band in the oxide layer 24b and the oxide layer 24c refers to the energy difference between the lower end of the conduction band and the upper end of the valence band in the oxide layer 24b and the energy difference between the lower end of the conduction band and the upper end of the valence band in the oxide layer 24c. The energy difference between the lower end of the conduction band of the oxide layer 24b and the upper end of the valence band of the oxide layer 24b is equal to the energy difference between the lower end of the conduction band' of the oxide layer 24b and the upper end of the valence band' of the oxide layer 24b in the oxide layer 24b, and the energy difference between the lower end of the conduction band of the oxide layer 24c and the upper end of the valence band of the oxide layer 24c is equal to the energy difference between the lower end of the conduction band' of the oxide layer 24c and the upper end of the valence band' of the oxide layer 24c in the oxide layer 24c. Also, as described above, the carrier density (hole density) of the oxide layer 24b and the oxide layer 24c is less than the carrier density (hole density) of the hole transport layer 24a. Accordingly, hole conduction by tunneling occurs in the oxide layer 24b and the oxide layer 24c. Note that the carrier density (hole density) of the hole transport layer 24a is preferably $1 \times 10^{15}$ cm$^{-3}$ or greater, for example. In this case, the hole transport layer 24a has good electrical conductivity. The carrier density (hole density) of the hole transport layer 24a is preferably $3 \times 10^{17}$ cm$^{-3}$ or less. In this case, non-emission recombination is suppressed, and the luminous efficiency is improved.

As described above, in the present embodiment, the oxygen atom density of the oxide layer 24c is less than the oxygen atom density of the oxide layer 24b.

Note that, in the example illustrated in (b) of FIG. 3, the energy difference between the lower end of the conduction band of the oxide layer 24b and the upper end of the valence band in the oxide layer 24b is equal to the energy difference between the lower end of the conduction band of the oxide layer 24c and the upper end of the valence band of the oxide layer 24c. However, no such limitation is intended. The energy difference between the lower end of the conduction band of the oxide layer 24b and the upper end of the valence band in the oxide layer 24b may be greater than or may be less than the energy difference between the lower end of the conduction band of the oxide layer 24c and the upper end of the valence band of the oxide layer 24c.

FIG. 5 is a diagram listing the oxygen atom density of inorganic oxides which are examples of the oxide for forming the oxide layer 24b and the oxide layer 24c.

For the oxides forming the oxide layer 24b and the oxide layer 24c, for example, of the two oxides selected from the inorganic oxides listed in FIG. 5, the oxide with the larger oxygen atom density should be selected as the oxide to form the oxide layer 24b, and the oxide with the smaller oxygen atom density should be selected as the oxide to form the oxide layer 24c.

As described above, a composite oxide containing multiple cations of the oxides listed in FIG. 5 can be used as the oxides for forming the oxide layer 24b and the oxide layer 24c.

By the oxygen atom density of the oxide layer 24c being less than the oxygen atom density of the oxide layer 24b, the electric dipole 1 having a dipole moment including a component oriented in the direction of the oxide layer 24b from the oxide layer 24c is more easily formed, and hole injection efficiency to the light-emitting layer 24d can be improved.

The oxygen atom density of the oxide layer 24c is preferably 95% or less, more preferably 90% or less, even more preferably 85% or less, even more preferably 80% or less, even more preferably 75% or less, and even more preferably 70% or less of the oxygen atom density of the oxide layer 24b. The smaller the oxygen atom density of the oxide layer 24c relative to the oxygen atom density of the oxide layer 24b, the more easily the oxygen atoms can move from the oxide layer 24b toward the oxide layer 24c, and the electric dipole 1 having a dipole moment including a component orientated in the direction from the oxide layer 24c to the oxide layer 24b is more efficiently formed. This allows for more efficient hole injection to the light-emitting layer 24d.

Also, the oxygen atom density of the oxide layer 24c is preferably 50% or less of the oxygen atom density of the oxide layer 24b. In this case, it is possible to suppress the formation of recombination centers due to dangling bonds and the like at the interface between the oxide layer 24b and the oxide layer 24c.

Note that the oxygen atom density in the present disclosure is a unique value for the oxide layer 24b and for the oxide layer 24c and applies to the oxygen atom bulk density of the material forming the oxide layer 24b or oxide layer 24c.

FIG. 6 is a diagram listing examples of combinations of oxides forming the oxide layer 24b and oxides forming the oxide layer 24c.

In the combinations listed in FIG. 6, because the oxygen atom density of the oxide layer 24c is less than the oxygen atom density of the oxide layer 24b, the electric dipole 1 is formed as illustrated in (b) of FIG. 3 and efficient hole injection from the hole transport layer 24a to the light-emitting layer 24d is possible.

Note that the combinations of oxides forming the oxide layer 24b and the oxide layer 24c listed in FIG. 6 are merely examples. As long as the oxygen atom density of the oxide layer 24c is less than the oxygen atom density of the oxide layer 24b, the present disclosure is not limited to these combinations.

Note that in the examples of FIG. 6, the oxide layer 24b is formed of an oxide containing one type of cation. However, the oxide layer 24b may be formed of an oxide containing one type of cation, or may be formed of an oxide containing a plurality of types of cations. That is, the oxide layer 24b may be formed of a composition formed by mixing a plurality of oxides, or as illustrated in FIG. 5, may be formed of a composite oxide or the like containing two or more types of cations of the exemplified oxide, for example, as long as the oxygen atom density of the oxide layer 24c is less than the oxygen atom density of the oxide layer 24b. In a similar manner, the oxide layer 24c may be formed of a composition formed by mixing a plurality of oxides, or as illustrated in FIG. 5, may be formed of a composite oxide or the like containing two or more types of cations of the exemplified oxide, for example, as long as the oxygen atom density of the oxide layer 24c is less than the oxygen atom density of the oxide layer 24b.

Also, the oxide layer 24c (more precisely, the oxide forming the oxide layer 24c) may include cations contained in the oxide layer 24b (in other words, cations contained in the oxide forming the oxide layer 24b). Also, the oxide layer 24b (more precisely, the oxide forming the oxide layer 24b) may include cations contained in the oxide layer 24c (in other words, cations contained in the oxide forming the oxide layer 24c). In either case, by the oxide layer 24b and the oxide layer 24c including a common cation, a structure that alleviates lattice mismatch between the oxide layer 24b and the oxide layer 24c can be obtained. As a result, defects due to lattice mismatch can be minimized or prevented and the electric dipole 1 having a dipole moment including a component orientated in the direction from the oxide layer 24c to the oxide layer 24b can be more efficiently formed. This allows for more efficient hole injection from the hole transport layer 24a to the light-emitting layer 24d.

Note that the oxide layer 24b (more precisely, the oxide forming the oxide layer 24b) may contain at least one of Ni, Cu, Ti, Zn, Sn, In, W, or Mo, but contained content is preferably small. In the oxide layer 24b, the ratio of the total number density of Ni, Cu, Ti, Zn, Sn, In, W, Mo to the total number density of all cations contained in the oxide layer 24b is preferably less than 50%, more preferably 20% or less, preferably 10% or less, more preferably 4% or less, more preferably 1% or less, more preferably 0.4% or less, and more preferably less than 0.1%. In this case, the carrier density in the oxide layer 24b can be prevented from increasing, so the luminous efficiency is improved. Furthermore, the oxide layer 24b (more precisely, the oxide forming the oxide layer 24b) is further preferably free of any of Ni, Cu, Ti, Zn, Sn, In, W, and Mo.

Also, the oxide layer 24c (more precisely, the oxide forming the oxide layer 24c) may contain at least one of Ni, Cu, Ti, Zn, Sn, In, W, or Mo, but contained content is preferably small. In the oxide layer 24c, the ratio of the total number density of Ni, Cu, Ti, Zn, Sn, In, W, Mo to the total number density of all cations contained in the oxide layer 24c is preferably less than 50%, more preferably 20% or less, preferably 10% or less, more preferably 4% or less, more preferably 1% or less, more preferably 0.4% or less, and more preferably less than 0.1%. In this case, the carrier density in the oxide layer 24c can be prevented from increasing, so the luminous efficiency is improved. Furthermore, the oxide layer 24c (more precisely, the oxide forming the oxide layer 24c) is further preferably free of any of Ni, Cu, Ti, Zn, Sn, In, W, and Mo.

Modification Example

FIG. 7 is an energy band diagram for describing a hole injection barrier in the light-emitting element 5 according to the present modified example.

In (b) of FIG. 3, as described above, an example is illustrated in which the ionization potential is smaller in the order of (i) the hole transport layers 24a, (ii) the light-emitting layer 24d, and (iii) the oxide layer 24b and the oxide layer 24c.

Regarding the ionization potential of the light-emitting element 5, it is only required that the ionization potential IP1 of the hole transport layer 24a is less than an ionization potential IP2 of the light-emitting layer 24d and the ionization potential IP2 of the light-emitting layer 24d is less than an ionization potential IP3 of the oxide layer 24b and an ionization potential IP4 of the oxide layer 24c. The selection of the material determines the size relationship between the ionization potential IP3 of the oxide layer 24b and the ionization potential IP4 of the oxide layer 24c, and thus the size relationship between the ionization potential IP3 of the oxide layer 24b and the ionization potential IP4 of the oxide layer 24c is not particularly restricted. As illustrated in FIG. 7, the ionization potential may be smaller in the order of the hole transport layer 24a, the light-emitting layer 24d, the oxide layer 24b, and the oxide layer 24c. Furthermore, the ionization potential may be smaller in the order of the hole transport layer 24a, the light-emitting layer 24d, the oxide layer 24c, and the oxide layer 24b. In either case, the electric dipole 1 can reduce the hole injection barrier height from the energy difference $\Delta Ev$ to the energy difference $\Delta Ev'$.

Second Embodiment

FIG. 8 is an energy band diagram for describing a hole injection barrier in a light-emitting element 55 according the present embodiment.

A light-emitting device according to the present embodiment includes the light-emitting element 55 illustrated in FIG. 8 as a light-emitting element in the light-emitting device (for example, the display device 2) according to the first embodiment. The light-emitting element 55 according to the present embodiment has the same configuration as the light-emitting element 5 according to the first embodiment except for the following points. Specifically, in the light-emitting element 55 according to the present embodiment, the hole transport layer 24a is formed of an oxide. As illustrated in FIG. 8, the oxide layer 24b and the oxide layer 24c are layered in this order from the hole transport layer 24a side (in other words, the first electrode 22 side) between the hole transport layer 24a and the light-emitting layer 24d, and the hole transport layer 24a, the oxide layer 24b, and the oxide layer 24c are layered in contact with one another. Note that, as described above, the oxygen atom density in the oxide layer 24b and the oxygen atom density in the oxide layer 24c are different. Additionally, the density of the oxygen atoms in the hole transport layer 24a (also referred to as the "oxygen atom density of the hole transport layer 24a" below) is different from the oxygen atom density of the oxide layer 24b adjacent to the hole transport layer 24a. In this case, oxygen atom movement occurs not only at the interface between the oxide layer 24b and the oxide layer 24c, but also at the interface between the hole transport layer 24a and the oxide layer 24b, and the electric dipole is easily formed.

As described in the first embodiment, the oxygen atom density of the oxide layer 24c is also preferably less than the oxygen atom density of the oxide layer 24b. In this case, the hole injection barrier height between the hole transport layer 24a and the light-emitting layer 24d decreases. Thus, efficient hole injection to the light-emitting layer 24d is possible.

In the present embodiment, the oxygen atom density of the oxide layer 24b is preferably less than the oxygen atom density of the hole transport layer 24a. In this case, the hole injection barrier height between the hole transport layer 24a and the light-emitting layer 24d decreases. Thus, efficient hole injection to the light-emitting layer 24d is possible.

In the present embodiment, the oxygen atom density of the oxide layer 24b is more preferably less than the oxygen atom density of the hole transport layer 24a, and the oxygen atom density of the oxide layer 24c is more preferably less than the oxygen atom density of the oxide layer 24b. In this case, the hole injection barrier height (the energy difference ΔEv') between the hole transport layer 24a and the light-emitting layer 24d decreases compared to the first embodiment. Thus, more efficient hole injection to the light-emitting layer 24d is possible. As a result, the luminous efficiency of the light-emitting element 55 is improved.

In the present embodiment described below, the oxygen atom density of the oxide layer 24b is less than the oxygen atom density of the hole transport layer 24a, and the oxygen atom density of the oxide layer 24c is less than the oxygen atom density of the oxide layer 24b. In this case, as in the first embodiment, oxygen atoms easily move at the interface between the oxide layer 24b and the oxide layer 24c from the oxide layer 24b toward the oxide layer 24c. Furthermore, oxygen atoms easily move from the hole transport layer 24a toward the oxide layer 24b at the interface between the hole transport layer 24a and the oxide layer 24b. Accordingly, as illustrated in FIG. 8, as in the first embodiment, at the interface between the oxide layer 24b and the oxide layer 24c, the electric dipole 1 having a dipole moment including a component orientated in the direction from the oxide layer 24c to the oxide layer 24b is formed. Also, at the interface between the hole transport layer 24a and the oxide layer 24b, an electric dipole 31 having a dipole moment including a component oriented in the direction of the hole transport layer 24a from the oxide layer 24b is formed. Note that in the light-emitting element 55 of the present embodiment, the mechanism by which the oxygen atoms move at the interface between the hole transport layer 24a and the oxide layer 24b adjacent to one another is the same as the mechanism by which the oxygen atoms move at the interface between the oxide layer 24b and the oxide layer 24c as illustrated in (a) of FIG. 4. Thus, in (a) and (b) of FIG. 4, "24b", "24c", and "1" can, in this order, be read as "24a", "24b", and "31".

When the electric dipole 1 and 31 are formed in this manner, as illustrated in FIG. 8, a vacuum level shift caused by the electric dipole 1 and the electric dipole 31 occurs at the interface between the oxide layer 24b and the oxide layer 24c, which is the interface where the electric dipole 1 is formed, and at the interface between the hole transport layer 24a and the oxide layer 24b, which is the interface where the electric dipole 31 is formed. As a result, as illustrated in FIG. 8, at the interface between the oxide layer 24b and the oxide layer 24c, the position (the position of the Fermi level, the lower end of the conduction band, the upper end of the valence band and the like) of the band on the first electrode 22 side moves downward with respect to the position of the band on the second electrode 25 side, and at the interface between the hole transport layer 24a and the oxide layer 24b, the position of the band on the first electrode 22 side moves downward with respect to the position of the band on the second electrode 25 side. In other words, in the example illustrated in FIG. 8, the position of the band of the hole transport layer 24a and the position of the band of the oxide layer 24b move downward (band shift) with respect to the position of the band of the light-emitting layer 24d and the position of the band of the oxide layer 24c. Also, the position of the band of the hole transport layer 24a further moves downward (band shift) with respect to the position of the band of the oxide layer 24b, the position of the band of the light-emitting layer 24d, and the position of the band of the oxide layer 24c. Although not illustrated, at this time, obviously the position of the band on the second electrode 25 side includes the position of the band of the layer on the second electrode 25 side of the light-emitting layer 24d. Note that also in FIG. 8, the position of the band of the hole transport layer 24a before the vacuum level shift due to the electric dipoles 1 and 31 is indicated by a dot-dash line, and the position of the band of the oxide layer 24b before the vacuum level shift due to the electric dipole 1 is indicated by a two-dot chain line. Also, the vacuum level after the vacuum level shift due to the electric dipoles 1 and 31 is indicated by a dotted line.

Specifically, when the electric dipole 1 and 31 is formed, the HTL valence band of the hole transport layer 24a moves to the HTL valence band', and the valence band of the oxide layer 24b moves to the valence band' of the oxide layer 24b. Also, the HTL conduction band of the hole transport layer 24a moves to the HTL conduction band', and the conduction band of the oxide layer 24b moves to the conduction band' of the oxide layer 24b. By this movement, the energy difference ΔEv between the upper end of the HTL valence band and the upper end of the light-emitting layer valence band is an energy difference ΔEv' between the upper end of the HTL valence band' and the upper end of the light-emitting layer valence band. As a result, the energy difference ΔEv' after formation of the electric dipole 1 and 31 (in other words, the hole injection barrier height after formation of the electric dipole 1 and 31) is less than the energy difference ΔEv (in other words, the hole injection barrier height in a case where the oxide layer 24b and the oxide layer 24c are not formed).

In a case where the film thickness of the oxide layer 24b and the oxide layer 24c is sufficiently thin as in the light-emitting element 5 of the first embodiment, because the holes have conductivity via tunneling of the oxide layer 24b and oxide layer 24c, the hole injection barrier height between the hole transport layer 24a and the light-emitting layer 24d in the light-emitting element 55 is effectively the energy difference ΔEv' between the upper end of the HTL valence band' and the upper end of the light-emitting layer valence band.

According to the present embodiment, by forming the hole transport layer 24a, the oxide layer 24b, and the oxide layer 24c as described above, at the two interfaces, i.e., the interface between the oxide layer 24b and the oxide layer 24c and the interface between the hole transport layer 24a and the oxide layer 24b, the dipole moments 1, 31 having a dipole moment including a component orientated in the direction from the oxide layer 24c to the hole transport layer 24a are formed. Thus, according to the present embodiment, compared to the first embodiment, the position of the band of the hole transport layer 24a moves further downward with respect to the position of the band of the light-emitting layer 24d and the position of the band of the oxide layer 24c. By this movement, the energy difference ΔEv' between the upper end of the HTL valence band' and the upper end of the light-emitting layer valence band is made even smaller than in the first embodiment. Thus, according to the present embodiment, hole injection that is more efficient than in the first embodiment is possible.

FIG. 9 is a diagram listing the oxygen atom density of inorganic oxides which are examples of the oxide for forming the hole transport layer 24a.

For the oxide forming the hole transport layer 24a, for example, an inorganic oxide having an oxygen atom density greater than the oxygen atom density of the oxide layer 24b may be selected from the inorganic oxides listed in FIG. 9, and the inorganic oxide may be used as the oxide for forming the hole transport layer 24a. Furthermore, after selecting the oxide for forming the hole transport layer 24a from the inorganic oxides listing in FIG. 9, a combination of inorganic oxides having an oxygen atom density less than the oxygen atom density of the hole transport layer 24a may be selected from the inorganic oxides listed in FIG. 5 or FIG. 6 and combinations thereof to form the oxide layer 24b and the oxide layer 24c.

As the oxide forming the hole transport layer 24a, a composite oxide containing multiple cations of the oxides listed in FIG. 9 can be used, for example. Also, the hole transport layer 24a may be formed from an oxide containing at least one of Ni or Cu. In addition, the hole transport layer 24a may include an oxide in which the most abundant elements other than oxygen are one of Ni or Cu.

Also in the present embodiment, by the oxygen atom density of the oxide layer 24c being less than the oxygen atom density of the oxide layer 24b, the electric dipole 1 having a dipole moment including a component oriented in the direction of the oxide layer 24b from the oxide layer 24c is more easily formed, and hole injection efficiency can be improved. Also, according to the present embodiment, by the oxygen atom density of the oxide layer 24b adjacent to the hole transport layer 24a being less than the oxygen atom density of the hole transport layer 24a, the electric dipole 31 having a dipole moment including a component oriented in the direction of the hole transport layer 24a from the oxide layer 24b is more easily formed, and hole injection efficiency can be further improved.

Note that in a case where the hole transport layer 24a is formed of an oxide as described above, the oxygen atom density of the oxide layer 24b is preferably 95% or less, more preferably 90% or less, even more preferably 85% or less, even more preferably 80% or less, even more preferably 75% or less, and even more preferably 70% or less of the oxygen atom density of the hole transport layer 24a. Also, as in the first embodiment, the oxygen atom density of the oxide layer 24c is preferably 95% or less, more preferably 90% or less, even more preferably 85% or less, even more preferably 80% or less, even more preferably 75% or less, and even more preferably 70% or less of the oxygen atom density of the oxide layer 24b. The smaller the oxygen atom density of the oxide layer 24b relative to the oxygen atom density of the hole transport layer 24a, the more easily the oxygen atoms can move from the hole transport layer 24a toward the oxide layer 24b, and the electric dipole 31 having a dipole moment including a component orientated in the direction from the oxide layer 24b to the hole transport layer 24a is more efficiently formed. Also, the smaller the oxygen atom density of the oxide layer 24c relative to the oxygen atom density of the oxide layer 24b, the more easily the oxygen atoms can move from the oxide layer 24b toward the oxide layer 24c, and the electric dipole 1 having a dipole moment including a component orientated in the direction from the oxide layer 24c to the oxide layer 24b is more efficiently formed.

Also, the oxygen atom density of the oxide layer 24c is preferably 50% or less of the oxygen atom density of the oxide layer 24b. In this case, it is possible to suppress the formation of recombination centers due to dangling bonds and the like at the interface between the oxide layer 24b and the oxide layer 24c.

Also, the oxygen atom density of the oxide layer 24b is preferably 50% or less of the oxygen atom density of the hole transport layer 24a. In this case, it is possible to suppress the formation of recombination centers due to dangling bonds and the like at the interface between the hole transport layer 24a and the oxide layer 24b.

As a result, more efficient hole injection to the light-emitting layer 24d from the hole transport layer 24a is possible. Note that the oxygen atom density in the present disclosure is a unique value for hole transport layer 24a and applies to the oxygen atom bulk density of the material forming the hole transport layer 24a.

FIG. 10 is a diagram listing examples of combinations of oxides forming the hole transport layer 24a and oxides forming the oxide layer 24b adjacent to the hole transport layer 24a.

In the combinations listed in FIG. 10, because the oxygen atom density of the oxide layer 24b is less than the oxygen atom density of the hole transport layer 24a, the electric dipole 31 is formed as illustrated in FIG. 8 and efficient hole injection from the hole transport layer 24a to the light-emitting layer 24d is possible.

Note that the combinations of oxides forming the hole transport layer 24a and the oxide layer 24b listed in FIG. 10 are merely examples. In the present embodiment, as long as the oxygen atom density of the oxide layer 24b is less than the oxygen atom density of the hole transport layer 24a, the present disclosure is not limited to these combinations.

Note that, in FIG. 10, an example is given of a case in which the hole transport layer 24a is formed of NiO or $CuAlO_2$, but the present disclosure is not limited to these materials. The hole transport layer 24a may be formed of an oxide containing one type of cation, or may be formed of an oxide containing a plurality of types of cations. That is, in the present embodiment, as long as the oxygen atom density of the oxide layer 24b is less than the oxygen atom density of the hole transport layer 24a, the hole transport layer 24a, for example, may be formed of a composition formed by mixing a plurality of oxides listed in FIG. 9, or, for example, may be formed of a composite oxide or the like containing two or more types of cations of the oxides listed in FIG. 9. Also, as long as the oxygen atom density of the oxide layer 24b is less than the oxygen atom density of the hole transport layer 24a, the hole transport layer 24a may be formed from an oxide containing at least one of Ni or Cu. Also, as long as the oxygen atom density of the oxide layer 24b is less than the oxygen atom density of the hole transport layer 24a, the hole transport layer 24a may include an oxide in which the most abundant elements other than oxygen are one of Ni or Cu.

Also, the oxide layer 24b (more precisely, the oxide forming the oxide layer 24b) may include cations contained in the hole transport layer 24a (in other words, cations contained in the oxide forming the hole transport layer 24a), but the contained content is preferably small. In a case where the oxide layer 24b contains "cations contained in the hole transport layer 24a", the ratio of the number density of the "cations contained in the hole transport layer 24a" contained in the oxide layer 24b to all of the cations contained in the oxide layer 24b is preferably less than 50%, more preferably 20% or less, more preferably 10% or less, more preferably 4% or less, more preferably 1% or less, more preferably 0.4% or less, and more preferably less than 0.1%. In this case, because the "cations contained in the hole transport layer 24a" are contained in the oxide layer 24b, it is possible to suppress an increase in the hole density in the oxide layer 24b. Furthermore, the oxide layer 24b (more precisely, the oxide forming the oxide layer 24b) is more preferably free of "cations contained in the hole transport layer 24a".

Also, the hole transport layer 24a (more precisely, the oxide forming the hole transport layer 24a) may include cations contained in the oxide layer 24b (in other words, cations contained in the oxide forming the oxide layer 24b), but the contained content is preferably small. In a case where the hole transport layer 24a contains "cations contained in the oxide layer 24b", the ratio of the number density of the "cations contained in the oxide layer 24b" contained in the hole transport layer 24a to all of the cations contained in the hole transport layer 24a is preferably less than 50%, more preferably 20% or less, more preferably 10% or less, more preferably 4% or less, more preferably 1% or less, more preferably 0.4% or less, and more preferably less than 0.1%. In this case, because the "cations contained in the oxide layer 24b" are contained in the hole transport layer 24a, it is possible to suppress a decrease in the hole mobility in the hole transport layer 24a. Furthermore, the hole transport layer 24a (more precisely, the oxide forming the hole transport layer 24a) is more preferably free of "cations contained in the oxide layer 24b".

Note that the oxide layer 24b (more precisely, the oxide forming the oxide layer 24b) may contain at least one of Ni, Cu, Ti, Zn, Sn, In, W, or Mo, but contained content is preferably small. In the oxide layer 24b, the ratio of the total number density of Ni, Cu, Ti, Zn, Sn, In, W, Mo to the total number density of all cations contained in the oxide layer 24b is preferably less than 50%, more preferably 20% or less, more preferably 10% or less, more preferably 4% or less, more preferably 1% or less, more preferably 0.4% or less, and more preferably less than 0.1%. In this case, the carrier density in the oxide layer 24b can be prevented from increasing, so the luminous efficiency is improved. Furthermore, the oxide layer 24b (more precisely, the oxide forming the oxide layer 24b) is further preferably free of any of Ni, Cu, Ti, Zn, Sn, In, W, and Mo.

Also, the oxide layer 24c (more precisely, the oxide forming the oxide layer 24c) may contain at least one of Ni, Cu, Ti, Zn, Sn, In, W, or Mo, but contained content is preferably small. In the oxide layer 24c, the ratio of the total number density of Ni, Cu, Ti, Zn, Sn, In, W, Mo to the total number density of all cations contained in the oxide layer 24c is preferably less than 50%, more preferably 20% or less, more preferably 10% or less, more preferably 4% or less, more preferably 1% or less, more preferably 0.4% or less, and more preferably less than 0.1%. In this case, the carrier density in the oxide layer 24c can be prevented from increasing, so the luminous efficiency is improved. Furthermore, the oxide layer 24c (more precisely, the oxide forming the oxide layer 24c) is further preferably free of any of Ni, Cu, Ti, Zn, Sn, In, W, and Mo.

Note that in a case where the hole transport layer 24a is formed of an oxide as described above, the hole transport layer 24a may be formed of an amorphous oxide or may be formed with at least a portion of the contact surface with oxide layer 24b formed of a polycrystalline oxide. In other words, in the latter case, only the contact surface of the hole transport layer 24a with the oxide layer 24b may be polycrystalline, or the entire hole transport layer 24a may be formed of a polycrystalline oxide.

Also, as described in the first embodiment, the oxide layer 24b may be formed of an amorphous oxide or may be formed with at least a portion of the contact surface with oxide layer 24c formed of a polycrystalline oxide. Also, the oxide layer 24c may also be formed of an amorphous oxide or may be formed with at least a portion of the contact surface with oxide layer 24b formed of a polycrystalline oxide.

As long as the oxygen atom density of the oxide layer 24c is less than the oxygen atom density of the oxide layer 24b and the oxygen atom density of the oxide layer 24b is less than the oxygen atom density of the hole transport layer 24a, the method of making the hole transport layer 24a, the oxide layer 24b, and the oxide layer 24c polycrystalline is not particularly limited. Also, as long as the oxygen atom density of the oxide layer 24c is less than the oxygen atom density of the oxide layer 24b and the oxygen atom density of the oxide layer 24b is less than the oxygen atom density of the hole transport layer 24a, the type of the polycrystalline oxide forming the hole transport layer 24a, the oxide layer 24b, and the oxide layer 24c is not particularly limited. Note that also for the present embodiment, an example of the above-described method for polycrystallization includes a heat treatment using laser light.

According to the present embodiment, by forming the hole transport layer 24a, the oxide layer 24b, and the oxide layer 24c of an amorphous oxide, the film thickness uniformity of the hole transport layer 24a, the oxide layer 24b, and the oxide layer 24c can be improved, and the flatness of each surface can be improved. In this case, the electric dipole 31 is easily formed uniformly over the entire interface between the hole transport layer 24a and the oxide layer 24b. Also, the electric dipole 1 is easily formed uniformly over the entire interface between the oxide layer 24b and the oxide layer 24c. Thus, an increase in the efficiency of hole conduction by tunneling can be achieved, and more efficient hole injection to the light-emitting layer 24d in the light-emitting element 55 is possible.

Also, in a case where the oxide layer 24b and the oxide layer 24c are each formed of an amorphous oxide and at least a portion of the contact surface of the hole transport layer 24a with the oxide layer 24b is formed of a polycrystalline oxide, because the film thickness uniformity of the oxide layer 24b and the oxide layer 24c can be improved, in-plane density variations of the electric dipole 31 can be suppressed. In addition, in this case, at least a portion of the contact surface of the hole transport layer 24a with the oxide layer 24b includes grains. Thus, the oxide layer 24b being formed of an amorphous oxide can result in good coverage with respect to the hole transport layer 24a including grains. Thus, the contact area between the oxide layer 24b and the hole transport layer 24a is increased, and the electric dipole 31 can be formed more efficiently. In this manner, at the contact surface between the hole transport layer 24a and the oxide layer 24b, at least one of the hole transport layer 24a or the oxide layer 24b includes grains, and thus the area of the interface between the hole transport layer 24a and the oxide layer 24b is increased. Accordingly, the electric dipole 31 can be formed more efficiently, allowing for efficient hole injection in the light-emitting element 55. Also, the surface roughness of the hole transport layer 24a is also reflected in the contact surface (interface) between the hole transport layer 24a and the oxide layer 24b and the contact surface (interface) between the oxide layer 24b and the oxide layer 24c. As a result, the area of the interface between the hole transport layer 24a and the oxide layer 24b and the area of the interface between the oxide layer 24b and the oxide layer 24c increases.

Thus, in this case, the electric dipole 1 and 31 can be formed more efficiently, and thus efficient hole injection to the light-emitting layer 24d in the light-emitting element 55 is possible.

Note that in the present embodiment, a case is described where grains are formed by polycrystallizing the contact surface of the hole transport layer 24a with the oxide layer 24b. However, the present embodiment is not limited thereto, and, for example, grains may be formed in at least a portion of at least one of the contact surfaces by spontaneous nucleation using a sputtering method, a CVD method, or the like. Note that, of course, the entire hole transport layer 24a may include grains.

In addition, at at least the contact surface of the hole transport layer 24a with the oxide layer 24b, grains may be distributed discretely. Grains may also be crystal grains containing crystals or may include an amorphous phase.

Third Embodiment

At least one of the oxide layer 24b or the oxide layer 24c may be formed into island shapes. FIGS. 11 and 12 are cross-sectional views schematically illustrating a schematic configuration of a light-emitting element 155 and 255 according to the present embodiment.

A light-emitting device according to the present embodiment includes the light-emitting element 155 illustrated in FIG. 11 or the light-emitting element 255 illustrated in FIG. 12 as a light-emitting element in the light-emitting device (for example, the display device 2) according to the first embodiment. The light-emitting element 155 and 255 according to the present embodiment may have the same configuration as the light-emitting element according to the first embodiment or the light-emitting element according to the second embodiment except for the following points. Specifically, in the light-emitting element 155 illustrated in FIG. 11, the first electrode 22 is positioned above the light-emitting layer 24d, and the second electrode 25 is positioned below the light-emitting layer 24d. The oxide layer 24c in contact with the oxide layer 24b is formed into a plurality of island shapes. The oxide layer 24c can be formed into island shapes using spontaneous nucleation using a sputtering method, a CVD method, or the like. Furthermore, after forming the thin film, the thin film may be processed into island shapes by etching or the like.

In the example illustrated in FIG. 11, because the oxide layer 24c is formed into a plurality of island shapes, the area of the interface between the oxide layer 24b and the oxide layer 24c is increased. Thus, in this case, the electric dipole 1 can be formed more efficiently, and thus efficient hole injection to the light-emitting layer 24d in the light-emitting element 155 is possible.

Note that in the example illustrated in FIG. 11, the first electrode 22, which is the upper layer, is formed from a light-reflective material, and the second electrode 25, which is the lower layer, is formed from a light-transmissive material. In this manner, a bottom-emitting display device including the light-emitting element 155 can be realized. Note that in the display device including the light-emitting element 155, the first electrode 22 is formed as a solid-like common layer, and the second electrode 25 electrically connected to the thin film transistor element Tr (TFT element) is formed for each subpixel.

Also, in the example illustrated in FIG. 11, the first electrode 22, which is the upper layer, may be formed from a light-transmissive material, and the second electrode 25, which is the lower layer, may be formed from a light-reflective material. In this manner, a top-emitting display device including the light-emitting element 155 can be realized.

In the light-emitting element 255 illustrated in FIG. 12, as in the first embodiment, the first electrode 22 is positioned below the light-emitting layer 24d, and the second electrode 25 is positioned above the light-emitting layer 24d. The oxide layer 24b in contact with the oxide layer 24c is formed into a plurality of island shapes. The oxide layer 24b can be formed into island shapes using spontaneous nucleation using a sputtering method, a CVD method, or the like. Furthermore, after forming the thin film, the thin film may be processed into island shapes by etching or the like.

In the example illustrated in FIG. 12, because the oxide layer 24b is formed into a plurality of island shapes, the area of the interface between the oxide layer 24b and the oxide layer 24c is increased. Thus, in this case also, the electric dipole 1 can be formed more efficiently, and thus efficient hole injection to the light-emitting layer 24d in the light-emitting element 255 is possible.

Note that in the example illustrated in FIG. 12, the first electrode 22, which is the lower layer, is formed from a light-reflective material, and the second electrode 25, which is the upper layer, is formed from a light-transmissive material. In this manner, a top-emitting display device including the light-emitting element 255 can be realized. Note that in the display device including the light-emitting element 255, the second electrode 25 is formed as a solid-like common layer, and the first electrode 22 electrically connected to the thin film transistor element Tr (TFT element) is formed for each subpixel.

Also, in the example illustrated in FIG. 12, the first electrode 22, which is the lower layer, may be formed from a light-transmissive material, and the second electrode 25, which is the upper layer, may be formed from a light-reflective material. In this manner, a bottom-emitting display device including the light-emitting element 255 can be realized.

Fourth Embodiment

FIG. 13 is a cross-sectional view schematically illustrating a schematic configuration of a light-emitting element 355 according to the present embodiment.

A light-emitting device according to the present embodiment includes the light-emitting element 355 illustrated in FIG. 13 as a light-emitting element in the light-emitting device (for example, the display device 2) according to the first embodiment. Note that, in the following description, unless otherwise stated, components having the same reference numerals as those of the components described in any one of the first to third embodiments may have the same configuration as the components described in any one of the first to third embodiments.

As illustrated in FIG. 13, the light-emitting element 355 of the present embodiment includes a first electrode (hole injection layer: HIL) 22, a second electrode (electron injection layer: EIL) 25, and a light-emitting layer 24d provided between the first electrode 22 and the second electrode 25. An oxide layer 224b (first oxide layer), an oxide layer 224c (second oxide layer), and an electron transport layer (ETL) 24e are layered in contact with one another in this order, for example, between the second electrode 25 and the light-emitting layer 24d from the light-emitting layer 24d side (in other words, first electrode 22 side). Note that the density of the oxygen atoms in the oxide layer 224b and the density of the oxygen atoms in the oxide layer 224c are different. A hole transport layer (HTL) 24a is provided between the light-emitting layer 24d and the first electrode 22.

Accordingly, the light-emitting element 355 includes, for example, the first electrode 22 (anode), the hole transport layer 24a, the light-emitting layer 24d, the electron transport layer 24e, and the second electrode 25 (cathode) from the upper layer side in this order and includes the oxide layer 224b and the oxide layer 224c in contact with the oxide layer 224b between the light-emitting layer 24d and the electron transport layer 24e in this order from the first electrode 22 side.

Note that in the present embodiment also, as described above, the layering order of the layers in the light-emitting element may be reversed. Accordingly, the light-emitting element 355 according to the present embodiment may include, for example, the first electrode 22 (anode), the hole transport layer 24a, the light-emitting layer 24d, the electron transport layer 24e, and the second electrode 25 (cathode) from the lower layer side in this order and includes the oxide layer 224b and the oxide layer 224c in contact with the oxide layer 224b between the light-emitting layer 24d and the electron transport layer 24e in this order from the first electrode 22 side.

In other words, in the present embodiment, the electron transport layer 24e is formed on the second electrode 25. In addition, the oxide layer 224c, the oxide layer 224b, and the light-emitting layer 24d are formed in this order on the electron transport layer 24e, and the hole transport layer 24a and the first electrode 22 are formed in this order on the light-emitting layer 24d.

The second electrode 25 is formed of a conductive material and has a function as an electron injection layer (EIL) for injecting an electron in the electron transport layer 24e. The first electrode 22 is formed of a conductive material, and functions as a hole injection layer (HIL) for injecting a positive hole in the hole transport layer 24a.

At least one of the first electrode 22 or the second electrode 25 is made of a light-transmissive material (a transparent conductive film, for example). Note that one of the first electrode 22 or the second electrode 25 may be formed from a light-reflective material (a metal, for example). In a case where the display device 2 is a top-emitting display device, the first electrode 22 being an upper layer is formed of a light-transmissive material, and the second electrode 25 being a lower layer is formed of a light-reflective material. In a case where the display device 2 is a bottom-emitting display device, the first electrode 22 being an upper layer is formed of a light-reflective material, and the second electrode 25 being a lower layer is formed of a light-transmissive material. For the first electrode 22 and the second electrode 25, the same materials as the materials of the first electrode 22 and the second electrode 25 described in the first embodiment can be used.

Note that the layering order from the first electrode 22 to the second electrode 25 may be reversed. In addition, the second electrode 25 (the first electrode 22 in a case where the layering order is reversed), the electron transport layer 24e, the oxide layer 224c, the oxide layer 224b, the light-emitting layer 24d, and the hole transport layer 24a may be formed into island shapes for each subpixel SP, with the first electrode 22 (the second electrode 25 in a case where the layering order is reversed) formed as a solid-like common layer. In addition, instead of the configuration described above, the second electrode 25 (the first electrode 22 in a case where the layering order is reversed) and the light-emitting layer 24d are formed into island shapes for each subpixel SP, and except these, at least one of the electron transport layer 24e, the oxide layer 224c, the oxide layer 224b, the hole transport layer 24a, and the first electrode 22 (the second electrode 25 in a case where the layering order is reversed) may be formed as a solid-like common layer.

The hole transport layer 24a and the electron transport layer 24e are as described in the first embodiment. As described above, the electron transport material may be an oxide or a material other than an oxide. Accordingly, the electron transport layer 24e may or may not contain an oxygen atom within the electron transport layer 24e. In a case where the electron transport material is an oxide (in other words, when the electron transport layer 24e is formed from an oxide), the density of the oxygen atoms in the electron transport layer 24e (also referred to as "the oxygen atom density of the electron transport layer 24e" below) is preferably less than the oxygen atom density of the oxide layer 224c, as illustrated in the fifth embodiment described below. However, the oxygen atom density of the electron transport layer 24e may be the same as the oxygen atom density of the oxide layer 224c. Also, the oxygen atom density of the electron transport layer 24e may be greater than the oxygen atom density of the oxide layer 224c.

Because the oxide layer 224b and the oxide layer 224c are provided separately from the electron transport layer 24e, the electric dipole can be freely formed without reducing the flexibility in the selection of the material of the electron transport layer 24e. Accordingly, the amount of electron injection to the light-emitting layer 24d can be freely controlled.

The oxide layer 224b and the oxide layer 224c are formed of inorganic oxide, for example, similar to the oxide layer 24b and the oxide layer 24c of the first embodiment. Additionally, the oxide layer 224b and the oxide layer 224c are preferably formed of an inorganic insulator. A material similar to that used for the oxide layer 24b described in the first embodiment can be used for the oxide layer 224b. Also, a material similar to that used for the oxide layer 24c described in the first embodiment can be used for the oxide layer 224c.

In the present embodiment also, the density of the oxygen atoms in the oxide layer 224c, which is the oxide layer (second oxide layer) farther from the first electrode 22 of the oxide layer 224b and the oxide layer 224c adjacent to one another provided between the carrier transport layer (the electron transport layer 24e in the present embodiment) and the light-emitting layer 24d, is preferably less than the density of the oxygen atoms in the oxide layer 224b, which is the oxide layer (first oxide layer) closer to the first electrode 22. Note that the density of the oxygen atoms in the oxide layer 224c may be referred to as the "oxygen atom density of the oxide layer 224c". Also, the density of the oxygen atoms in the oxide layer 224b may be referred to as the "oxygen atom density of the oxide layer 224b".

(a) of FIG. 15 is a diagram illustrating the mechanism by which oxygen atoms move at the interface between the oxide layer 224b on the first electrode 22 side (in other words, the light-emitting layer 24d side) and the oxide layer 224c on the second electrode 25 side (in other words, the electron transport layer 24e side) in the light-emitting element 355 according to the present embodiment. (b) of FIG. 15 is a diagram illustrating a state in which an electric dipole 1' is formed by movement of oxygen atoms at the interface between the oxide layer 224b and the oxide layer 224c.

As described above, in the present embodiment, the oxygen atom density of the oxide layer 224c is less than the oxygen atom density of the oxide layer 224b. Thus, as illustrated in (a) of FIG. 15, when the oxide layer 224b is formed above the oxide layer 224c in contact with the oxide layer 224c, oxygen atoms easily move at the interface between the oxide layer 224b and the oxide layer 224c from the oxide layer 224b toward the oxide layer 224c. As oxygen atoms move, the oxygen holes become positively charged and the moving oxygen atoms become negatively charged.

Accordingly, as illustrated in (b) of FIG. 15, at the interface between the oxide layer 224b and the oxide layer 224c, the electric dipole 1' having a dipole moment including a component orientated in the direction from the oxide layer 224c to the oxide layer 224b is formed.

(a) of FIG. 14 is an energy band diagram for describing an electron injection barrier in a light-emitting element according to a comparative example. (b) of FIG. 14 is an energy band diagram for describing an electron injection barrier in the light-emitting element 355.

As illustrated in (a) of FIG. 14, in the light-emitting element of the comparative example in which the electron transport layer 24e and the light-emitting layer 24d are in direct contact, an energy difference ΔEc between the lower end of the conduction band of the light-emitting layer 24d (light-emitting layer conduction band) and the lower end of the conduction band of the electron transport layer 24e (ETL conduction band) is large. Because the energy difference ΔEc is the height of the electron injection barrier, in the light-emitting element illustrated in (a) of FIG. 14, efficient electron injection to the light-emitting layer 24d is not possible.

Also, as illustrated in (b) of FIG. 14, the light-emitting element 355 according to the present embodiment includes, between the electron transport layer 24e and the light-emitting layer 24d, the oxide layer 224c and the oxide layer 224b layered in contact with one another in this order from the electron transport layer 24e side, and as described above, the oxygen atom density of the oxide layer 224c is less than the oxygen atom density of the oxide layer 224b. Thus, the oxygen atoms can easily move from the oxide layer 224b toward the oxide layer 224c at the interface between the oxide layer 224b and the oxide layer 224c, and, at the interface, the electric dipole 1' having a dipole moment including a component orientated in the direction from the oxide layer 224c to the oxide layer 224b is formed.

When the electric dipole 1' is formed in this manner, as illustrated in (b) of FIG. 14, a vacuum level shift caused by the electric dipole 1 occurs at the interface between the oxide layer 224b and the oxide layer 224c, which is the interface where the electric dipole 1' is formed. As a result, as illustrated in (b) of FIG. 14, at the interface between the oxide layer 224b and the oxide layer 224c, the position of the band on the second electrode 25 side (the position of the lower end of the conduction band and the upper end of the valence band) moves upward with respect to the position of the band on the first electrode 22 side. In other words, in the example illustrated in (b) of FIG. 14, the position of the band of the electron transport layer 24e and the position of the band of the oxide layer 224c move upward (band shift) with respect to the position of the band of the light-emitting layer 24d and the position of the band of the oxide layer 224b. Although not illustrated, at this time, obviously the position of the band on the first electrode 22 side includes the position of the band of the layer on the second electrode 25 side of the light-emitting layer 24d. Note that in (b) of FIG. 14, the position of the band of the electron transport layer 24e before the vacuum level shift due to the electric dipole 1' is indicated by a dot-dash line, and the position of the band of the oxide layer 224c before the vacuum level shift due to the electric dipole 1' is indicated by a two-dot chain line. Also, the vacuum level after the vacuum level shift due to the electric dipole 1' is indicated by a dotted line.

Specifically, when the electric dipole 1' is formed, the ETL conduction band of the electron transport layer 24e moves to the ETL conduction band', and the valence band (ETL valence band) of the electron transport layer 24e moves to the ETL valence band'. By this movement, the energy difference ΔEc between the lower end of the light-emitting layer conduction band and the lower end of the ETL conduction band becomes an energy difference ΔEc' between the lower end of the light-emitting layer conduction band and the lower end of the ETL conduction band'. As a result, the energy difference ΔEc' after formation of the electric dipole 1' (in other words, the electron injection barrier height after formation of the electric dipole 1') is less than the energy difference ΔEc (in other words, the electron injection barrier height in a case where the oxide layer 224b and the oxide layer 224c are not formed).

In a case where the film thickness of the oxide layer 224b and the oxide layer 224c is sufficiently thin in the light-emitting element 355, because the electrons have conductivity via tunneling of the oxide layer 224c and oxide layer 224b, the electron injection barrier height between the electron transport layer 24e and the light-emitting layer 24d is effectively the energy difference ΔEc' between the lower end of the light-emitting layer conduction band and the lower end of the ETL conduction band'. According to the present embodiment, by forming the oxide layer 224b and the oxide layer 224c in this manner, efficient electron injection can be achieved.

Note that in the present disclosure, the energy difference ΔEc' indicates the "energy difference between the lower end of the conduction band of the light-emitting layer 24d and the lower end of the conduction band of the electron transport layer 24e after electric dipole formation". Thus, in the present embodiment, "after electric dipole formation" refers to "after formation of the electric dipole 1'", and "the energy difference between the lower end of the conduction band of the light-emitting layer 24d and the lower end of the conduction band of the electron transport layer 24e after electric dipole formation" refers to "the energy difference between the lower end of the light-emitting layer conduction band and the lower end of the ETL conduction band' after formation of the electric dipole 1'" as described above. Also in the present disclosure, the reference sign of the energy difference ΔEc' is positive (ΔEc'>0) in a case where, after electric dipole formation, the lower end of the conduction band of the light-emitting layer 24d (in the present embodiment, the lower end of the light-emitting layer conduction band) is on a higher energy side (on the upper side in the band diagram) than the lower end of the conduction band of the electron transport layer 24e (in the present embodiment, the lower end of the ETL conduction band'), and is negative (ΔEc'<0) in a case where, after electric dipole formation, the lower end of the conduction band of the light-emitting layer 24d (in the present embodiment, the lower end of the light-emitting layer conduction band) is on a lower energy side (on the lower side in the band diagram) than the lower end of the conduction band of the electron transport layer 24e (in the present embodiment, the lower end of the ETL conduction band').

Similarly, in the present disclosure, the energy difference ΔEc is the "energy difference between the lower end of the conduction band of the light-emitting layer 24d (in other words, the lower end of the light-emitting layer conduction band) and the lower end of the conduction band of the electron transport layer 24e (in other words, lower end of the ETL conduction band), before formation of the electric dipole (in other words, in a state where there is no vacuum level shift)". Also in the present disclosure, the reference sign of the energy difference ΔEc is positive (ΔEc>0) in a case where, before electric dipole formation, the lower end of the conduction band of the light-emitting layer 24d (in other words, the lower end of the light-emitting layer conduction band) is on a higher energy side (on the upper side in the band diagram) than the lower end of the conduction band of the electron transport layer 24e (in other words, the lower end of the ETL conduction band), and is negative (ΔEc<0) in a case where, after electric dipole formation, the lower end of the conduction band of the light-emitting layer 24d (in other words, the lower end of the light-emitting layer conduction band) is on a lower energy side (on the lower side in the band diagram) than the lower end of the conduction band of the electron transport layer 24e (in other words, the lower end of the ETL conduction band).

In a case where the electron injection barrier height is negative, it means that there is no electron injection barrier present.

Note that in (b) of FIG. 14, an example is given of a case in which the position of the band of the oxide layer 224c and the position of the band of the oxide layer 224b before the vacuum level shift is caused by the electric dipole 1', indicated by the two-dot chain line, are the same. However, the position of the bands of oxide layer 224b and oxide layer 224c are determined by the material selected for the oxide layer 224b and oxide layer 224c, and thus the positions are not limited to those in example illustrated in (b) of FIG. 14. Also, in the example illustrated in (b) of FIG. 14, an example is given of a case in which the lower end of the ETL conduction band' after a band shift has been caused by formation of the electric dipole 1' is positioned below the lower end of the light-emitting layer conduction band. However, the lower end of the ETL conduction band' after the band shift may be positioned above the upper end of the light-emitting layer conduction band and is more preferably positioned above.

The film thickness of the oxide layer 224b is preferably is from 0.2 nm to 5 nm. By setting the film thickness of the oxide layer 224b to be 5 nm or less, electron tunneling can be efficient. Additionally, by setting the film thickness of the oxide layer 224b to be 0.2 nm or greater, a sufficiently large dipole moment can be obtained. The film thickness of the oxide layer 224b is more preferably is from 0.8 nm to 3 nm or less. In this case, more efficient electron injection is possible.

In a similar manner, the film thickness of the oxide layer 224c is preferably is from 0.2 nm to 5 nm. By setting the film thickness of the oxide layer 224c to be 5 nm or less, electron tunneling can be efficient. Additionally, by setting the film thickness of the oxide layer 224c to be 0.2 nm or greater, a sufficiently large dipole moment can be obtained. The film thickness of the oxide layer 224c is also more preferably is from 0.8 nm to 3 nm or less, and in this case, more efficient electron injection is possible.

The total film thickness of the oxide layer 224b and the oxide layer 224c is preferably is from 0.4 nm to 5 nm. By setting the total film thickness to be 5 nm or less, electron tunneling can be efficient. Additionally, by setting the total film thickness to be 0.4 nm or greater, a sufficiently large dipole moment can be obtained. The total film thickness is more preferably is from 1.6 nm to 4 nm or less. In this case, more efficient electron injection is possible.

The oxide layer 224b may be formed of an amorphous oxide or may be formed with at least a portion of the contact surface with oxide layer 224c formed of a polycrystalline oxide. Also, the oxide layer 224c may also be formed of an amorphous oxide or may be formed with at least a portion of the contact surface with oxide layer 224b formed of a polycrystalline oxide.

Note that only the contact surface of the oxide layer 224b with the oxide layer 224c may be polycrystalline, or the entire oxide layer 224b may be formed of a polycrystalline oxide. Also, only the contact surface of the oxide layer 224c with the oxide layer 224b may be polycrystalline, or the entire oxide layer 224c may be formed of a polycrystalline oxide. In other words, at least at the contact surface between the oxide layer 224b and the oxide layer 224c, at least one of the oxide layer 224b or the oxide layer 224c may include a polycrystalline oxide.

In a case where the oxygen atom density of the oxide layer 224c is less than the oxygen atom density of the oxide layer 224b, the method of making the oxide layer 224b and the oxide layer 224c polycrystalline is not particularly limited. Also, in a case where the oxygen atom density of the oxide layer 224c is less than the oxygen atom density of the oxide layer 224b, the type of polycrystalline oxide forming the oxide layer 224b and the oxide layer 224c is not particularly limited. Note that also for the present embodiment, an example of the above-described method for polycrystallization includes a heat treatment using laser light.

At least of a portion of the contact surface of the oxide layer 224b with the oxide layer 224c and at least a portion of the contact surface of the oxide layer 224c with the oxide layer 224b may be polycrystalline, but particularly preferably, the oxide layer 224b and the oxide layer 224c are each formed of an amorphous oxide. By forming the oxide layer 224b and the oxide layer 224c of an amorphous oxide, the film thickness uniformity of the oxide layer 224b and the oxide layer 224c can be improved, and the flatness of each surface can be improved (in other words, the surface roughness of the interface surface (interface) of the oxide layer 224b and the oxide layer 224c can be reduced). In this case, the electric dipole 1' can be easily uniformly formed within the interface, and the in-plane distribution of the energy difference $\Delta Ec'$ between the lower end of the conduction band (light-emitting layer conduction band) of the light-emitting layer 24d and the lower end of the conduction band (ETL conduction band') of the electron transport layer 24e can be made uniform across the entire contact surface between the oxide layer 224b and the oxide layer 224c. Thus, the uniformity of electron conduction due to tunneling in the oxide layer 224b and the oxide layer 224c can be improved.

Also, in a case where at least a portion of the contact surface of the oxide layer 224b with oxide layer 224c is polycrystalline, at least a portion of the contact surface of the oxide layer 224b with oxide layer 224c may include grains. Also, in a case where at least a portion of the contact surface of the oxide layer 224c with oxide layer 224b is polycrystalline, at least a portion of the contact surface of the oxide layer 224c with oxide layer 224b may include grains.

At least at the contact surface between the oxide layer 224b and the oxide layer 224c, by at least one of the oxide layer 224b or the oxide layer 224c including grains in this manner, the area of the interface between the oxide layer 224b and the oxide layer 224c is increased, allowing the electric dipole 1' to be more efficiently formed. Thus, efficient electron injection in the light-emitting element 355 is possible.

As described above, in the light-emitting element 355, at least at the contact surface between the oxide layer 224b and the oxide layer 224c, at least one of the oxide layer 224b or the oxide layer 224c may include a polycrystalline oxide.

Also, in the light-emitting element 355, at least at the contact surface between the oxide layer 224b and the oxide layer 224c, one of the oxide layer 224b or the oxide layer 224c may include a polycrystalline oxide, and the other may be formed of an amorphous oxide. For example, of the oxide layer 224b and the oxide layer 224c, the layer on the upper layer side may be formed of an amorphous oxide, and at least a portion of the top surface of the layer on the lower layer side may be polycrystalline. In this case, the upper surface of the layer on the lower layer side may include grains.

Thus, for example, as illustrated in FIG. 13, in a case where the second electrode 25 is a layer on the lower layer side of the light-emitting layer 24*d* and the first electrode 22 is a layer on the upper layer side of the light-emitting layer 24*d*, the oxide layer 224*b*, which is the layer from among the oxide layer 224*b* and the oxide layer 224*c* on the upper layer side, may be formed of an amorphous oxide. The upper surface of the oxide layer 224*c*, which is the layer from among the oxide layer 224*b* and the oxide layer 224*c* on the lower layer side, may include grains. In this case, by the oxide layer 224*b* being an amorphous oxide, the film thickness uniformity of the oxide layer 224*b* can be improved. This allows the uniformity of electron conductivity due to tunneling of the oxide layer 224*b* to be improved. By the upper surface of the oxide layer 224*c* including grains, the area of the interface between the upper surface of the oxide layer 224*c* and the oxide layer 224*b* is increased, allowing the electric dipole 1' to be more efficiently formed. As a result, efficient electron injection to the light-emitting layer 24*d* in the light-emitting element 355 is possible.

Note that in the present embodiment also, at least at a portion of the contact surface between the oxide layer 224*b* and the oxide layer 224*c*, at least one of the oxide layer 224*b* or the oxide layer 224*c* may be made polycrystalline to form grains. In addition, for example, using spontaneous nucleation via a sputtering method, a CVD method or the like, at the contact surface between the oxide layer 224*b* and the oxide layer 224*c*, the oxide layer 224*b* and the oxide layer 224*c* may be formed in a manner such that at least one of the oxide layer 224*b* or the oxide layer 224*c* includes grains. Note that obviously the entire oxide layer 224*b* may include grains, and the entire oxide layer 224*c* may include grains.

In addition, at at least the contact surface of the oxide layer 224*b* with oxide layer 224*c* or at at least the contact surface of the oxide layer 224*c* with the oxide layer 224*b*, grains may be distributed discretely. Grains may also be crystal grains containing crystals or may include an amorphous phase.

In a similar manner to holes, for electron injection, when the electron injection barrier is large, electron injection is hindered, and when the electron injection barrier is small, electron injection is facilitated. By forming the oxide layer 224*b* and the oxide layer 224*c* of an amorphous oxide, the in-plane density variations of the electric dipole 1' formed at the interface between the oxide layer 224*b* and the oxide layer 224*c*, can be reduced, allowing the in-plane variations in the electron injection barrier height to be suppressed. As a result, the electrons can easily uniformly tunnel the oxide layer 224*b* and the oxide layer 224*c*, and the uniformity of the light emission of the light-emitting element 355 is improved.

In addition, at least one layer of the oxide layer 224*b* or the oxide layer 224*c* is preferably a continuous film, and at least the layer, from among the oxide layer 224*b* and the oxide layer 224*c*, on the upper layer side is more preferably a continuous film. That is, of the oxide layer 224*b* and the oxide layer 224*c*, the film that is to be formed second may be a film formed over the entire surface of the entire substrate functioning as a support body (for example, as illustrated in FIG. 1, a layered body including the substrate 10, the resin layer 12, the barrier layer 3, and the TFT layer 4 that is an array substrate on which the second electrode 25 is formed). Note that as described above, the continuous film is a dense film having a porosity of less than 1%. In other words, as described above, the continuous film is a film with substantially no voids.

Note that at least at the contact surface between the oxide layer 224*b* and the oxide layer 224*c*, the layer on the lower layer side from among the oxide layer 224*b* or the oxide layer 224*c* may include grains, and the layer on the upper layer side may be a continuous film.

As illustrated in FIG. 13, in a case where the second electrode 25 is a layer on the lower layer side of the light-emitting layer 24*d* and the first electrode 22 is a layer on the upper layer side of the light-emitting layer 24*d*, of the oxide layer 224*b* and the oxide layer 224*c*, at least the oxide layer 224*b* positioned on the first electrode 22 side (in other words, the upper layer side) is preferably a continuous film. Also, in a case where the second electrode 25 is a layer on the upper layer side of the light-emitting layer 24*d* and the first electrode 22 is a layer on the lower layer side of the light-emitting layer 24*d*, of the oxide layer 224*b* and the oxide layer 224*c*, at least the oxide layer 224*c* positioned on the second electrode 25 side (in other words, the upper layer side) is preferably a continuous film.

In this case, of the oxide layer 224*b* and the oxide layer 224*c*, at least the layer on the upper layer side is preferably formed as a film by, for example, a sputtering method, a vapor deposition method, a CVD method (chemical vapor deposition method), a PVD method (physical vapor deposition method), or the like. The oxide layer 224*b* and the oxide layer 224*c* formed in this manner have a large contact area, and the electric dipole 1 tends to be densely formed.

As illustrated in (b) of FIG. 14, an electron affinity EA1 of the electron transport layer 24*e* is greater than an electron affinity EA2 of the light-emitting layer 24*d*, and the electron affinity EA2 of the light-emitting layer 24*d* is greater than an electron affinity EA3 of the oxide layer 224*b* and an electron affinity EA4 of the oxide layer 224*c*. In other words, in the present embodiment, the electron affinity is greater in the order of (i) the electron transport layer 24*e*, (ii) the light-emitting layer 24*d*, and (iii) the oxide layer 224*b* and the oxide layer 224*c*. Note that, in the example illustrated in (b) of FIG. 14, the electron affinity EA3 of the oxide layer 224*b* and the electron affinity EA4 of the oxide layer 224*c* are equal. However, no such limitation is intended. Because the size relationship between the electron affinity EA3 of the oxide layer 224*b* and the electron affinity EA4 of the oxide layer 224*c* is determined by the material selected, there is no particular restriction on the size relationship between the electron affinity EA3 of the oxide layer 224*b* and the electron affinity EA4 of the oxide layer 224*c*. The electron affinity may be greater in order of the electron transport layer 24*e*, the light-emitting layer 24*d*, the oxide layer 224*b*, and the oxide layer 224*c*, and may be greater in order of the electron transport layer 24*e*, the light-emitting layer 24*d*, the oxide layer 224*c*, and the oxide layer 224*b*. In either case, the electric dipole 1' can reduce the electron injection barrier height from the energy difference $\Delta Ec$ to the energy difference $\Delta Ec'$.

Also, as illustrated in (b) of FIG. 14, the energy difference between the lower end of the conduction band and the upper end of the valence band in the oxide layer 224*b* and the oxide layer 224*c* is greater than the energy difference between the lower end of the ETL conduction band' and the upper end of the ETL valence band' in the electron transport layer 24*e*. Thus, the oxide layer 224*b* and the oxide layer 224*c* have greater insulating properties than the electron transport layer 24*e*.

Also, the carrier density (electron density) of the oxide layer 224b and the oxide layer 224c is less than the carrier density (electron density) of the electron transport layer 24e. Accordingly, electron conduction by tunneling occurs in the oxide layer 224b and the oxide layer 224c. Note that the electron transport layer 24e is preferably an n-type semiconductor as described above. Note that the carrier density (electron density) of the electron transport layer 24e is preferably $1\times10^{15}$ cm$^{-3}$ or greater. In this case, the electron transport layer 24e has good electrical conductivity. Note that the carrier density (electron density) of the electron transport layer 24e is preferably $3\times10^{17}$ cm$^{-3}$ or less. In this case, non-emission recombination is suppressed, and the luminous efficiency is improved.

As described above, materials similar to that used for the oxide layer 24b and the oxide layer 24c described of the first embodiment can be used for the oxide layer 224b and the oxide layer 224c. In the present embodiment, for the oxides forming the oxide layer 224b and the oxide layer 224c, for example, of the two oxides selected from the inorganic oxides listed in FIG. 5, the oxide with the smaller oxygen atom density should be selected as the oxide to form the oxide layer 224c, and the oxide with the larger oxygen atom density should be selected as the oxide to form the oxide layer 224b.

A composite oxide containing multiple cations of the oxides listed in FIG. 5 can be used as the oxides for forming the oxide layer 224b and the oxide layer 224c.

By the oxygen atom density of the oxide layer 224c being less than the oxygen atom density of the oxide layer 224b, the electric dipole 1' having a dipole moment including a component oriented in the direction of the oxide layer 224b from the oxide layer 224c is more easily formed, and electron injection efficiency can be improved.

The oxygen atom density of the oxide layer 224c is preferably 95% or less, more preferably 90% or less, even more preferably 85% or less, even more preferably 80% or less, even more preferably 75% or less, and even more preferably 70% or less of the oxygen atom density of the oxide layer 224b. The smaller the oxygen atom density of the oxide layer 224c relative to the oxygen atom density of the oxide layer 224b, the more easily the oxygen atoms can move from the oxide layer 224b toward the oxide layer 224c, and the electric dipole 1' having a dipole moment including a component orientated in the direction from the oxide layer 224c to the oxide layer 224b is more efficiently formed. This allows for more efficient electron injection from the electron transport layer 24e to the light-emitting layer 24d.

Also, the oxygen atom density of the oxide layer 224c is preferably 50% or less of the oxygen atom density of the oxide layer 224b. In this case, it is possible to suppress the formation of recombination centers due to dangling bonds and the like at the interface between the oxide layer 224b and the oxide layer 224c.

Note that the oxygen atom density in the present disclosure is a unique value for the oxide layer 224b and for the oxide layer 224c and applies to the oxygen atom bulk density of the material forming the oxide layer 224b or oxide layer 224c.

FIG. 16 is a diagram listing examples of combinations of oxides forming the oxide layer 224b and oxides forming the oxide layer 224c.

In the combinations listed in FIG. 16, because the oxygen atom density of the oxide layer 224c is less than the oxygen atom density of the oxide layer 224b, the electric dipole 1' is formed as illustrated in (b) of FIG. 15 and efficient electron injection from the electron transport layer 24e to the light-emitting layer 24d is possible.

Note that the combinations of oxides forming the oxide layer 224b and the oxide layer 224c listed in FIG. 16 are merely examples. As long as the oxygen atom density of the oxide layer 224c is less than the oxygen atom density of the oxide layer 224b, the present disclosure is not limited to these combinations.

Note that in the examples of FIG. 16, the oxide layer 224c is formed of an oxide containing one type of cation. However, the oxide layer 224b and the oxide layer 224c may be formed of an oxide containing one type of cation, or may be formed of an oxide containing a plurality of types of cations. That is, the oxide layer 224b may be formed of a composition formed by mixing a plurality of oxides, or as described above, may be formed of a composite oxide or the like containing two or more types of cations of the oxides listed in FIG. 9, for example, as long as the oxygen atom density of the oxide layer 224c is less than the oxygen atom density of the oxide layer 224b. In a similar manner, the oxide layer 224c may be formed of a composition formed by mixing a plurality of oxides, or as described above, may be formed of a composite oxide or the like containing two or more types of cations of the oxides listed in FIG. 9, for example, as long as the oxygen atom density of the oxide layer 224c is less than the oxygen atom density of the oxide layer 224b.

Also, the oxide layer 224c (more precisely, the oxide forming the oxide layer 224c) may include cations contained in the oxide layer 224b (in other words, cations contained in the oxide forming the oxide layer 224b). Also, the oxide layer 224b (more precisely, the oxide forming the oxide layer 224b) may include cations contained in the oxide layer 224c (in other words, cations contained in the oxide forming the oxide layer 224c). In either case, by the oxide layer 224b and the oxide layer 224c including a common cation, a structure that alleviates lattice mismatch between the oxide layer 224b and the oxide layer 224c can be obtained. As a result, defects due to lattice mismatch can be minimized or prevented and the electric dipole 1' having a dipole moment including a component orientated in the direction from the oxide layer 224c to the oxide layer 224b can be more efficiently formed. This allows for more efficient electron injection from the electron transport layer 24e to the light-emitting layer 24d.

Note that the oxide layer 224b (more precisely, the oxide forming the oxide layer 224b) may contain at least one of Ni, Cu, Ti, Zn, Sn, In, W, or Mo, but contained content is preferably small. In the oxide layer 224b, the ratio of the total number density of Ni, Cu, Ti, Zn, Sn, In, W, Mo to the total number density of all cations contained in the oxide layer 224b is preferably less than 50%, more preferably 20% or less, more preferably 10% or less, more preferably 4% or less, more preferably 1% or less, more preferably 0.4% or less, and more preferably less than 0.1%. In this case, the carrier density in the oxide layer 224b can be prevented from increasing, so the luminous efficiency is improved. Furthermore, the oxide layer 224b (more precisely, the oxide forming the oxide layer 224b) is further preferably free of any of Ni, Cu, Ti, Zn, Sn, In, W, and Mo.

Also, the oxide layer 224c (more precisely, the oxide forming the oxide layer 224c) may contain at least one of Ni, Cu, Ti, Zn, Sn, In, W, or Mo, but contained content is preferably small. In the oxide layer 224c, the ratio of the total number density of Ni, Cu, Ti, Zn, Sn, In, W, Mo to the total number density of all cations contained in the oxide layer 224c is preferably less than 50%, more preferably 20% or less, more preferably 10% or less, more preferably 4% or less, more preferably 1% or less, more preferably 0.4% or less, and more preferably less than 0.1%. In this case, the carrier density in the oxide layer 224c can be prevented from increasing, so the luminous efficiency is improved. Furthermore, the oxide layer 224c (more precisely, the oxide forming the oxide layer 224c) is further preferably free of any of Ni, Cu, Ti, Zn, Sn, In, W, and Mo.

Fifth Embodiment

FIG. 17 is an energy band diagram for describing an electron injection barrier in a light-emitting element 455 according the present embodiment.

A light-emitting device according to the present embodiment includes the light-emitting element 455 illustrated in FIG. 17 as a light-emitting element in the light-emitting device (for example, the display device 2) according to the first embodiment. The light-emitting element 455 according to the present embodiment has the same configuration as the light-emitting element 355 (see FIG. 13) according to the fourth embodiment except that the electron transport layer 24e is formed of an oxide.

Similar to the light-emitting element 355 illustrated in FIG. 13, the light-emitting element 455 includes the oxide layer 224b, the oxide layer 224c, and the electron transport layer 24e disposed layered in contact with one another in this order between the second electrode 25 and the light-emitting layer 24d from the light-emitting layer 24d side (in other words, the first electrode 22 side), and the hole transport layer 24a is provided between the light-emitting layer 24d and the first electrode 22. Note that, as described above, the oxygen atom density in the oxide layer 224b and the oxygen atom density in the oxide layer 224c are different. Furthermore, the oxygen atom density of the electron transport layer 24e is different from the oxygen atom density of the oxide layer 224c adjacent to the electron transport layer 24e. In this case, oxygen atom movement occurs not only at the interface between the oxide layer 24b and the oxide layer 24c, but also at the interface between the electron transport layer 24e and the oxide layer 224c, and the electric dipole is easily formed.

As described in the fourth embodiment, the oxygen atom density of the oxide layer 224c is also preferably less than the oxygen atom density of the oxide layer 224b. In this case, the electron injection barrier height between the electron transport layer 24e and the light-emitting layer 24d decreases. Thus, efficient electron injection to the light-emitting layer 24d is possible.

The oxygen atom density of the electron transport layer 24e is preferably less than the oxygen atom density of the oxide layer 224c. In this case, the electron injection barrier height between the electron transport layer 24e and the light-emitting layer 24d decreases. Thus, more efficient electron injection to the light-emitting layer 24d is possible.

Also, the oxygen atom density of the electron transport layer 24e is more preferably less than the oxygen atom density of the oxide layer 224c, and the oxygen atom density of the oxide layer 224c is more preferably less than the oxygen atom density of the oxide layer 224b. In this case, the electron injection barrier height (the energy difference ΔEc') between the electron transport layer 24e and the light-emitting layer 24d decreases compared to the fourth embodiment. Thus, more efficient electron injection to the light-emitting layer 24d is possible. As a result, the luminous efficiency of the light-emitting element 455 is improved.

In the present embodiment described below, the oxygen atom density of the electron transport layer 24e is less than the oxygen atom density of the oxide layer 224c, and the oxygen atom density of the oxide layer 224c is less than the oxygen atom density of the oxide layer 224b. In this case, as in the fourth embodiment, oxygen atoms easily move at the interface between the oxide layer 224b and the oxide layer 224c from the oxide layer 224b toward the oxide layer 224c. Also, oxygen atoms easily move at the interface between the electron transport layer 24e and the oxide layer 224c from the oxide layer 224c toward the electron transport layer 24e. Accordingly, as illustrated in FIG. 17, as in the fourth embodiment, at the interface between the oxide layer 224b and the oxide layer 224c, the electric dipole 1' having a dipole moment including a component orientated in the direction from the oxide layer 224c to the oxide layer 224b is formed. Also, at the interface between the electron transport layer 24e and the oxide layer 224c, an electric dipole 41 having a dipole moment including a component oriented in the direction of the oxide layer 224c from the electron transport layer 24e is formed. Note that in the light-emitting element 455 of the present embodiment, the mechanism by which the oxygen atoms move at the interface between the oxide layer 224c and the electron transport layer 24e adjacent to one another is the same as the mechanism by which the oxygen atoms move at the interface between the oxide layer 224b and the oxide layer 224c as illustrated in (a) of FIG. 15. Thus, in (a) and (b) of FIG. 15, "224b", "224c", and "1'" can, in this order, be read as "224c", "24e", and "41".

When the electric dipole 1' and 41 are formed in this manner, as illustrated in FIG. 17, a vacuum level shift caused by the electric dipole 1' and 41 occurs at the interface between the oxide layer 224b and the oxide layer 224c, which is the interface where the electric dipole 1' is formed, and at the interface between the electron transport layer 24e and the oxide layer 224c, which is the interface where the electric dipole 41 is formed. In other words, as illustrated in FIG. 17, the position of the band of the electron transport layer 24e and the position of the band of the oxide layer 224c move upward (band shift) with respect to the position of the band of the light-emitting layer 24d and the position of the band of the oxide layer 224b. Also, the position of the band of the electron transport layer 24e further moves upward (band shift) with respect to the position of the band of the oxide layer 224c, the position of the band of the oxide layer 224b, and the position of the band of the light-emitting layer 24d. Note that in FIG. 17 also, the position of the band of the electron transport layer 24e before the vacuum level shift due to the electric dipoles 1' and 41 is indicated by a dot-dash line, and the position of the band of the oxide layer 224c before the vacuum level shift due to the electric dipole 1 is indicated by a two-dot chain line. Also, the vacuum level after the vacuum level shift due to the electric dipoles 1' and 41 is indicated by a dotted line.

Specifically, when the electric dipole 1' and 41 is formed, the ETL valence band of the electron transport layer 24e moves to the ETL valence band', and the valence band of the oxide layer 224c moves to the valence band' of the oxide layer 224c. Also, the ETL conduction band of the electron transport layer 24e moves to the ETL conduction band', and the conduction band of the oxide layer 224c moves to the conduction band' of the oxide layer 224c. By this movement, the energy difference ΔEc between the lower end of the light-emitting layer conduction band and the lower end of the ETL conduction band becomes an energy difference ΔEc' between the lower end of the light-emitting layer conduction band and the lower end of the ETL conduction band'. As a result, the energy difference ΔEc' after formation of the electric dipole 1' and 41 (in other words, the electron injection barrier height after formation of the electric dipole 1' and 41) is less than the energy difference ΔEc (in other words, the electron injection barrier height in a case where the oxide layer 224b and the oxide layer 224c are not formed).

As with the light-emitting element 355 according to the fourth embodiment, in a case where the film thickness of the oxide layer 224b and the oxide layer 224c is sufficiently thin in the light-emitting element 455, because the electrons have conductivity via tunneling of the oxide layer 224b and oxide layer 224c, the electron injection barrier height between the electron transport layer 24e and the light-emitting layer 24d is effectively the energy difference ΔEc' between the lower end of the light-emitting layer conduction band and the lower end of the ETL conduction band'.

According to the present embodiment, by forming the electron transport layer 24e, the oxide layer 224c, and the oxide layer 224b as described above, at the two interfaces, i.e., the interface between the oxide layer 224b and the oxide layer 224c and the interface between the electron transport layer 24e and the oxide layer 224c, the dipole moment having a dipole moment including a component orientated in the direction from the electron transport layer 24e to the light-emitting layer 24d is formed. Thus, according to the present embodiment, compared to the fourth embodiment, the position of the band of the electron transport layer 24e moves further upward with respect to the position of the band of the light-emitting layer 24d and the position of the band of the oxide layer 224b. By this movement, the energy difference ΔEc' between the lower end of the light-emitting layer conduction band and the lower end of the ETL conduction band' is made even smaller than in the fourth embodiment. Thus, according to the present embodiment, electron injection that is more efficient than in the fourth embodiment is possible.

FIG. 18 is a diagram listing the oxygen atom density of inorganic oxides which are examples of the oxide for forming the electron transport layer 24e.

For the oxide forming the electron transport layer 24e, for example, an inorganic oxide having an oxygen atom density less than the oxygen atom density of the oxide layer 224c may be selected from the inorganic oxides listed in FIG. 18, and the inorganic oxide may be used as the oxide for forming the electron transport layer 24e. Furthermore, after selecting the oxide for forming the electron transport layer 24e from the inorganic oxides listing in FIG. 18, a combination of inorganic oxides having an oxygen atom density greater than the oxygen atom density of the electron transport layer 24e may be selected from the inorganic oxides listed in FIG. 5 or FIG. 16 and combinations thereof to form the oxide layer 224b and the oxide layer 224c. Also, it is only required that the oxide for forming the electron transport layer 24e is selected from the oxides listed in FIG. 18 and the oxides for forming the oxide layer 224c and the oxide layer 224b are selected from the oxides listed in FIG. 5 or the combination of oxides listed in FIG. 16 such that the oxygen atom density of the electron transport layer 24e is less than the oxygen atom density of the oxide layer 224c and the oxygen atom density of the oxide layer 224c is less than the oxygen atom density of the oxide layer 224b.

As the oxide forming the electron transport layer 24e, a composite oxide containing multiple cations of the oxides listed in FIG. 18 can be used, for example. Also, the electron transport layer 24e may be formed from an oxide containing at least one of Ti, Zn, Sn, or In. Furthermore, the electron transport layer 24e may include an oxide in which the most abundant elements other than oxygen are one of Ti, Zn, Sn, or In.

In the present embodiment also, by the oxygen atom density of the oxide layer 224c being less than the oxygen atom density of the oxide layer 224b, the electric dipole 1' having a dipole moment including a component oriented in the direction of the oxide layer 224b from the oxide layer 224c is more easily formed, and electron injection efficiency can be improved. Also, according to the present embodiment, by the oxygen atom density of the electron transport layer 24e being less than the oxygen atom density of the oxide layer 224c adjacent to the electron transport layer 24e, the electric dipole 41 having a dipole moment including a component oriented in the direction of the oxide layer 224c from the electron transport layer 24e is more easily formed, and the efficiency of electron injection can be further improved.

Note that in a case where the electron transport layer 24e is formed of an oxide as described above, the oxygen atom density of the electron transport layer 24e is preferably 95% or less, more preferably 90% or less, even more preferably 85% or less, even more preferably 80% or less, even more preferably 75% or less, and even more preferably 70% or less of the oxygen atom density of the oxide layer 224c. Also, as in the fourth embodiment, the oxygen atom density of the oxide layer 224c is preferably 95% or less, more preferably 90% or less, even more preferably 85% or less, even more preferably 80% or less, even more preferably 75% or less, and even more preferably 70% or less of the oxygen atom density of the oxide layer 224b. The smaller the oxygen atom density of the electron transport layer 24e relative to the oxygen atom density of the oxide layer 224c, the more easily the oxygen atoms can move from the oxide layer 224c toward the electron transport layer 24e, and the electric dipole 41 having a dipole moment including a component orientated in the direction from the electron transport layer 24e to the oxide layer 224c is more efficiently formed. Also, the smaller the oxygen atom density of the oxide layer 224c relative to the oxygen atom density of the oxide layer 224b, the more easily the oxygen atoms can move from the oxide layer 224b toward the oxide layer 224c, and the electric dipole 1' having a dipole moment including a component orientated in the direction from the oxide layer 224c to the oxide layer 224b is more efficiently formed.

Also, the oxygen atom density of the oxide layer 224c is preferably 50% or less of the oxygen atom density of the oxide layer 224b. In this case, it is possible to suppress the formation of recombination centers due to dangling bonds and the like at the interface between the oxide layer 224c and the oxide layer 224b.

Also, the oxygen atom density of the electron transport layer 24e is preferably 50% or less of the oxygen atom density of the oxide layer 224c. In this case, it is possible to suppress the formation of recombination centers due to dangling bonds and the like at the interface between the electron transport layer 24e and the oxide layer 224c.

As a result, more efficient electron injection to the light-emitting layer 24d from the electron transport layer 24e is possible. Note that the oxygen atom density in the present disclosure is a unique value for electron transport layer 24e and applies to the oxygen atom bulk density of the material forming the electron transport layer 24e.

FIG. 19 is a diagram listing examples of combinations of oxides forming the electron transport layer 24e and oxides forming the oxide layer 224c adjacent to the electron transport layer 24e.

In the combinations listed in FIG. 19, because the oxygen atom density of the electron transport layer 24e is less than the oxygen atom density of the oxide layer 224c, the electric dipole 41 is formed as illustrated in FIG. 17 and efficient electron injection from the electron transport layer 24e to the light-emitting layer 24d is possible.

Note that the combinations of oxides forming the electron transport layer 24e and the oxide layer 224c listed in FIG. 19 are merely examples. As long as the oxygen atom density of the electron transport layer 24e is less than the oxygen atom density of the oxide layer 224c, the present disclosure is not limited to these combinations.

Note that, in FIG. 19, an example is given of a case in which the electron transport layer 24e is formed of an oxide containing one type of cation, but no such limitation is intended. The electron transport layer 24e may be formed of an oxide containing one type of cation, or may be formed of an oxide containing a plurality of types of cations. That is, in a similar manner to the oxide layer 224b and the oxide layer 224c, the electron transport layer 24e may be formed of a composition formed by mixing a plurality of oxides. In the present embodiment, as long as the oxygen atom density of the electron transport layer 24e is less than the oxygen atom density of the oxide layer 224c, the electron transport layer 24e, for example, may be formed of a composite oxide or the like containing two or more types of cations of the oxides listed in FIG. 18.

Also, the oxide layer 224c (more precisely, the oxide forming the oxide layer 224c) may include cations contained in the electron transport layer 24e (in other words, cations contained in the oxide forming the electron transport layer 24e), but the contained content is preferably small. In a case where the oxide layer 224c contains "cations contained in the electron transport layer 24e", the ratio of the number density of the "cations contained in the electron transport layer 24e" contained in the oxide layer 224c to all of the cations contained in the oxide layer 224c is preferably less than 50%, more preferably 20% or less, more preferably 10% or less, more preferably 4% or less, more preferably 1% or less, more preferably 0.4% or less, and more preferably less than 0.10%. In this case, because the "cations contained in the electron transport layer 24e" are contained in the oxide layer 224c, it is possible to suppress an increase in the electron density in the oxide layer 224c. Furthermore, the oxide layer 224c (more precisely, the oxide forming the oxide layer 224c) is more preferably free of "cations contained in the electron transport layer 24e".

Also, the electron transport layer 24e (more precisely, the oxide forming the electron transport layer 24e) may include cations contained in the oxide layer 224c (in other words, cations contained in the oxide forming the oxide layer 224c), but the contained content is preferably small. In a case where the electron transport layer 24e contains "cations contained in the oxide layer 224c", the ratio of the number density of the "cations contained in the oxide layer 224c" contained in the electron transport layer 24e to all of the cations contained in the electron transport layer 24e is preferably less than 50%, more preferably 20% or less, more preferably 10% or less, more preferably 4% or less, more preferably 1% or less, more preferably 0.4% or less, and more preferably less than 0.1%. In this case, because the "cations contained in the oxide layer 224c" are contained in the electron transport layer 24e, it is possible to suppress a decrease in the electron mobility in the electron transport layer 24e. Furthermore, the electron transport layer 24e (more precisely, the oxide forming the electron transport layer 24e) is more preferably free of "cations contained in the oxide layer 224c".

Note that the oxide layer 224b (more precisely, the oxide forming the oxide layer 224b) may contain at least one of Ni, Cu, Ti, Zn, Sn, In, W, or Mo, but contained content is preferably small. In the oxide layer 224b, the ratio of the total number density of Ni, Cu, Ti, Zn, Sn, In, W, Mo to the total number density of all cations contained in the oxide layer 224b is preferably less than 50%, more preferably 20% or less, more preferably 10% or less, more preferably 4% or less, more preferably 1% or less, more preferably 0.4% or less, and more preferably less than 0.1%. In this case, the carrier density in the oxide layer 224b can be prevented from increasing, so the luminous efficiency is improved. Furthermore, the oxide layer 224b (more precisely, the oxide forming the oxide layer 224b) is further preferably free of any of Ni, Cu, Ti, Zn, Sn, In, W, and Mo.

Also, the oxide layer 224c (more precisely, the oxide forming the oxide layer 224c) may contain at least one of Ni, Cu, Ti, Zn, Sn, In, W, or Mo, but contained content is preferably small. In the oxide layer 224c, the ratio of the total number density of Ni, Cu, Ti, Zn, Sn, In, W, Mo to the total number density of all cations contained in the oxide layer 224c is preferably less than 50%, more preferably 20% or less, more preferably 10% or less, more preferably 4% or less, more preferably 1% or less, more preferably 0.4% or less, and more preferably less than 0.1%. In this case, the carrier density in the oxide layer 224c can be prevented from increasing, so the luminous efficiency is improved. Furthermore, the oxide layer 224c (more precisely, the oxide forming the oxide layer 224c) is further preferably free of any of Ni, Cu, Ti, Zn, Sn, In, W, and Mo.

Note that in a case where the electron transport layer 24e is formed of an oxide as described above, the electron transport layer 24e may be formed of an amorphous oxide or may be formed with at least a portion of the contact surface with oxide layer 224c formed of a polycrystalline oxide. In other words, in the latter case, only the contact surface of the electron transport layer 24e with the oxide layer 224c may be polycrystalline, or the entire electron transport layer 24e may be formed of a polycrystalline oxide. In other words, at least at the contact surface between the electron transport layer 24e and the oxide layer 224c, at least one of the electron transport layer 24e or the oxide layer 224c may include a polycrystalline oxide.

Also, as described in the fourth embodiment, the oxide layer 224b may be formed of an amorphous oxide or may be formed with at least a portion of the contact surface with oxide layer 224c formed of a polycrystalline oxide. Also, the oxide layer 224c may be formed of an amorphous oxide or may be formed with at least a portion of the contact surface with oxide layer 224b formed of a polycrystalline oxide. Note that in the present embodiment also, obviously, at least at the contact surface between the oxide layer 24b and the oxide layer 24c, at least one of the oxide layer 24b or the oxide layer 24c may include a polycrystalline oxide.

As long as the oxygen atom density of the oxide layer 224c is less than the oxygen atom density of the oxide layer 224b and the oxygen atom density of the electron transport layer 24e is less than the oxygen atom density of the oxide layer 224b, the method of making the electron transport layer 24e, the oxide layer 224b, and the oxide layer 224c polycrystalline is not particularly limited. Also, as long as the oxygen atom density of the oxide layer 224c is less than the oxygen atom density of the oxide layer 224b and the oxygen atom density of the electron transport layer 24e is less than the oxygen atom density of the oxide layer 224c, the type of polycrystalline oxide for forming the electron transport layer 24e, the oxide layer 224b, and the oxide layer 224c is not particularly limited. Note that also for the present embodiment, an example of the above-described method for polycrystallization includes a heat treatment using laser light.

According to the present embodiment, by forming the electron transport layer 24e, the oxide layer 224c, and the oxide layer 224b of an amorphous oxide, the film thickness uniformity of the electron transport layer 24e, the oxide layer 224c, and the oxide layer 224b can be improved, and the flatness of each surface can be improved. In this case, the electric dipole 41 is easily formed uniformly over the entire interface between the electron transport layer 24e and the oxide layer 224c. Also, the electric dipole 1' is easily formed uniformly over the entire interface between the oxide layer 224b and the oxide layer 224c. Thus, the uniformity of electron conductivity due to tunneling is improved, and uniformity of light emission in the light-emitting element 455 is improved.

Also, in a case where the oxide layer 224b and the oxide layer 224c are each formed of an amorphous oxide and at least the contact surface of the electron transport layer 24e with the oxide layer 224c includes a polycrystalline oxide, the film thickness uniformity of the oxide layer 224b and the oxide layer 224c can be improved. In addition, in this case, at least a portion of the contact surface of the electron transport layer 24e with the oxide layer 224c includes grains.

In this manner, at the contact surface between the electron transport layer 24e and the oxide layer 24c, at least one of the oxide layer 24b or the oxide layer 24c includes grains, and thus the area of the interface between the electron transport layer 24e and the oxide layer 224c is increased. Accordingly, the electric dipole 41 can be formed more efficiently, allowing for efficient electron injection in the light-emitting element 455. Also, the surface roughness of the electron transport layer 24e is also reflected in the contact surface (interface) between the electron transport layer 24e and the oxide layer 224c and the contact surface (interface) between the oxide layer 224b and the oxide layer 224c. As a result, the area of the interface between the electron transport layer 24e and the oxide layer 224c and the area of the interface between the oxide layer 224b and the oxide layer 224c increases.

Thus, in this case, the electric dipole 1' and 41 can be formed more efficiently, and thus efficient electron injection to the light-emitting layer 24d in the light-emitting element 455 is possible.

Note that in the present embodiment, a case is described where grains are formed by polycrystallizing the contact surface of the electron transport layer 24e with the oxide layer 224c. However, the present embodiment is not limited thereto, and, for example, grains may be formed in at least a portion of at least one of the contact surfaces by spontaneous nucleation using a sputtering method, a CVD method, or the like. Note that, of course, the entire electron transport layer 24e may include grains.

In addition, at at least the contact surface of the electron transport layer 24e with the oxide layer 224c, grains may be distributed discretely. Grains may also be crystal grains containing crystals or may include an amorphous phase.

Sixth Embodiment

In the first to third embodiments, an example is given of a case in which the light-emitting element has a configuration in which the hole transport layer 24a, the oxide layer 24b, the oxide layer 24c, the light-emitting layer 24d, and the electron transport layer 24e are provided in this order from the first electrode 22 side between the first electrode (hole injection layer: HIL) 22 and the second electrode (electron injection layer: EIL) 25. In the fourth and fifth embodiments, an example is given of a case in which the light-emitting element has a configuration in which the hole transport layer 24a, the light-emitting layer 24d, the oxide layer 224b, the oxide layer 224c, and the electron transport layer 24e are provided in this order from the first electrode 22 side between the first electrode (hole injection layer: HIL) 22 and the second electrode (electron injection layer: EIL) 25. However, the configuration of the light-emitting element according to the present disclosure is not limited to the configurations described above.

FIG. 20 is a cross-sectional view schematically illustrating an example of a schematic configuration of a light-emitting element according to the present embodiment. Also, FIG. 21 is a cross-sectional view schematically illustrating another example of a schematic configuration of the light-emitting element according to the present embodiment.

As illustrated in FIGS. 20 and 21, for example, the light-emitting element of the present embodiment has a configuration similar to that of any one of the first to third embodiments and in addition include the oxide layer 224b and the oxide layer 224c provided in this order from the light-emitting layer 24d side between the light-emitting layer 24d and the electron transport layer 24e.

In other words, the light-emitting element according to the present embodiment may include, from the lower layer side or the upper layer side, the first electrode 22 (hole injection layer: HIL), which is an anode, the hole transport layer 24a, the light-emitting layer 24d, the electron transport layer 24e, and the second electrode 25 (electron injection layer: EIL), which is a cathode, in this order; and may include the oxide layer 24b and the oxide layer 24c in contact with the oxide layer 24b provided between the hole transport layer 24a and the light-emitting layer 24d in this order from the first electrode 22 side, and the oxide layer 224b and the oxide layer 224c in contact with the oxide layer 224b provided between the light-emitting layer 24d and the electron transport layer 24e in this order from the first electrode 22 side.

Accordingly, the light-emitting element according to the present embodiment may have a configuration including, as in the light-emitting element 555 illustrated in FIG. 20, for example, the first electrode 22, the hole transport layer 24a, the oxide layer 24b (first oxide layer), the oxide layer 24c (second oxide layer), the light-emitting layer 24d, the oxide layer 224b (third oxide layer), the oxide layer 224c (fourth oxide layer), the electron transport layer 24e, and the second electrode 25 layered in this order. In addition, as in the light-emitting element 655 illustrated in FIG. 21, each layer illustrated in FIG. 20 may be layered in the reverse direction to that illustrated in FIG. 20. Also, a light-emitting device according to the present embodiment may include the light-emitting element described above as a light-emitting element in the light-emitting device (for example, the display device 2) according to the first embodiment.

Note that the first oxide layer, the second oxide layer, and the hole transport layer in the light-emitting element 555 are as described in the first to third embodiment. The oxide layer 224b (third oxide layer), the oxide layer 224c (fourth oxide layer), and the electron transport layer 24e in the light-emitting element 555 correspond to the oxide layer 224b (first oxide layer), the oxide layer 224c (second oxide layer), and the electron transport layer 24e, respectively, in the fourth and fifth embodiment.

Note that the light-emitting element 555 may be similar to the light-emitting element 355 according to the fourth and fifth embodiment and further include the oxide layer 24b (third oxide layer) and the oxide layer 24c (fourth oxide layer) in this order from the side closer to the first electrode 22 (that is, from the hole transport layer 24a side) between the hole transport layer 24a and the light-emitting layer 24d. In this case, the oxide layer 224b (first oxide layer), the oxide layer 224c (second oxide layer), and the electron transport layer 24e are as described in the fourth or fifth embodiment, and the oxide layer 24b (third oxide layer), the oxide layer 24c (fourth oxide layer), and the hole transport layer 24a can be said to correspond to the oxide layer 24b, the oxide layer 24c, and the hole transport layer 24a in any one of the first to third embodiments.

According to the present embodiment, depending on the combination, the effects described in any one of the first to third embodiment and the effects described in any one of the fourth and fifth embodiment can be combined, allowing a light-emitting element and the display device 2 in which both hole injection and electron injection to the light-emitting layer 24d easily occurs together and which has a further greater luminous efficiency.

Seventh Embodiment

In each of the embodiments described above, the description focused on how, in order to form an electric dipole having a dipole moment in a direction which reduces the barrier height of at least one of the hole injection barrier or the electron injection barrier, the density of the oxygen atoms (oxygen atom density) of each layer (the oxide layers 24a and 24b and/or the oxide layers 224b and 224c, the hole transport layer 24a, and the electron transport layer 24e) formed of an oxide in the light-emitting element is determined so that at least one of the hole injection efficiency or the electron injection efficiency is improved and the luminous efficiency is enhanced.

However, the embodiments described above are not limited thereto, and the oxygen atom density of each layer (in other words, the oxide layers 24b and 24c and/or the oxide layers 224b and 224c, the hole transport layer 24a, and the electron transport layer 24e) described above may be set such that at least one of the electric dipole 1, 1', 31, or 41 has a dipole moment with the reversed orientation of that in the embodiments described above. Also, at least one of the electric dipole 1, 1', 31 or 41 may have a dipole moment with a component in the same orientation as in the embodiments described above.

In the light-emitting element, for example, in a case where the energy difference $\Delta Ec$>the energy difference $\Delta Ev$ holds true, hole injection tends to be excessive with respect to electron injection. In a case such as this where hole injection is excessive, for example, in the first to third embodiments, by reversing the size relationship between the oxygen atom density of the oxide layer 24b and the oxygen atom density of the oxide layer 24c, the orientation of the dipole moment of the electric dipole 1 may be reversed. In this case, the energy difference $\Delta Ev'$>the energy difference $\Delta Ev$ holds true, and excessive hole injection is suppressed. As a result, unbalance between hole injection and electron injection is suppressed, and long-term reliability is improved. That is, the luminous efficiency after aging is enhanced. Similarly, in the second and third embodiments, the size relationship between the oxygen atom density of the oxide layer 24b and the oxygen atom density of the oxide layer 24c may be reversed, and the size relationship between the oxygen atom density in the oxide layer 24b and the oxygen atom density in the hole transport layer 24a may be reversed.

Also, in the light-emitting element, for example, in a case where the energy difference $\Delta Ec$<the energy difference $\Delta Ev$ holds true, electron injection tends to be excessive with respect to hole injection. In a case such as this where electron injection is excessive, for example, in the fourth and fifth embodiments, by reversing the size relationship between the oxygen atom density of the oxide layer 224b and the oxygen atom density of the oxide layer 224c, the orientation of the dipole moment of the electric dipole 1' may be reversed. In this case, the energy difference $\Delta Ec'$>the energy difference $\Delta Ec$ holds true, and excessive electron injection is suppressed. As a result, unbalance between hole injection and electron injection is suppressed, and long-term reliability is improved. That is, the luminous efficiency after aging is enhanced. Similarly, in the fifth embodiment, the size relationship between the oxygen atom density of the oxide layer 224b and the oxygen atom density of the oxide layer 224c may be reversed, and the size relationship between the oxygen atom density in the oxide layer 224c and the oxygen atom density in the hole transport layer 24a may be reversed.

Also, in the second and third embodiments, the size relationship between the oxygen atom density of the oxide layer 24b and the oxygen atom density of the oxide layer 24c or the size relationship between the oxygen atom density in the oxide layer 24b and the oxygen atom density in the hole transport layer 24a may be reversed. In this case, because the electric dipole 1 and the electric dipole 31 have dipole moments of reversed orientation, the direction of the shift of the vacuum level caused by the electric dipole 1 and the direction of the shift of the vacuum level caused by the electric dipole 31 are reversed from one another, and the amount of shift of the vacuum level as a whole can be finely controlled. As a result, controllability of the energy difference $\Delta Ev'$ is improved and control of the hole injection amount is facilitated. Thus, balance between hole injection and electron injection is easily obtained, and long-term reliability is improved. That is, the luminous efficiency after aging is enhanced.

Also, in the fifth embodiment, the size relationship between the oxygen atom density of the oxide layer 224b and the oxygen atom density of the oxide layer 224c or the size relationship between the oxygen atom density in the oxide layer 224b and the oxygen atom density in the electron transport layer 24e may be reversed. In this case, because the electric dipole 1' and the electric dipole 41 have dipole moments of reversed orientation, the direction of the shift of the vacuum level caused by the electric dipole 1' and the direction of the shift of the vacuum level caused by the electric dipole 41 are reversed from one another, and the amount of shift of the vacuum level as a whole can be finely controlled. As a result, controllability of the energy difference $\Delta Ec'$ is improved and control of the electron injection amount is facilitated. Thus, balance between hole injection and electron injection is easily obtained, and long-term reliability is improved. That is, the luminous efficiency after aging is enhanced.

In addition, in the sixth embodiment, for reasons similar to those described above, the oxygen atom density of each of the layers described above may be set such that at least one or more dipole moments of the electric dipoles 1, 1', 31, 41 are reversed in orientation. In this case, balance between hole injection and electron injection is easily achieved, and long-term reliability is improved. That is, the luminous efficiency after aging is enhanced.

Also, in the sixth embodiment, from among the size relationship between the oxygen atom density of the oxide layer 24b and the oxygen atom density of the oxide layer 24c and the size relationship between the oxygen atom density in the oxide layer 224b and the oxygen atom density in the oxide layer 224c, one may be as is and the other one may be reversed. Also, in the sixth embodiment, the size relationship between the oxygen atom density of the oxide layer 24b and the oxygen atom density of the oxide layer 24c and the size relationship between the oxygen atom density in the oxide layer 224b and the oxygen atom density in the oxide layer 224c may be maintained as is, and, from among the size relationship between the oxygen atom density of the oxide layer 24b and the oxygen atom density of the hole transport layer 24a and the size relationship between the oxygen atom density of the oxide layer 224c and the oxygen atom density of the electron transport layer 24e, at least one may be reversed. Also, in the sixth embodiment, from among the size relationship between the oxygen atom density of the oxide layer 24b and the oxygen atom density of the oxide layer 24c and the size relationship between the oxygen atom density in the oxide layer 224b and the oxygen atom density in the oxide layer 224c, one may be as is and the other may be reversed, and, from among the size relationship between the oxygen atom density of the oxide layer 24b and the oxygen atom density of the hole transport layer 24a and the size relationship between the oxygen atom density of the oxide layer 224c and the oxygen atom density of the electron transport layer 24e, at least one may be reversed. Also, the size relationship between the oxygen atom density of the oxide layer 24b and the oxygen atom density of the oxide layer 24c and the size relationship between the oxygen atom density in the oxide layer 224b and the oxygen atom density in the oxide layer 224c may both be reversed, and, from among the size relationship between the oxygen atom density of the oxide layer 24b and the oxygen atom density of the hole transport layer 24a and the size relationship between the oxygen atom density of the oxide layer 224c and the oxygen atom density of the electron transport layer 24e, at least one may be reversed. In both of these cases also, balance between hole injection and electron injection is easily achieved, and long-term reliability is improved. That is, the luminous efficiency after aging is enhanced.

The best practice in the present disclosure is to combine the first to sixth embodiments as appropriate. By doing so, high hole injection efficiency and high electron injection efficiency can be achieved in the light-emitting layer 24d, and as a result, high luminous efficiency can be achieved. Furthermore, by appropriately combining the first to sixth embodiments, a state in which hole injection and electron injection are balanced can be achieved while also achieving both high hole injection efficiency and high electron injection efficiency to the light-emitting layer 24d. In this case, the long-term reliability is also improved. That is, the luminous efficiency after aging is enhanced. On the other hand, by reversing the orientation of the electric dipole, as in the present embodiment, the amount of electron injection or hole injection amount may be controlled, and a balance between the amount of hole injection and the amount of electron injection may be achieved. If the orientations of the dipole moments of the two electric dipoles are reversed from one another, carrier injection can be finely controlled. Also, if any one of the orientations of the dipole moments of the electric dipoles is the reverse of that of the first to sixth embodiments, carrier injection can be suppressed. In this case, the long-term reliability is improved. That is, the luminous efficiency after aging is enhanced.

As described above, according to the present disclosure, the amount of hole injection or the amount of electron injection to the light-emitting layer 24d can be effectively controlled (including increased or suppressed), so high luminous efficiency can be achieved. Note that, in the first to sixth embodiment, a case is given in which high luminous efficiency is achieved by performing control to mainly increase the hole flow rate or the electron injection amount to the light-emitting layer 24d (enhancing the efficiency of the hole injection or the electron injection to the light-emitting layer 24d), and in the seventh embodiment, a case is given in which the luminous efficiency after aging is improved (the long-term reliability is improved) by finely controlling (including increasing or suppressing) the amount of hole injection or the amount of electron injection to the light-emitting layer 24d.

As described above, the light-emitting element according to the present disclosure may have any one of the following configurations (1) or (2), as in the first to third embodiments. Accordingly, the injection barrier of the holes serving as the carrier can be reduced, and the injection efficiency of the holes can be improved, so it is possible to realize high luminous efficiency.

(1) The first electrode 22, the hole transport layer 24a, the oxide layer 24b (first oxide layer), the oxide layer 24c (second oxide layer), the light-emitting layer 24d, the electron transport layer 24e, and the second electrode 25 are provided in this order from the upper layer side or the lower layer side, and (the oxygen atom density of the oxide layer 24b (first oxide layer))>(the oxygen atom density of the oxide layer 24c (second oxide layer)).

(2) The first electrode 22, the hole transport layer 24a, the oxide layer 24b (first oxide layer), the oxide layer 24c (second oxide layer), the light-emitting layer 24d, the electron transport layer 24e, and the second electrode 25 are provided in this order from the upper layer side or the lower layer side, the hole transport layer 24a is an oxide, and (the oxygen atom density of the hole transport layer 24a)>(the oxygen atom density of the oxide layer 24b (first oxide layer))>(the oxygen atom density of the oxide layer 24c (second oxide layer)).

Also, the light-emitting element according to the present disclosure may have any one of the following configurations (3) or (4), as in the fourth or fifth embodiments. Accordingly, the injection barrier of the electrons serving as the carrier can be reduced, and the injection efficiency of the electrons can be improved, so it is possible to realize high luminous efficiency.

(3) The first electrode 22, the hole transport layer 24a, the light-emitting layer 24d, the oxide layer 224b (first oxide layer), the oxide layer 224c (second oxide layer), the electron transport layer 24e, and the second electrode 25 are provided in this order from the upper layer side or the lower layer side, and (the oxygen atom density of the oxide layer 224b (first oxide layer))>(the oxygen atom density of the oxide layer 224c (second oxide layer)).

(4) The first electrode 22, the hole transport layer 24a, the light-emitting layer 24d, the oxide layer 224b (first oxide layer), the oxide layer 224c (second oxide layer), the electron transport layer 24e, and the second electrode 25 are provided in this order from the upper layer side or the lower layer side, the electron transport layer 24e is an oxide, and (the oxygen atom density of the oxide layer 224b (first oxide layer))>(the oxygen atom density of the oxide layer 224c (second oxide layer))>(the oxygen atom density of the electron transport layer 24e).

Also, the light-emitting element according to the present disclosure may have any one of the following configurations (5) to (8), as in the sixth embodiment. Accordingly, the injection barrier of the holes and electrons serving as the carrier can be reduced, and the injection efficiency of the holes and electrons can be improved, so it is possible to realize higher luminous efficiency.

Note that the first oxide layer is adjacent to the second oxide layer, and the third oxide layer is adjacent to the fourth oxide layer. Furthermore, the first oxide layer is provided on the first electrode side of the second oxide layer, and the third oxide layer is provided on the first electrode side of the fourth oxide layer. Thus, in the following description, for example, in a case where the oxide layer 24b is the first oxide layer, the oxide layer 24c is the second oxide layer, the oxide layer 224b is the third oxide layer, and the oxide layer 224c is the fourth oxide layer. In a case where the oxide layer 224b is the first oxide layer, the oxide layer 224c is the second oxide layer, the oxide layer 24b is the third oxide layer, and the oxide layer 24c is the fourth oxide layer.

(5) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, and (the oxygen atom density of the oxide layer 24b (first oxide layer or third oxide layer))>(the oxygen atom density of the oxide layer 24c (second oxide layer or fourth oxide layer)) and (the oxygen atom density of the oxide layer 224b (first oxide layer or third oxide layer))>(the oxygen atom density of the oxide layer 224c (second oxide layer or fourth oxide layer)).

(6) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the hole transport layer 24a is an oxide, and (the oxygen atom density of the hole transport layer 24a)>(the oxygen atom density of the oxide layer 24b (first oxide layer or third oxide layer))>(the oxygen atom density of the oxide layer 24c (second oxide layer or fourth oxide layer)) and (the oxygen atom density of the oxide layer 224b (first oxide layer or third oxide layer))>(the oxygen atom density of the oxide layer 224c (second oxide layer or fourth oxide layer)).

(7) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the electron transport layer 24e is an oxide, and (the oxygen atom density of the oxide layer 24b (first oxide layer or third oxide layer))>(the oxygen atom density of the oxide layer 24c (second oxide layer or fourth oxide layer)) and (the oxygen atom density of the oxide layer 224b (first oxide layer or third oxide layer))>(the oxygen atom density of the oxide layer 224c (second oxide layer or fourth oxide layer))>(the oxygen atom density of the electron transport layer 24e).

(8) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)>(the oxygen atom density of the oxide layer 24b (first oxide layer or third oxide layer))>(the oxygen atom density of the oxide layer 24c (second oxide layer or fourth oxide layer)) and (the oxygen atom density of the oxide layer 224b (first oxide layer or third oxide layer))>(the oxygen atom density of the oxide layer 224c (second oxide layer or fourth oxide layer))>(the oxygen atom density of the electron transport layer 24e).

Also, the light-emitting element according to the present disclosure may have any one of the following configurations (11), (12), (15), (17), (23), (26), and (27), as in the seventh embodiment. In this case, by suppressing one of the hole injection or the electron injection and increasing the other, unbalance between the hole injection and the electron injection is suppressed, and long-term reliability is improved. That is, the luminous efficiency after aging is enhanced.

Also, the light-emitting element according to the present disclosure may have any one of the following configurations (9), (10), (13), (14), (16), (18) to (22), (24), (25), and (28) to (35), as in the seventh embodiment. In this case, at any one of the interface between the hole transport layer 24a and the oxide layer 24b, the interface between the oxide layer 24b and the oxide layer 24c, the interface between the oxide layer 224b and the oxide layer 224c, and the interface between the oxide layer 224c and the electron transport layer 24e, by forming the electric dipole in the direction in which the injection barrier of the carrier increases, the amount of hole injection or the amount of electron injection to the light-emitting layer 24d can be more freely controlled. As a result, unbalance between hole injection and electron injection is easily suppressed, and long-term reliability is improved. That is, the luminous efficiency after aging is enhanced.

(9) The first electrode 22, the hole transport layer 24a, the oxide layer 24b (first oxide layer), the oxide layer 24c (second oxide layer), the light-emitting layer 24d, the electron transport layer 24e, and the second electrode 25 are provided in this order from the upper layer side or the lower layer side, the hole transport layer 24a is an oxide, and (the oxygen atom density of the hole transport layer 24a)<(the oxygen atom density of the oxide layer 24b (first oxide layer)), and (the oxygen atom density of the oxide layer 24*b* (first oxide layer)>(the oxygen atom density of the oxide layer 24*c* (second oxide layer)).

(10) The first electrode 22, the hole transport layer 24*a*, the light-emitting layer 24*d*, the oxide layer 224*b* (first oxide layer), the oxide layer 224*c* (second oxide layer), the electron transport layer 24*e*, and the second electrode 25 are provided in this order from the upper layer side or the lower layer side, the electron transport layer 24*e* is an oxide, and (the oxygen atom density of the oxide layer 224*b* (first oxide layer))>(the oxygen atom density of the oxide layer 224*c* (second oxide layer)), and (the oxygen atom density of the oxide layer 224*c* (second oxide layer))<(the oxygen atom density of the electron transport layer 24*e*).

(11) The first electrode 22, the hole transport layer 24*a*, the oxide layer 24*b* (first oxide layer), the oxide layer 24*c* (second oxide layer) the light-emitting layer 24*d*, the oxide layer 224*b* (third oxide layer), the oxide layer 224*c* (fourth oxide layer), the electron transport layer 24*e*, and the second electrode 25 are provided in this order from the upper layer side or the lower layer side, and (the oxygen atom density of the oxide layer 24*b* (first oxide layer))>(the oxygen atom density of the oxide layer 24*c* (second oxide layer)) and (the oxygen atom density of the oxide layer 224*b* (third oxide layer))<(the oxygen atom density of the oxide layer 224*c* (fourth oxide layer)).

(12) The first electrode 22, the hole transport layer 24*a*, the oxide layer 24*b* (third oxide layer), the oxide layer 24*c* (fourth oxide layer) the light-emitting layer 24*d*, the oxide layer 224*b* (first oxide layer), the oxide layer 224*c* (second oxide layer), the electron transport layer 24*e*, and the second electrode 25 are provided in this order from the upper layer side or the lower layer side, and (the oxygen atom density of the oxide layer 24*b* (third oxide layer))<(the oxygen atom density of the oxide layer 24*c* (fourth oxide layer)) and (the oxygen atom density of the oxide layer 224*b* (first oxide layer))>(the oxygen atom density of the oxide layer 224*c* (second oxide layer)).

(13) The first electrode 22, the hole transport layer 24*a*, the oxide layer 24*b* (first oxide layer or third oxide layer), the oxide layer 24*c* (second oxide layer or fourth oxide layer) the light-emitting layer 24*d*, the oxide layer 224*b* (first oxide layer or third oxide layer), the oxide layer 224*c* (second oxide layer or fourth oxide layer), the electron transport layer 24*e*, and the second electrode 25 are provided in this order from the upper layer side or the lower layer side, the hole transport layer 24*a* is an oxide, and (the oxygen atom density of the hole transport layer 24*a*)<(the oxygen atom density of the oxide layer 24*b* (first oxide layer or third oxide layer)), (the oxygen atom density of the oxide layer 24*b* (first oxide layer or third oxide layer))>(the oxygen atom density of the oxide layer 24*c* (second oxide layer or fourth oxide layer), and (the oxygen atom density of the oxide layer 224*b* (first oxide layer or third oxide layer))>(the oxygen atom density of the oxide layer 224*c* (second oxide layer or fourth oxide layer)).

(14) The first electrode 22, the hole transport layer 24*a*, the oxide layer 24*b* (first oxide layer or third oxide layer), the oxide layer 24*c* (second oxide layer or fourth oxide layer) the light-emitting layer 24*d*, the oxide layer 224*b* (first oxide layer or third oxide layer), the oxide layer 224*c* (second oxide layer or fourth oxide layer), the electron transport layer 24*e*, and the second electrode 25 are provided in this order from the upper layer side or the lower layer side, the electron transport layer 24*e* is an oxide, and (the oxygen atom density of the oxide layer 24*b* (first oxide layer or third oxide layer))>(the oxygen atom density of the oxide layer 24*c* (second oxide layer or fourth oxide layer)), (the oxygen atom density of the oxide layer 224*b* (first oxide layer or third oxide layer))>(the oxygen atom density of the oxide layer 224*c* (second oxide layer or fourth oxide layer)), and (the oxygen atom density of the oxide layer 224*c* (second oxide layer or fourth oxide layer)<(the oxygen atom density of the electron transport layer 24*e*).

(15) The first electrode 22, the hole transport layer 24*a*, the oxide layer 24*b* (first oxide layer), the oxide layer 24*c* (second oxide layer) the light-emitting layer 24*d*, the oxide layer 224*b* (third oxide layer), the oxide layer 224*c* (fourth oxide layer), the electron transport layer 24*e*, and the second electrode 25 are provided in this order from the upper layer side or the lower layer side, the hole transport layer 24*a* is an oxide, and (the oxygen atom density of the hole transport layer 24*a*)>(the oxygen atom density of the oxide layer 24*b* (first oxide layer), (the oxygen atom density of the oxide layer 24*b* (first oxide layer))>(the oxygen atom density of the oxide layer 24*c* (second oxide layer)) and (the oxygen atom density of the oxide layer 224*b* (third oxide layer))<(the oxygen atom density of the oxide layer 224*c* (fourth oxide layer)).

(16) The first electrode 22, the hole transport layer 24*a*, the oxide layer 24*b* (first oxide layer), the oxide layer 24*c* (second oxide layer) the light-emitting layer 24*d*, the oxide layer 224*b* (third oxide layer), the oxide layer 224*c* (fourth oxide layer), the electron transport layer 24*e*, and the second electrode 25 are provided in this order from the upper layer side or the lower layer side, the hole transport layer 24*a* is an oxide, and (the oxygen atom density of the hole transport layer 24*a*)<(the oxygen atom density of the oxide layer 24*b* (first oxide layer), (the oxygen atom density of the oxide layer 24*b* (first oxide layer))>(the oxygen atom density of the oxide layer 24*c* (second oxide layer)) and (the oxygen atom density of the oxide layer 224*b* (third oxide layer))<(the oxygen atom density of the oxide layer 224*c* (fourth oxide layer)).

(17) The first electrode 22, the hole transport layer 24*a*, the oxide layer 24*b* (third oxide layer), the oxide layer 24*c* (fourth oxide layer) the light-emitting layer 24*d*, the oxide layer 224*b* (first oxide layer), the oxide layer 224*c* (second oxide layer), the electron transport layer 24*e*, and the second electrode 25 are provided in this order from the upper layer side or the lower layer side, the electron transport layer 24*e* is an oxide, and (the oxygen atom density of the oxide layer 24*b* (third oxide layer))<(the oxygen atom density of the oxide layer 24*c* (fourth oxide layer), (the oxygen atom density of the oxide layer 224*b* (first oxide layer))>(the oxygen atom density of the oxide layer 224*c* (second oxide layer)), and (the oxygen atom density of the oxide layer 224*c* (second oxide layer))>(the oxygen atom density of the electron transport layer 24*e*).

(18) The first electrode 22, the hole transport layer 24*a*, the oxide layer 24*b* (third oxide layer), the oxide layer 24*c* (fourth oxide layer) the light-emitting layer 24*d*, the oxide layer 224*b* (first oxide layer), the oxide layer 224*c* (second oxide layer), the electron transport layer 24*e*, and the second electrode 25 are provided in this order from the upper layer side or the lower layer side, the electron transport layer 24e is an oxide, and (the oxygen atom density of the oxide layer 24b (third oxide layer))<(the oxygen atom density of the oxide layer 24c (fourth oxide layer), (the oxygen atom density of the oxide layer 224b (first oxide layer))>(the oxygen atom density of the oxide layer 224c (second oxide layer)), and (the oxygen atom density of the oxide layer 224c (second oxide layer))<(the oxygen atom density of the electron transport layer 24e).

(19) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)>(the oxygen atom density of the oxide layer 24b (first oxide layer or third oxide layer), (the oxygen atom density of the oxide layer 24b (first oxide layer or third oxide layer))>(the oxygen atom density of the oxide layer 24c (second oxide layer or fourth oxide layer)), (the oxygen atom density of the oxide layer 224b (first oxide layer or third oxide layer))>(the oxygen atom density of the oxide layer 224c (second oxide layer or fourth oxide layer)), and (the oxygen atom density of the oxide layer 224c (second oxide layer or fourth oxide layer)<(the oxygen atom density of the electron transport layer 24e).

(20) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)<(the oxygen atom density of the oxide layer 24b (first oxide layer or third oxide layer), (the oxygen atom density of the oxide layer 24b (first oxide layer or third oxide layer))>(the oxygen atom density of the oxide layer 24c (second oxide layer or fourth oxide layer)), (the oxygen atom density of the oxide layer 224b (first oxide layer or third oxide layer))>(the oxygen atom density of the oxide layer 224c (second oxide layer or fourth oxide layer)), and (the oxygen atom density of the oxide layer 224c (second oxide layer or fourth oxide layer)>(the oxygen atom density of the electron transport layer 24e).

(21) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)<(the oxygen atom density of the oxide layer 24b (first oxide layer or third oxide layer), (the oxygen atom density of the oxide layer 24b (first oxide layer or third oxide layer))>(the oxygen atom density of the oxide layer 24c (second oxide layer or fourth oxide layer)), (the oxygen atom density of the oxide layer 224b (first oxide layer or third oxide layer))>(the oxygen atom density of the oxide layer 224c (second oxide layer or fourth oxide layer)), and (the oxygen atom density of the oxide layer 224c (second oxide layer or fourth oxide layer)<(the oxygen atom density of the electron transport layer 24e).

(22) The first electrode 22, the hole transport layer 24a, the oxide layer 24b (first oxide layer), the oxide layer 24c (second oxide layer) the light-emitting layer 24d, the oxide layer 224b (third oxide layer), the oxide layer 224c (fourth oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)>(the oxygen atom density of the oxide layer 24b (first oxide layer), (the oxygen atom density of the oxide layer 24b (first oxide layer))>(the oxygen atom density of the oxide layer 24c (second oxide layer)), (the oxygen atom density of the oxide layer 224b (third oxide layer)<(the oxygen atom density of the oxide layer 224c (fourth oxide layer), and (the oxygen atom density of the oxide layer 224c (fourth oxide layer))>(the oxygen atom density of the electron transport layer 24e).

(23) The first electrode 22, the hole transport layer 24a, the oxide layer 24b (first oxide layer), the oxide layer 24c (second oxide layer) the light-emitting layer 24d, the oxide layer 224b (third oxide layer), the oxide layer 224c (fourth oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)>(the oxygen atom density of the oxide layer 24b (first oxide layer), (the oxygen atom density of the oxide layer 24b (first oxide layer))>(the oxygen atom density of the oxide layer 24c (second oxide layer)), (the oxygen atom density of the oxide layer 224b (third oxide layer)<(the oxygen atom density of the oxide layer 224c (fourth oxide layer), and (the oxygen atom density of the oxide layer 224c (fourth oxide layer))<(the oxygen atom density of the electron transport layer 24e).

(24) The first electrode 22, the hole transport layer 24a, the oxide layer 24b (first oxide layer), the oxide layer 24c (second oxide layer) the light-emitting layer 24d, the oxide layer 224b (third oxide layer), the oxide layer 224c (fourth oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)<(the oxygen atom density of the oxide layer 24b (first oxide layer), (the oxygen atom density of the oxide layer 24b (first oxide layer))>(the oxygen atom density of the oxide layer 24c (second oxide layer)), (the oxygen atom density of the oxide layer 224b (third oxide layer)<(the oxygen atom density of the oxide layer 224c (fourth oxide layer), and (the oxygen atom density of the oxide layer 224c (fourth oxide layer))>(the oxygen atom density of the electron transport layer 24e).

(25) The first electrode 22, the hole transport layer 24a, the oxide layer 24b (third oxide layer), the oxide layer 24c (fourth oxide layer) the light-emitting layer 24d, the oxide layer 224b (first oxide layer), the oxide layer 224c (second oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)>(the oxygen atom density of the oxide layer 24b (third oxide layer), (the oxygen atom density of the oxide layer 24b (third oxide layer))<(the oxygen atom density of the oxide layer 24c (fourth oxide layer)), (the oxygen atom density of the oxide layer 224b (first oxide layer)>(the oxygen atom density of the oxide layer 224c (second oxide layer), and (the oxygen atom density of the oxide layer 224c (second oxide layer))>(the oxygen atom density of the electron transport layer 24e).

(26) The first electrode 22, the hole transport layer 24a, the oxide layer 24b (third oxide layer), the oxide layer 24c (fourth oxide layer) the light-emitting layer 24d, the oxide layer 224b (first oxide layer), the oxide layer 224c (second oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)<(the oxygen atom density of the oxide layer 24b (third oxide layer), (the oxygen atom density of the oxide layer 24b (third oxide layer))<(the oxygen atom density of the oxide layer 24c (fourth oxide layer)), (the oxygen atom density of the oxide layer 224b (first oxide layer)>(the oxygen atom density of the oxide layer 224c (second oxide layer), and (the oxygen atom density of the oxide layer 224c (second oxide layer))<(the oxygen atom density of the electron transport layer 24e).

(27) The first electrode 22, the hole transport layer 24a, the oxide layer 24b (third oxide layer), the oxide layer 24c (fourth oxide layer) the light-emitting layer 24d, the oxide layer 224b (first oxide layer), the oxide layer 224c (second oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)<(the oxygen atom density of the oxide layer 24b (third oxide layer), (the oxygen atom density of the oxide layer 24b (third oxide layer))<(the oxygen atom density of the oxide layer 24c (fourth oxide layer)), (the oxygen atom density of the oxide layer 224b (first oxide layer)>(the oxygen atom density of the oxide layer 224c (second oxide layer), and (the oxygen atom density of the oxide layer 224c (second oxide layer))>(the oxygen atom density of the electron transport layer 24e).

(28) The first electrode 22, the hole transport layer 24a, the oxide layer 24b (third oxide layer), the oxide layer 24c (fourth oxide layer) the light-emitting layer 24d, the oxide layer 224b (first oxide layer), the oxide layer 224c (second oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)>(the oxygen atom density of the oxide layer 24b (third oxide layer), (the oxygen atom density of the oxide layer 24b (third oxide layer))<(the oxygen atom density of the oxide layer 24c (fourth oxide layer)), (the oxygen atom density of the oxide layer 224b (first oxide layer)>(the oxygen atom density of the oxide layer 224c (second oxide layer), and (the oxygen atom density of the oxide layer 224c (second oxide layer))<(the oxygen atom density of the electron transport layer 24e).

Also, the light-emitting element according to the present disclosure may have any one of the following configurations (29) to (34), as in the seventh embodiment. In this case, at least one of the electric dipole 1, 1', 31 or 41 may have a dipole moment with a component in the same orientation as in the first to sixth embodiments. This allows an unbalance between hole injection and electron injection to be suppressed and reliability to be improved.

(29) The first electrode 22, the hole transport layer 24a, the oxide layer 24b (first oxide layer), the oxide layer 24c (second oxide layer), the light-emitting layer 24d, the electron transport layer 24e, and the second electrode 25 are provided in this order from the upper layer side or the lower layer side, the hole transport layer 24a is an oxide, and (the oxygen atom density of the hole transport layer 24a)<(the oxygen atom density of the oxide layer 24b (first oxide layer)), and (the oxygen atom density of the oxide layer 24b (first oxide layer)>(the oxygen atom density of the oxide layer 24c (second oxide layer)).

(30) The first electrode 22, the hole transport layer 24a, the light-emitting layer 24d, the oxide layer 224b (first oxide layer), the oxide layer 224c (second oxide layer), the electron transport layer 24e, and the second electrode 25 are provided in this order from the upper layer side or the lower layer side, the electron transport layer 24e is an oxide, and (the oxygen atom density of the oxide layer 224b (first oxide layer))<(the oxygen atom density of the oxide layer 224c (second oxide layer)), and (the oxygen atom density of the oxide layer 224c (second oxide layer))>(the oxygen atom density of the electron transport layer 24e).

(31) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the hole transport layer 24a is an oxide, and (the oxygen atom density of the hole transport layer 24a)>(the oxygen atom density of the oxide layer 24b (first oxide layer or third oxide layer)), (the oxygen atom density of the oxide layer 24b (first oxide layer or third oxide layer))<(the oxygen atom density of the oxide layer 24c (second oxide layer or fourth oxide layer), and (the oxygen atom density of the oxide layer 224b (first oxide layer or third oxide layer))<(the oxygen atom density of the oxide layer 224c (second oxide layer or fourth oxide layer)).

(32) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the electron transport layer 24e is an oxide, and (the oxygen atom density of the oxide layer 24b (first oxide layer or third oxide layer))<(the oxygen atom density of the oxide layer 24c (second oxide layer or fourth oxide layer)), (the oxygen atom density of the oxide layer 224b (first oxide layer or third oxide layer))<(the oxygen atom density of the oxide layer 224c (second oxide layer or fourth oxide layer)), and (the oxygen atom density of the oxide layer 224c (second oxide layer or fourth oxide layer)>(the oxygen atom density of the electron transport layer 24e).

(33) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)>(the oxygen atom density of the oxide layer 24b (first oxide layer or third oxide layer), (the oxygen atom density of the oxide layer 24b (first oxide layer or third oxide layer))<(the oxygen atom density of the oxide layer 24c (second oxide layer or fourth oxide layer)), (the oxygen atom density of the oxide layer 224b (first oxide layer or third oxide layer))<(the oxygen atom density of the oxide layer 224c (second oxide layer or fourth oxide layer)), and (the oxygen atom density of the oxide layer 224c (second oxide layer or fourth oxide layer)<(the oxygen atom density of the electron transport layer 24e).

(34) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)<(the oxygen atom density of the oxide layer 24b (first oxide layer or third oxide layer), (the oxygen atom density of the oxide layer 24b (first oxide layer or third oxide layer))<(the oxygen atom density of the oxide layer 24c (second oxide layer or fourth oxide layer)), (the oxygen atom density of the oxide layer 224b (first oxide layer or third oxide layer))<(the oxygen atom density of the oxide layer 224c (second oxide layer or fourth oxide layer)), and (the oxygen atom density of the oxide layer 224c (second oxide layer or fourth oxide layer)>(the oxygen atom density of the electron transport layer 24e).

(35) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer), the oxide layer 224c (second oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)>(the oxygen atom density of the oxide layer 24b (third oxide layer), (the oxygen atom density of the oxide layer 24b (third oxide layer))<(the oxygen atom density of the oxide layer 24c (fourth oxide layer)), (the oxygen atom density of the oxide layer 224b (first oxide layer)<(the oxygen atom density of the oxide layer 224c (second oxide layer), and (the oxygen atom density of the oxide layer 224c (second oxide layer))>(the oxygen atom density of the electron transport layer 24e).

Note that the light-emitting element according to the present disclosure is not limited to the configurations described above and may have any one of the configurations of (36) to (41) described below, for example. In this case, at any one of the interface between the hole transport layer 24a and the oxide layer 24b, the interface between the oxide layer 24b and the oxide layer 24c, the interface between the oxide layer 224b and the oxide layer 224c, and the interface between the oxide layer 224c and the electron transport layer 24e, by forming the electric dipole in the direction in which the injection barrier of the carrier increases, excessive hole injection or electron injection to the light-emitting layer 24d can be suppressed, and unbalance between the amount of hole injection or the amount of electron injection to the light-emitting layer 24d can be suppressed. As a result, the element service life of the light-emitting element is improved. In other words, a reduction in the luminous efficiency due to aging is suppressed. Also, by suppressing hole injection or electron injection to the light-emitting layer 24d, the light emission voltage increases, which makes it possible to control the light emission voltage.

(36) The first electrode 22, the hole transport layer 24a, the oxide layer 24b (first oxide layer), the oxide layer 24c (second oxide layer), the light-emitting layer 24d, the electron transport layer 24e, and the second electrode 25 are provided in this order from the upper layer side or the lower layer side, and (the oxygen atom density of the oxide layer 24b (first oxide layer))<(the oxygen atom density of the oxide layer 24c (second oxide layer)).

(37) The first electrode 22, the hole transport layer 24a, the light-emitting layer 24d, the oxide layer 224b (first oxide layer), the oxide layer 224c (second oxide layer), the electron transport layer 24e, and the second electrode 25 are provided in this order from the upper layer side or the lower layer side, and (the oxygen atom density of the oxide layer 224b (first oxide layer))<(the oxygen atom density of the oxide layer 224c (second oxide layer)).

(38) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, and (the oxygen atom density of the oxide layer 24b (first oxide layer or third oxide layer))<(the oxygen atom density of the oxide layer 24c (second oxide layer or fourth oxide layer)) and (the oxygen atom density of the oxide layer 224b (first oxide layer or third oxide layer))<(the oxygen atom density of the oxide layer 224c (second oxide layer or fourth oxide layer)).

(39) The first electrode 22, the hole transport layer 24a, the oxide layer 24b (first oxide layer), the oxide layer 24c (second oxide layer), the light-emitting layer 24d, the electron transport layer 24e, and the second electrode 25 are provided in this order from the upper layer side or the lower layer side, the hole transport layer 24a is an oxide, and (the oxygen atom density of the hole transport layer 24a)<(the oxygen atom density of the oxide layer 24b (first oxide layer)), and (the oxygen atom density of the oxide layer 24b (first oxide layer)<(the oxygen atom density of the oxide layer 24c (second oxide layer)).

(40) (4) The first electrode 22, the hole transport layer 24a, the light-emitting layer 24d, the oxide layer 224b (first oxide layer), the oxide layer 224c (second oxide layer), the electron transport layer 24e, and the second electrode 25 are provided in this order from the upper layer side or the lower layer side, the electron transport layer 24e is an oxide, and (the oxygen atom density of the oxide layer 224b (first oxide layer))<(the oxygen atom density of the oxide layer 224c (second oxide layer)), and (the oxygen atom density of the oxide layer 224c (second oxide layer))<(the oxygen atom density of the electron transport layer 24e).

(41) The first electrode 22, the hole transport layer 24a, the oxide layer 24b (first oxide layer or third oxide layer), the oxide layer 24c (second oxide layer or fourth oxide layer) the light-emitting layer 24d, the oxide layer 224b (first oxide layer or third oxide layer), the oxide layer 224c (second oxide layer or fourth oxide layer), the electron transport layer 24e, and the second electrode 25 are provided in this order from the upper layer side or the lower layer side, the hole transport layer 24a and the electron transport layer 24e are each an oxide, and (the oxygen atom density of the hole transport layer 24a)<(the oxygen atom density of the oxide layer 24b (first oxide layer or third oxide layer), (the oxygen atom density of the oxide layer 24b (first oxide layer or third oxide layer))<(the oxygen atom density of the oxide layer 24c (second oxide layer or fourth oxide layer)), (the oxygen atom density of the oxide layer 224b (first oxide layer or third oxide layer))<(the oxygen atom density of the oxide layer 224c (second oxide layer or fourth oxide layer)), and (the oxygen atom density of the oxide layer 224c (second oxide layer or fourth oxide layer)<(the oxygen atom density of the electron transport layer 24e).

Note that the oxygen atom density of the oxide layers in the present disclosure is a unique value for the oxide layers and applies to the oxygen atom bulk density of the material forming the oxide layers. For example, for the oxides listed in FIGS. 5, 10, and 18, the oxygen atom densities listed in FIGS. 5, 10, and 18 are applied. The oxygen atom density of a composite oxide can be determined by, for the oxygen atom density of the composite oxide, finding the weighted average by finding the sum of: multiplying the oxygen atom density of the oxide of each cation alone by the composition ratio of each cation to the total cation contained in the composite oxide.

The oxygen atom density MDi of the composite oxide is represented below (Formula A), where, in a composite oxide containing N types of cations Ai (i=1, 2, 3, . . . , N), the oxygen atom density of the oxide containing only the cation Ai as the cation (that is, the oxygen atom density of the oxide of the cation Ai alone) is Di and the ratio of the number density of the cation Ai to the total of the number densities of all cations (that is, the composition ratio of the cation Ai with respect to all cations contained in the composite oxide) is Xi. However, the sum of Xi (i=1, 2, 3, . . . , N) is 1 as shown in Formula B below.

[Expression 1]

$$MDi = \sum_{i=1}^{N} Xi \cdot Di \quad \text{(Formula A)}$$

[Expression 2]

$$\sum_{i=1}^{N} Xi = 1 \quad \text{(Formula B)}$$

Supplement

A light-emitting element according to a first aspect of the present disclosure includes: an anode, a hole transport layer, a light-emitting layer, an electron transport layer, and a cathode in this order; and a first oxide layer and a second oxide layer that is in contact with the first oxide layer disposed in this order from a side closer to the anode between the hole transport layer and the light-emitting layer or between the light-emitting layer and the electron transport layer, wherein an oxygen atom density of the second oxide layer is different from an oxygen atom density of the first oxide layer.

The light-emitting element according to a second aspect of the present disclosure has the configuration of the first aspect, wherein the oxygen atom density of the second oxide layer may be less than the oxygen atom density of the first oxide layer.

In other words, a light-emitting element according to a second aspect of the present disclosure includes: an anode, a hole transport layer, a light-emitting layer, an electron transport layer, and a cathode in this order; and a first oxide layer and a second oxide layer that is in contact with the first oxide layer disposed in this order from a side closer to the anode between the hole transport layer and the light-emitting layer or between the light-emitting layer and the electron transport layer, wherein an oxygen atom density of the second oxide layer may be less than an oxygen atom density of the first oxide layer.

The light-emitting element according to a third aspect of the present disclosure has the configuration of the second aspect, wherein the density of oxygen atoms in the second oxide layer may be from 50% to 95% of the density of oxygen atoms in the first oxide layer.

The light-emitting element according to a fourth aspect of the present disclosure has the configuration of the third aspect, wherein the density of oxygen atoms in the second oxide layer may be from 50% to 90% of the density of oxygen atoms in the first oxide layer.

The light-emitting element according to a fifth aspect of the present disclosure has the configuration of the first aspect, wherein the oxygen atom density of the first oxide layer may be less than the oxygen atom density of the second oxide layer.

In other words, a light-emitting element according to a fifth aspect of the present disclosure includes: an anode, a hole transport layer, a light-emitting layer, an electron transport layer, and a cathode in this order; and a first oxide layer and a second oxide layer that is in contact with the first oxide layer disposed in this order from a side closer to the anode between the hole transport layer and the light-emitting layer or between the light-emitting layer and the electron transport layer, wherein an oxygen atom density of the first oxide layer may be less than an oxygen atom density of the second oxide layer.

The light-emitting element according to a sixth aspect of the present disclosure has the configuration of the fifth aspect, wherein the density of oxygen atoms in the first oxide layer may be from 50% to 95% of the density of oxygen atoms in the second oxide layer.

The light-emitting element according to a seventh aspect of the present disclosure has the configuration of the sixth aspect, wherein the density of oxygen atoms in the first oxide layer may be from 50% to 90% of the density of oxygen atoms in the second oxide layer.

The light-emitting element according to an eighth aspect of the present disclosure has the configuration of any one of the first to seventh aspects, wherein an electric dipole may be formed at an interface between the first oxide layer and the second oxide layer.

The light-emitting element according to the ninth aspect of the present disclosure has the configuration of any one of the second to fourth aspects, wherein an electric dipole may be formed at an interface between the first oxide layer and the second oxide layer; and the electric dipole may have a dipole moment including a component orientated from the second oxide layer toward the first oxide layer.

The light-emitting element according to the tenth aspect of the present disclosure has the configuration of any one of the fifth to seventh aspects, wherein an electric dipole may be formed at an interface between the first oxide layer and the second oxide layer; and the electric dipole may have a dipole moment including a component orientated from the first oxide layer toward the second oxide layer.

The light-emitting element according to an eleventh aspect of the present disclosure has the configuration of any one of the first to tenth aspects, wherein the first oxide layer may be formed of an inorganic oxide.

The light-emitting element according to a twelfth aspect of the present disclosure has the configuration of any one of the first to eleventh aspects, wherein the second oxide layer may be formed of an inorganic oxide.

The light-emitting element according to a thirteenth aspect of the present disclosure has the configuration of any one of the first to twelfth aspects, wherein the first oxide layer may be formed of an insulator.

The light-emitting element according to a fourteenth aspect of the present disclosure has the configuration of any one of the first to thirteenth aspects, wherein the second oxide layer may be formed of an insulator.

The light-emitting element according to a fifteenth aspect of the present disclosure has the configuration of any one of the first to fourteenth aspects, wherein the first oxide layer and the second oxide layer may be formed of an amorphous oxide.

The light-emitting element according to a sixteenth aspect of the present disclosure has the configuration of any one of the first to fourteenth aspects, wherein the first oxide layer may be formed of an amorphous oxide.

The light-emitting element according to a seventeenth aspect of the present disclosure has the configuration of any one of the first to fourteenth aspects, wherein the second oxide layer may be formed of an amorphous oxide.

The light-emitting element according to an eighteenth aspect of the present disclosure has the configuration of any one of the first to fourteenth aspects, wherein at least at a contact surface between the first oxide layer and the second oxide layer, at least one of the first oxide layer or the second oxide layer may include grains.

The light-emitting element according to a nineteenth aspect of the present disclosure has the configuration of any one of the first to fourteenth aspects, wherein at least at a contact surface between the first oxide layer and the second oxide layer, at least one of the first oxide layer or the second oxide layer may include a polycrystalline oxide.

A light-emitting element according to a twentieth aspect of the present disclosure has the configuration of the eighteenth or nineteenth aspect, wherein the anode may be disposed below the cathode, and the first oxide layer and the second oxide layer may be layered in this order from a lower layer side. For example, the light-emitting element according to a twentieth aspect of the present disclosure has the configuration of the eighteenth or nineteenth aspect and further includes a substrate, wherein the anode may be disposed on the substrate side of the cathode, and the first oxide layer and the second oxide layer may be layered in this order from the substrate side.

The light-emitting element according to a twenty-first aspect of the present disclosure has the configuration of any one of the eighteenth to twentieth aspects, wherein of the first oxide layer and the second oxide layer, the layer on the upper layer side may be formed of an amorphous oxide.

The light-emitting element according to a twenty-second aspect of the present disclosure has the configuration of any one of the eighteenth to twenty-first aspects, wherein of the first oxide layer and the second oxide layer, the layer on the upper layer side may be formed of a continuous film.

The light-emitting element according to a twenty-third aspect of the present disclosure has the configuration of any one of the eighteenth to twenty-first aspects, wherein of the first oxide layer and the second oxide layer, the layer on the upper layer side has a porosity of less than 1%.

The light-emitting element according to a twenty-fourth aspect of the present disclosure has the configuration of any one of the first to fourteenth aspects, wherein at least a contact surface of the second oxide layer with the first oxide layer may include grains.

The light-emitting element according to a twenty-fifth aspect of the present disclosure has the configuration of any one of the first to fourteenth aspects, wherein at least a contact surface of the second oxide layer with the first oxide layer may include a polycrystalline oxide.

A light-emitting element according to a twenty-sixth aspect of the present disclosure has the configuration of the twenty-fourth or twenty-fifth aspect, wherein the cathode may be disposed below the anode, and the second oxide layer and the first oxide layer may be layered in this order from a lower layer side. For example, the light-emitting element according to a twenty-sixth aspect of the present disclosure has the configuration of the twenty-fourth or twenty-fifth aspect and further includes a substrate, wherein the cathode may be disposed on the substrate side of the anode, and the second oxide layer and the first oxide layer may be layered in this order from the substrate side.

The light-emitting element according to a twenty-seventh aspect of the present disclosure has the configuration of the twenty-sixth aspect, wherein the first oxide layer may be formed of an amorphous oxide.

The light-emitting element according to a twenty-eighth aspect of the present disclosure has the configuration of the twenty-sixth or twenty-seventh aspect, wherein the first oxide layer may be formed of a continuous film.

The light-emitting element according to a twenty-ninth aspect of the present disclosure has the configuration of the twenty-sixth or twenty-seventh aspect, wherein the first oxide layer may have a porosity of less than 1%.

The light-emitting element according to a thirtieth aspect of the present disclosure has the configuration of any one of the first to twenty-ninth aspects, wherein the first oxide layer may be formed of an oxide in which a most abundant element other than oxygen is any one of Al, Ga, Ta, Zr, Hf, Mg, Ge, Si, Y, La, or Sr.

The light-emitting element according to a thirty-first aspect of the present disclosure has the configuration of any one of the first to twenty-ninth aspects, wherein the first oxide layer or the second oxide layer may be formed of an oxide in which a most abundant element other than oxygen is any one of Al, Ga, Ta, Zr, Hf, Mg, Ge, Si, Y, La, or Sr.

The light-emitting element according to a thirty-second aspect of the present disclosure has the configuration of any one of the first to twenty-ninth aspects, wherein the first oxide layer may be formed of an oxide in which a most abundant element other than oxygen is any one of Al, Ga, Ta, Zr, Hf, Mg, Ge, Si, Y, La, or Sr.

The light-emitting element according to a thirty-third aspect of the present disclosure has the configuration of any one of the first to twenty-ninth aspects, wherein the first oxide layer may include at least one of aluminum oxide, gallium oxide, tantalum oxide, zirconium oxide, hafnium oxide, magnesium oxide, germanium oxide, silicon oxide, yttrium oxide, lanthanum oxide, strontium oxide, or a composite oxide containing two or more types of cations of these oxides.

The light-emitting element according to a thirty-fourth aspect of the present disclosure has the configuration of any one of the first to twenty-ninth aspects, wherein the first oxide layer may include any one of one of aluminum oxide, gallium oxide, tantalum oxide, zirconium oxide, hafnium oxide, magnesium oxide, germanium oxide, silicon oxide, yttrium oxide, lanthanum oxide, strontium oxide, or a composite oxide containing two or more types of cations of these oxides.

The light-emitting element according to a thirty-fifth aspect of the present disclosure has the configuration of any one of the first to thirty-fourth aspects, wherein the second oxide layer may be formed of an oxide in which a most abundant element other than oxygen is any one of Al, Ga, Ta, Zr, Hf, Mg, Ge, Si, Y, La, or Sr.

The light-emitting element according to a thirty-sixth aspect of the present disclosure has the configuration of any one of the first to thirty-fourth aspects, wherein the second oxide layer may be formed of an oxide in which a most abundant element other than oxygen is any one of Al, Ga, Ta, Zr, Hf, Mg, Ge, Si, Y, La, or Sr.

The light-emitting element according to a thirty-seventh aspect of the present disclosure has the configuration of any one of the first to thirty-fourth aspects, wherein the second oxide layer may include at least one of aluminum oxide, gallium oxide, tantalum oxide, zirconium oxide, hafnium oxide, magnesium oxide, germanium oxide, silicon oxide, yttrium oxide, lanthanum oxide, strontium oxide, or a composite oxide containing two or more types of cations of these oxides.

The light-emitting element according to a thirty-eighth aspect of the present disclosure has the configuration of any one of the first to thirty-fourth aspects, wherein the second oxide layer may include any one of one of aluminum oxide, gallium oxide, tantalum oxide, zirconium oxide, hafnium oxide, magnesium oxide, germanium oxide, silicon oxide, yttrium oxide, lanthanum oxide, strontium oxide, or a composite oxide containing two or more types of cations of these oxides.

The light-emitting element according to a thirty-ninth aspect of the present disclosure has the configuration of any one of the first to thirty-eighth aspects, wherein the first oxide layer and the second oxide layer may include a common cation.

The light-emitting element according to a fortieth aspect of the present disclosure has the configuration of any one of the first to thirty-ninth aspects, wherein a film thickness of the first oxide layer may be from 0.2 nm to 5 nm.

The light-emitting element according to a forty-first aspect of the present disclosure has the configuration of the fortieth aspect, wherein a film thickness of the first oxide layer may be from 0.8 nm to less than 3 nm.

The light-emitting element according to a forty-second aspect of the present disclosure has the configuration of any one of the first to forty-first aspects, wherein a film thickness of the second oxide layer may be from 0.2 nm to 5 nm.

The light-emitting element according to a forty-third aspect of the present disclosure has the configuration of the forty-second aspect, wherein a film thickness of the second oxide layer may be from 0.8 nm to less than 3 nm.

The light-emitting element according to a forty-fourth aspect of the present disclosure has the configuration of any one of the first to thirty-eighth aspects, wherein a total film thickness of the first oxide layer and the second oxide layer may be from 0.4 nm to less than 5 nm.

The light-emitting element according to a forty-fifth aspect of the present disclosure has the configuration of any one of the first to forty-fourth aspects, wherein a total film thickness of the first oxide layer and the second oxide layer may be from 1.6 nm to less than 4 nm.

The light-emitting element according a forty-sixth aspect of the present disclosure has the configuration of any one of the first to forty-fifth aspects, wherein the hole transport layer, the first oxide layer, and the second oxide layer are disposed between the anode and the light-emitting layer in this order from the anode side.

The light-emitting element according to a forty-seventh aspect of the present disclosure has the configuration of the forty-sixth aspect, wherein a hole density in the first oxide layer and a hole density in the second oxide layer may be less than a hole density in the hole transport layer.

The light-emitting element according to a forty-eighth aspect of the present disclosure has the configuration of the forty-sixth or forty-seventh aspect, wherein an ionization potential of the hole transport layer may be less than an ionization potential of the light-emitting layer, and the ionization potential of the light-emitting layer may be less than an ionization potential of the first oxide layer and the second oxide layer.

The light-emitting element according to a forty-ninth aspect of the present disclosure has the configuration of the forty-eighth aspect, wherein an ionization potential of the first oxide layer and an ionization potential of the second oxide layer may be equal.

The light-emitting element according to a fiftieth aspect of the present disclosure has the configuration of any one of the forty-sixth to forty-eighth aspects, wherein the hole transport layer, the light-emitting layer, the second oxide layer, and the first oxide layer may be smaller in terms of ionization potential in this order.

The light-emitting element according to a fifty-first aspect of the present disclosure has the configuration of any one of the forty-sixth to forty-eighth aspects, wherein the hole transport layer, the light-emitting layer, the first oxide layer, and the second oxide layer may be smaller in terms of ionization potential in this order.

The light-emitting element according to a fifty-second aspect of the present disclosure has the configuration of any one of the forty-sixth to fifty-first aspects, wherein the hole transport layer may be formed of an oxide.

The light-emitting element according to a fifty-third aspect of the present disclosure has the configuration of the fifty-second aspect, wherein the hole transport layer is in contact with the first oxide layer, and at least at a contact surface between the hole transport layer and the first oxide layer, at least one of the hole transport layer or the first oxide layer may include grains.

The light-emitting element according to a fifty-fourth aspect of the present disclosure has the configuration of the fifty-second aspect, wherein the hole transport layer is in contact with the first oxide layer, and at least at a contact surface between the hole transport layer and the first oxide layer, at least one of the hole transport layer or the first oxide layer may include a polycrystalline oxide.

The light-emitting element according to a fifty-fifth aspect of the present disclosure has the configuration of the fifty-second aspect, wherein the hole transport layer is in contact with the first oxide layer, and at least a contact surface of the first oxide layer with the hole transport layer may include grains.

The light-emitting element according to a fifty-sixth aspect of the present disclosure has the configuration of the fifty-second aspect, wherein the hole transport layer is in contact with the first oxide layer, and at least a contact surface of the first oxide layer with the hole transport layer may include a polycrystalline oxide.

The light-emitting element according to a fifty-seventh aspect of the present disclosure has the configuration of any one of the fifty-second to fifty-sixth aspects, wherein the hole transport layer is in contact with the first oxide layer, and the density of oxygen atoms in the first oxide layer may be different from the density of oxygen atoms in the hole transport layer.

The light-emitting element according to a fifty-eighth aspect of the present disclosure has the configuration of any one of the fifty-second to fifty-seventh aspects, wherein the hole transport layer is in contact with the first oxide layer, and the density of oxygen atoms in the first oxide layer may be less than the density of oxygen atoms in the hole transport layer.

The light-emitting element according to a fifty-ninth aspect of the present disclosure has the configuration of the fifty-eighth aspect, wherein the oxygen atom density in the first oxide layer may be from 50% to 95% of the oxygen atom density in the hole transport layer.

The light-emitting element according to a sixtieth aspect of the present disclosure has the configuration of the fifty-ninth aspect, wherein the oxygen atom density in the first oxide layer may be from 50% to 90% of the oxygen atom density in the hole transport layer.

The light-emitting element according to a sixty-first aspect of the present disclosure has the configuration of any one of the first to forty-fifth aspects, wherein, in a case where the first oxide layer and the second oxide layer are provided between the hole transport layer and the light-emitting layer, the hole transport layer and the first oxide layer may be in contact; in a case where the first oxide layer and the second oxide layer are provided between the light-emitting layer and the electron transport layer, the second oxide layer and the electron transport layer may be in contact; in a case where the hole transport layer and the first oxide layer are in contact, at least at a contact surface between the hole transport layer and the first oxide layer, at least one of the hole transport layer or the first oxide layer may include grains; and in a case where the electron transport layer and the second oxide layer are in contact, at least at a contact surface between the electron transport layer and the second oxide layer, at least one of the electron transport layer or the second oxide layer may include grains.

The light-emitting element according to a sixty-second aspect of the present disclosure has the configuration of any one of the first to forty-fifth aspects, wherein, in a case where the first oxide layer and the second oxide layer are provided between the hole transport layer and the light-emitting layer, the hole transport layer and the first oxide layer may be in contact; in a case where the first oxide layer and the second oxide layer are provided between the light-emitting layer and the electron transport layer, the second oxide layer and the electron transport layer may be in contact; in a case where the hole transport layer and the first oxide layer are in contact, at least at a contact surface between the hole transport layer and the first oxide layer, at least one of the hole transport layer or the first oxide layer may include a polycrystalline oxide; and in a case where the electron transport layer and the second oxide layer are in contact, at least at a contact surface between the electron transport layer and the second oxide layer, at least one of the electron transport layer or the second oxide layer may include a polycrystalline oxide.

The light-emitting element according to a sixty-third aspect of the present disclosure has the configuration of any one of the fifty-second to fifty-seventh aspects, wherein the hole transport layer is in contact with the first oxide layer, and the density of oxygen atoms in the hole transport layer may be less than the density of oxygen atoms in the first oxide layer.

The light-emitting element according to a sixty-fourth aspect of the present disclosure has the configuration of any one of the fifty-second to fifty-seventh aspects, wherein the hole transport layer is in contact with the first oxide layer, and the density of oxygen atoms in the first oxide layer may be greater than the density of oxygen atoms in the hole transport layer.

The light-emitting element according to a sixty-fifth aspect of the present disclosure has the configuration of the sixty-fourth aspect, wherein the density of oxygen atoms in the hole transport layer may be from 50% to 95% of the density of oxygen atoms in the first oxide layer.

The light-emitting element according to a sixty-sixth aspect of the present disclosure has the configuration of the sixty-fifth aspect, wherein the density of oxygen atoms in the hole transport layer may be from 50% to 90% of the density of oxygen atoms in the first oxide layer.

The light-emitting element according a sixty-seventh aspect of the present disclosure has the configuration of any one of the first to forty-fifth aspects, wherein the first oxide layer, the second oxide layer, and the electron transport layer are disposed between the light-emitting layer and the cathode in this order from the anode side.

The light-emitting element according to a sixty-eighth aspect of the present disclosure has the configuration of the sixty-seventh aspect, wherein an electron density of the first oxide layer and an electron density of the second oxide layer may be less than an electron density of the electron transport layer.

The light-emitting element according to a sixty-ninth aspect of the present disclosure has the configuration of the sixty-seventh or sixty-eighth aspects, wherein an electron affinity of the electron transport layer may be greater than an electron affinity of the light-emitting layer, and the electron affinity of the light-emitting layer may be greater than an electron affinity of the first oxide layer and the second oxide layer.

The light-emitting element according to a seventieth aspect of the present disclosure has the configuration of the sixty-ninth aspect, wherein an electron affinity of the first oxide layer and an electron affinity of the second oxide layer may be equal.

The light-emitting element according to a seventy-first aspect of the present disclosure has the configuration of any one of the sixty-seventh to sixty-ninth aspects, wherein the electron transport layer, the light-emitting layer, the second oxide layer, and the first oxide layer may be greater in terms of electron affinity in this order.

The light-emitting element according to a seventy-second aspect of the present disclosure has the configuration of any one of the sixty-seventh to sixty-ninth aspects, wherein the electron transport layer, the light-emitting layer, the first oxide layer, and the second oxide layer may be greater in terms of electron affinity in this order.

The light-emitting element according to a seventy-third aspect of the present disclosure has the configuration of any one of the sixty-seventh to seventy-second aspects, wherein the electron transport layer may be formed of an oxide.

The light-emitting element according to a seventy-fourth aspect of the present disclosure has the configuration of the seventy-third aspect, wherein the electron transport layer is in contact with the second oxide layer, and at least at a contact surface between the electron transport layer and the second oxide layer, at least one of the electron transport layer or the second oxide layer may include grains.

The light-emitting element according to a seventy-fifth aspect of the present disclosure has the configuration of the seventy-third aspect, wherein the electron transport layer is in contact with the second oxide layer, and at least at a contact surface between the electron transport layer and the second oxide layer, at least one of the electron transport layer or the second oxide layer may include a polycrystalline oxide.

The light-emitting element according to a seventy-sixth aspect of the present disclosure has the configuration of the seventy-third aspect, wherein the electron transport layer is in contact with the second oxide layer, and at least a contact surface of the second oxide layer with the electron transport layer may include grains.

The light-emitting element according to a seventy-seventh aspect of the present disclosure has the configuration of the seventy-third aspect, wherein the electron transport layer is in contact with the second oxide layer, and at least a contact surface of the second oxide layer with the electron transport layer may include a polycrystalline oxide.

The light-emitting element according to a seventy-eighth aspect of the present disclosure has the configuration of any one of the seventy-third to seventy-seventh aspects, wherein the electron transport layer is in contact with the second oxide layer, and the density of oxygen atoms in the second oxide layer may be different from the density of oxygen atoms in the electron transport layer.

The light-emitting element according to a seventy-ninth aspect of the present disclosure has the configuration of any one of the seventy-third to seventy-eighth aspects, wherein the electron transport layer is in contact with the second oxide layer, and the density of oxygen atoms in the second oxide layer may be less than the density of oxygen atoms in the electron transport layer.

The light-emitting element according to an eightieth aspect of the present disclosure has the configuration of the seventy-ninth aspect, wherein the density of oxygen atoms in the second oxide layer may be from 50% to 95% of the density of oxygen atoms in the electron transport layer.

The light-emitting element according to an eighty-first aspect of the present disclosure has the configuration of the eightieth aspect, wherein the density of oxygen atoms in the second oxide layer may be from 50% to 90% of the density of oxygen atoms in the electron transport layer.

The light-emitting element according to an eighty-second aspect of the present disclosure has the configuration of any one of the seventy-third to seventy-eighth aspects, wherein the oxygen atom density of the electron transport layer may be less than the oxygen atom density of the second oxide layer.

The light-emitting element according to an eighty-third aspect of the present disclosure has the configuration of the eighty-second aspect, wherein the density of oxygen atoms in the electron transport layer may be from 50% to 95% of the density of oxygen atoms in the second oxide layer.

The light-emitting element according to an eighty-fourth aspect of the present disclosure has the configuration of the eighty-third aspect, wherein the density of oxygen atoms in the electron transport layer may be from 50% to 90% of the density of oxygen atoms in the second oxide layer.

The light-emitting element according to an eighty-fifth aspect of the present disclosure has the configuration of any one of the first to eighty-fourth aspects and may further include the first oxide layer and the second oxide layer disposed between the hole transport layer and the light-emitting layer and a third oxide layer and a fourth oxide layer that is in contact with the third oxide layer disposed in this order from a side closer to the anode between the light-emitting layer and the electron transport layer, wherein the oxygen atom density in the third oxide layer may be different from the oxygen atom density in the fourth oxide layer.

Note that in the eighty-fifth aspect of the present disclosure, the third oxide layer, the fourth oxide layer, and the electron transport layer correspond to the first oxide layer, the second oxide layer, and the electron transport layer in the sixty-seventh to eighty-fourth aspects. Accordingly, in the eighty-fifth aspect of the present disclosure, the third oxide layer, the fourth oxide layer, and the electron transport layer may have the configuration of the first oxide layer, the second oxide layer, and the electron transport layer, respectively, described in the sixty-seventh to eighty-fourth aspects. Of course, it goes without saying that the configurations can be modified as appropriate within the scope described in the embodiments and combinations thereof, regardless of the aspect described above.

The light-emitting element according to an eighty-sixth aspect of the present disclosure has the configuration of the eighty-fifth aspect, wherein the oxygen atom density of the fourth oxide layer may be less than the oxygen atom density of the third oxide layer.

The light-emitting element according to an eighty-seventh aspect of the present disclosure has the configuration of the eighty-fifth aspect, wherein the oxygen atom density of the third oxide layer may be less than the oxygen atom density of the fourth oxide layer.

The light-emitting element according to an eighty-eighth aspect of the present disclosure has the configuration of any one of the eighty-fifth to eighty-seventh aspects, wherein the electron transport layer may be formed of an oxide.

The light-emitting element according to an eighty-ninth aspect of the present disclosure has the configuration of the eighty-eighth aspect, wherein the electron transport layer is in contact with the fourth oxide layer, and the oxygen atom density of the electron transport layer may be less than the oxygen atom density of the fourth oxide layer.

The light-emitting element according to a ninetieth aspect of the present disclosure has the configuration of the eighty-ninth aspect, wherein the oxygen atom density in the electron transport layer may be from 50% to 95% of the oxygen atom density in the fourth oxide layer.

The light-emitting element according to a ninety-first aspect of the present disclosure has the configuration of the ninetieth aspect, wherein the oxygen atom density in the electron transport layer may be from 50% to 90% of the oxygen atom density in the fourth oxide layer.

The light-emitting element according to a ninety-second aspect of the present disclosure has the configuration of the eighty-eighth aspect, wherein the electron transport layer is in contact with the fourth oxide layer, and the oxygen atom density of the fourth oxide layer may be less than the oxygen atom density of the electron transport layer.

The light-emitting element according to a ninety-third aspect of the present disclosure has the configuration of the ninety-second aspect, wherein the oxygen atom density in the fourth oxide layer may be from 50% to 95% of the oxygen atom density in the electron transport layer.

The light-emitting element according to a ninety-fourth aspect of the present disclosure has the configuration of the ninety-third aspect, wherein the oxygen atom density in the fourth oxide layer may be from 50% to 90% of the oxygen atom density in the electron transport layer.

The light-emitting element according to a ninety-fifth aspect of the present disclosure has the configuration of the second aspect and may further include the first oxide layer and the second oxide layer disposed between the hole transport layer and the light-emitting layer and a third oxide layer and a fourth oxide layer that is in contact with the third oxide layer disposed in this order from a side closer to the anode between the light-emitting layer and the electron transport layer, wherein the oxygen atom density in the fourth oxide layer may be less than the oxygen atom density in the third oxide layer.

In other words, the light-emitting element according to the ninety-fifth aspect of the present disclosure may include an anode, a hole transport layer, a light-emitting layer, an electron transport layer, and a cathode in this order and may further include a first oxide layer and a second oxide layer that is in contact with the first oxide layer disposed in this order from a side closer to the anode between the hole transport layer and the light-emitting layer and a third oxide layer and a fourth oxide layer that is in contact with the third oxide layer disposed in this order from a side closer to the anode between the light-emitting layer and the electron transport layer, wherein the density of oxygen atoms in the second oxide layer may be less than the density of oxygen atoms in the first oxide layer, and the oxygen atom density in the fourth oxide layer may be less than the oxygen atom density in the third oxide layer.

In the ninety-fifth aspect of the present disclosure, the first oxide layer, the second oxide layer, and the hole transport layer may have a configuration of an aspect that directly or indirectly cites both the second aspect and the forty-sixth aspect.

Also, in the ninety-fifth aspect of the present disclosure, the third oxide layer, the fourth oxide layer, and the electron transport layer correspond to the first oxide layer, the second oxide layer, and the electron transport layer in the sixty-seventh aspect citing the second aspect. Accordingly, in the ninety-fifth aspect of the present disclosure, the third oxide layer, the fourth oxide layer, and the electron transport layer may have the configuration of the first oxide layer, the second oxide layer, and the electron transport layer in an aspect that directly or indirectly cites both the second aspect and the sixty-seventh aspect. Of course, it goes without saying that the configurations can be modified as appropriate within the scope described in the embodiments and combinations thereof, regardless of the aspect described above.

The light-emitting element according to a ninety-sixth aspect of the present disclosure has the configuration of the second aspect and may further include the first oxide layer and the second oxide layer disposed between the hole transport layer and the light-emitting layer and a third oxide layer and a fourth oxide layer that is in contact with the third oxide layer disposed in this order from a side closer to the anode between the light-emitting layer and the electron transport layer, wherein the oxygen atom density in the third oxide layer may be less than the oxygen atom density in the fourth oxide layer.

In other words, the light-emitting element according to the ninety-sixth aspect of the present disclosure may include an anode, a hole transport layer, a light-emitting layer, an electron transport layer, and a cathode in this order and may further include a first oxide layer and a second oxide layer that is in contact with the first oxide layer disposed in this order from a side closer to the anode between the hole transport layer and the light-emitting layer and a third oxide layer and a fourth oxide layer that is in contact with the third oxide layer disposed in this order from a side closer to the anode between the light-emitting layer and the electron transport layer, wherein the oxygen atom density in the second oxide layer may be less than the oxygen atom density in the first oxide layer, and the oxygen atom density in the third oxide layer may be less than the oxygen atom density in the fourth oxide layer.

In the ninety-sixth aspect of the present disclosure, the first oxide layer, the second oxide layer, and the hole transport layer may have a configuration of an aspect that directly or indirectly cites both the second aspect and the forty-sixth aspect.

Also, in the ninety-seventh aspect of the present disclosure, the third oxide layer, the fourth oxide layer, and the electron transport layer correspond to the first oxide layer, the second oxide layer, and the electron transport layer in the sixty-seventh aspect citing the fifth aspect. Accordingly, in the ninety-sixth aspect of the present disclosure, the third oxide layer, the fourth oxide layer, and the electron transport layer may have the configuration of the first oxide layer, the second oxide layer, and the electron transport layer in an aspect that directly or indirectly cites both the fifth aspect and the sixty-seventh aspect. Of course, it goes without saying that the configurations can be modified as appropriate within the scope described in the embodiments and combinations thereof, regardless of the aspect described above.

The light-emitting element according to a ninety-eighth aspect of the present disclosure has the configuration of the fifth aspect and may further include the first oxide layer and the second oxide layer disposed between the hole transport layer and the light-emitting layer and a third oxide layer and a fourth oxide layer that is in contact with the third oxide layer disposed in this order from a side closer to the anode between the light-emitting layer and the electron transport layer, wherein the oxygen atom density in the fourth oxide layer may be less than the oxygen atom density in the third oxide layer.

In other words, the light-emitting element according to the ninety-eighth aspect of the present disclosure may include an anode, a hole transport layer, a light-emitting layer, an electron transport layer, and a cathode in this order and may further include a first oxide layer and a second oxide layer that is in contact with the first oxide layer disposed in this order from a side closer to the anode between the hole transport layer and the light-emitting layer and a third oxide layer and a fourth oxide layer that is in contact with the third oxide layer disposed in this order from a side closer to the anode between the light-emitting layer and the electron transport layer, wherein the oxygen atom density in the first oxide layer may be less than the oxygen atom density in the second oxide layer, and the oxygen atom density in the fourth oxide layer may be less than the oxygen atom density in the third oxide layer.

In the ninety-eighth aspect of the present disclosure, the first oxide layer, the second oxide layer, and the hole transport layer may have a configuration of an aspect that directly or indirectly cites both the fifth aspect and the forty-sixth aspect.

Also, in the ninety-eighth aspect of the present disclosure, the third oxide layer, the fourth oxide layer, and the electron transport layer correspond to the first oxide layer, the second oxide layer, and the electron transport layer in the sixty-seventh aspect citing the fifth aspect. Accordingly, in the ninety-eighth aspect of the present disclosure, the third oxide layer, the fourth oxide layer, and the electron transport layer may have the configuration of the first oxide layer, the second oxide layer, and the electron transport layer in an aspect that directly or indirectly cites both the fifth aspect and the sixty-seventh aspect. Of course, it goes without saying that the configurations can be modified as appropriate within the scope described in the embodiments and combinations thereof, regardless of the aspect described above.

The light-emitting element according to a ninety-ninth aspect of the present disclosure has the configuration of the fifth aspect and may further include the first oxide layer and the second oxide layer disposed between the hole transport layer and the light-emitting layer and a third oxide layer and a fourth oxide layer that is in contact with the third oxide layer disposed in this order from a side closer to the anode between the light-emitting layer and the electron transport layer, wherein the oxygen atom density in the third oxide layer may be less than the oxygen atom density in the fourth oxide layer.

In other words, the light-emitting element according to the ninety-ninth aspect of the present disclosure may include an anode, a hole transport layer, a light-emitting layer, an electron transport layer, and a cathode in this order and may further include a first oxide layer and a second oxide layer that is in contact with the first oxide layer disposed in this order from a side closer to the anode between the hole transport layer and the light-emitting layer and a third oxide layer and a fourth oxide layer that is in contact with the third oxide layer disposed in this order from a side closer to the anode between the light-emitting layer and the electron transport layer, wherein the oxygen atom density in the first oxide layer may be less than the oxygen atom density in the second oxide layer, and the oxygen atom density in the third oxide layer may be less than the oxygen atom density in the fourth oxide layer.

Note that in the light-emitting element according to the ninety-ninth aspect of the present disclosure, the hole transport layer, the first oxide layer, and the second oxide layer may have a configuration of aspects that directly or indirectly cite the forty-sixth aspect that cites the fifth aspect.

Also, in the ninety-ninth aspect of the present disclosure, the third oxide layer, the fourth oxide layer, and the electron transport layer correspond to the first oxide layer, the second oxide layer, and the electron transport layer in the sixty-seventh aspect citing the fifth aspect. Accordingly, the third oxide layer, the fourth oxide layer, and the electron transport layer may have the configuration of the first oxide layer, the second oxide layer, and the electron transport layer described in aspects that directly or indirectly cites both the fifth aspect and the sixty-seventh aspect. Of course, it goes without saying that the configurations can be modified as appropriate within the scope described in the embodiments and combinations thereof, regardless of the aspect described above.

The light-emitting element according to a one hundredth aspect of the present disclosure has the configuration of any one of the first to ninety-ninth aspects, wherein the light-emitting layer may include a quantum dot phosphor.

A light-emitting device according to a one hundred and first aspect of the present disclosure includes the light-emitting element according to any one of the first to one hundredth aspects.

In the light-emitting device according to a one hundred and second aspect of the present disclosure, the light-emitting element may be provided with a substrate.

The light-emitting device according to a one hundred and third aspect of the present disclosure has the configuration of the one hundred and first or the one hundred and second aspect and may be a display device.

The light-emitting device according to a seventy-ninth aspect of the present disclosure has the configuration of the one hundred and first or the one hundred and second aspect and may be an illumination device.

Note that the combinations of aspects described above are examples of the present disclosure, and the present disclosure is not limited to the combinations described above. Also, the present disclosure is not limited to the embodiments described above, and various modifications may be made within the scope of the claims and the summary described above. Embodiments obtained by appropriately combining technical approaches disclosed in the different embodiments also fall within the technical scope of the present disclosure. Furthermore, novel technical features can be formed by combining the technical approaches disclosed in each of the embodiments.

The invention claimed is:
1. A light-emitting element, comprising:
an anode, a hole transport layer, a light-emitting layer, an electron transport layer, and a cathode in this order; and
a first oxide layer and a second oxide layer that is in contact with the first oxide layer disposed in this order from a side closer to the anode between the hole transport layer and the light-emitting layer, or between the light-emitting layer and the electron transport layer,
wherein an oxygen atom density of the second oxide layer is different from an oxygen atom density of the first oxide layer, and
the first oxide layer, the second oxide layer, and the electron transport layer are disposed between the light-emitting layer and the cathode in this order from a side of the anode.

2. The light-emitting element according to claim 1,
wherein an electron density of the first oxide layer and an electron density in the second oxide layer are less than an electron density in the electron transport layer.

3. The light-emitting element according to claim 1,
wherein the electron transport layer is formed of an oxide, and
the electron transport layer is in contact with the second oxide layer, and a density of oxygen atoms in the second oxide layer is less than a density of oxygen atoms in the electron transport layer.

4. The light-emitting element according to claim 3,
wherein the density of oxygen atoms in the second oxide layer is from 50% to 95% of the density of oxygen atoms in the electron transport layer.

5. The light-emitting element according to claim 1,
wherein the electron transport layer is in contact with the second oxide layer, and
a density of oxygen atoms in the electron transport layer is less than a density of oxygen atoms in the second oxide layer.

6. A light-emitting device, comprising:
the light-emitting element according to claim 1.

* * * * *